US012796239B2

(12) United States Patent
Choi et al.

(10) Patent No.: US 12,796,239 B2
(45) Date of Patent: Nov. 10, 2026

(54) DISPLAY APPARATUS

(71) Applicant: Samsung Display Co., Ltd., Yongin-Si (KR)

(72) Inventors: Jonghyun Choi, Yongin-si (KR); Younjoon Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 942 days.

(21) Appl. No.: 17/671,351

(22) Filed: Feb. 14, 2022

(65) Prior Publication Data

US 2022/0367586 A1 Nov. 17, 2022

(30) Foreign Application Priority Data

May 14, 2021 (KR) ........................ 10-2021-0062754

(51) Int. Cl.
*H10K 59/124* (2023.01)
*H10K 59/131* (2023.01)

(52) U.S. Cl.
CPC ......... *H10K 59/124* (2023.02); *H10K 59/131* (2023.02)

(58) Field of Classification Search
None
See application file for complete search history.

(56) References Cited

U.S. PATENT DOCUMENTS 10,096,624 B2 10/2018 Park et al.
10,217,802 B2 2/2019 Hwang
11,177,335 B2 11/2021 Park et al.
2019/0123126 A1* 4/2019 Song .................... G09G 3/3266
2019/0148476 A1* 5/2019 Park ..................... G09G 3/3258 257/40
2019/0278145 A1 9/2019 Tanaka et al.

FOREIGN PATENT DOCUMENTS

KR 10-1740192 B1 5/2017
KR 1020190055868 A 5/2019
KR 10-2151235 B1 9/2020
KR 10-2021-0008977 A 1/2021

* cited by examiner

*Primary Examiner* — Dale E Page
*Assistant Examiner* — Derek L Nielsen
(74) *Attorney, Agent, or Firm* — Innovation Counsel LLP

(57) ABSTRACT

A display apparatus includes a first pixel transistor set, a second pixel transistor set, a first insulating layer, a pixel separation layer, a first conductive line, a second insulating layer, and a second conductive line. The first insulating layer is formed of a first material and has an opening. The opening is positioned between the first pixel transistor set and the second pixel transistor set. The pixel separation layer is positioned inside the opening and is formed of a second material different from the first material. The first conductive line is arranged on the first insulating layer and overlaps the first pixel separation layer. The second insulating layer is arranged on the first conductive line. The second conductive line is arranged on the second insulating layer and overlaps each of the pixel separation layer and the first conductive line.

20 Claims, 33 Drawing Sheets

DISPLAY APPARATUS

CROSS-REFERENCE TO RELATED APPLICATION

This application claims priority under 35 U.S.C. § 119 to Korean Patent Application No. 10-2021-0062754, filed on May 14, 2021, in the Korean Intellectual Property Office; the Korean Patent Application is incorporated by reference.

BACKGROUND

1. Field

The technical field relates to a display apparatus.

2. Description of the Related Art

A display apparatus may display images according to input signals. A display apparatus may be included in an electronic device, such as a cellular phone or a television.

The display apparatus may include pixels that receive electrical signals and then emit light to display an image. Each pixel may include a display element for emitting light. For example, an organic light-emitting display apparatus may include an organic light-emitting diode (OLED) as a display element.

A shock or impact on the display apparatus may cause damage to one or more elements in the display apparatus. As a result, the quality and performance of the display apparatus may be affected.

SUMMARY

Embodiments may be related to a display apparatus capable of withstanding shocks/impacts and/or capable of displaying a high resolution image.

According to one or more embodiments, a display apparatus includes a substrate on which a first pixel area and a second pixel area adjacent to each other are defined, a first insulating layer arranged on the substrate and having a first opening corresponding to a boundary between the first pixel area and the second pixel area, a first pixel separation layer buried in the first opening and including a different material from that of the first insulating layer, a first conductive line arranged on the first insulating layer and at least partially overlapping the first pixel separation layer, a second insulating layer arranged on the first conductive line, and a second conductive line arranged on the second insulating layer and at least partially overlapping the first pixel separation layer and the first conductive line.

The display apparatus may further include a third insulating layer arranged between the first insulating layer and the second insulating layer, and the third insulating layer and the first pixel separation layer may be integral with each other.

The display apparatus may further include a first conductive pattern arranged on the first pixel area and between the first insulating layer and the third insulating layer, a second conductive pattern arranged on the second pixel area and between the first insulating layer and the third insulating layer, a first contact plug connecting the first conductive line to the first conductive pattern, and a second contact plug connecting the first conductive line to the second conductive pattern.

The first insulating layer may include an inorganic material, and the first pixel separation layer may include an organic material.

The display apparatus may further include a third contact plug arranged on the first pixel area and connecting the second conductive line to the first conductive line, and a fourth contact plug arranged on the second pixel area and connecting the second conductive line to the first conductive line.

The display apparatus may further include a third conductive pattern arranged on the first pixel area between the substrate and the first conductive line, a fifth contact plug connecting the first conductive line to the third conductive pattern, a fourth conductive pattern arranged on the second pixel area on a same layer as the third conductive pattern, and a sixth contact plug connecting the first conductive line to the fourth conductive pattern.

The display apparatus may further include a first semiconductor pattern arranged on the first pixel area between the substrate and the first conductive line, a seventh contact plug connecting the first conductive line to the first semiconductor pattern, a second semiconductor pattern arranged on the second pixel area on a same layer as the first semiconductor pattern, and an eighth contact plug connecting the first conductive line to the second semiconductor pattern.

The display apparatus may further include a fifth conductive pattern arranged on the first insulating layer and apart from the first pixel separation layer on a plane, a third conductive line arranged on the second insulating layer and at least partially overlapping the first pixel separation layer, and a ninth contact plug connecting the third conductive line to the fifth conductive pattern, wherein the third conductive line is apart from each of the first conductive line and the second conductive line.

A same signal may be applied to the first conductive line and the second conductive line.

A first signal may be applied to the first conductive line, and a second signal that is different from the first signal may be applied to the second conductive line.

The display apparatus may further include a sixth conductive pattern arranged on the first pixel area, a seventh conductive pattern arranged on the second pixel area, and a first bridge arranged on the first insulating layer and connecting the sixth conductive pattern with the seventh conductive pattern, wherein the first bridge at least partially overlaps the first pixel separation layer.

The display apparatus may further include a third semiconductor pattern arranged on the first pixel area, a fourth semiconductor pattern arranged on the second pixel area, and a second bridge arranged on the first insulating layer and connecting the third semiconductor pattern with the fourth semiconductor pattern, wherein the second bridge at least partially overlaps the first pixel separation layer.

A third pixel area, a fourth pixel area, and a fifth pixel area that are adjacent to the first pixel area may further be defined on the substrate, the first insulating layer may further have a second opening corresponding to a boundary between the first pixel area and the third pixel area, a third opening corresponding to a boundary between the first pixel area and the fourth pixel area, and a fourth opening corresponding to a boundary between the first pixel area and the fifth pixel area, the first pixel area and the second pixel area may be adjacent to each other in a first direction, the first pixel area and the third pixel area may be adjacent to each other in a second direction, the first pixel area and the fourth pixel area may be adjacent to each other in a third direction that is opposite to the first direction, and the first pixel area and the fifth pixel area may be adjacent to each other in a fourth direction that is opposite to the second direction.

The display apparatus may further include a second pixel separation layer buried in the second opening, a third pixel separation layer buried in the third opening, and a fourth pixel separation layer buried in the fourth opening. The first pixel separation layer, the second pixel separation layer, the third pixel separation layer, and the fourth pixel separation layer may be integral with each other.

According to one or more embodiments, a display apparatus includes a substrate on which a plurality of pixel areas are defined in a first direction, a first insulating layer arranged on the substrate and having an opening pattern surrounding each of the plurality of pixel areas, a pixel separation layer buried in the opening pattern, a first conductive line arranged on the first insulating layer and extending in the first direction to at least partially overlap the pixel separation layer, a second insulating layer arranged on the first conductive line, and a second conductive line arranged on the second insulating layer and extending in the first direction to at least partially overlap the pixel separation layer and the first conductive line, wherein the first insulating layer includes an inorganic material, and the pixel separation layer includes an organic material.

The pixel separation layer may have a grid shape on a plane.

The display apparatus may further include a plurality of first contact plugs respectively arranged on the plurality of pixel areas and connecting the second conductive line to the first conductive line, a plurality of conductive patterns respectively arranged on the plurality of pixel areas between the substrate and the first conductive line, and a plurality of second contact plugs respectively arranged on the plurality of pixel areas and connecting the first conductive line to each of the plurality of conductive patterns.

The display apparatus may further include a plurality of first contact plugs respectively arranged on the plurality of pixel areas and connecting the second conductive line to the first conductive line, a plurality of conductive patterns respectively arranged on the plurality of pixel areas between the substrate and the first conductive line, and a plurality of second contact plugs respectively arranged on the plurality of pixel areas and connecting the first conductive line to each of the plurality of conductive patterns.

A same signal may be applied to the first conductive line and the second conductive line.

A first signal may be applied to the first conductive line, and a second signal that is different from the first signal may be applied to the second conductive line.

An embodiment may be related to a display apparatus. The display apparatus may include a substrate, a first pixel transistor set, a second pixel transistor set, a first insulating layer, a first pixel separation layer, a first conductive line, a second insulating layer, and a second conductive line. The substrate may include a first pixel area and a second pixel area adjacent to each other. The first pixel transistor set may be arranged on the first pixel area. The second pixel transistor set may be arranged on the second pixel area. The first insulating layer may be formed of a first material, may be arranged on the substrate, and may have a first opening. The first opening may be positioned between the first pixel transistor set and the second pixel transistor set. The first pixel separation layer may be positioned inside the first opening and may be formed of a second material different from the first material. The first conductive line may be arranged on the first insulating layer and may at least partially overlap the first pixel separation layer. The second insulating layer may be arranged on the first conductive line. The second conductive line may be arranged on the second insulating layer and may at least partially overlap each of the first pixel separation layer and the first conductive line.

The display apparatus may include a third insulating layer arranged between the first insulating layer and the second insulating layer. The third insulating layer and the first pixel separation layer may be directly connected to each other and may be formed of a same material.

The display apparatus may include the following elements: a first conductive member arranged on the first pixel area and between the first insulating layer and the third insulating layer; a second conductive member arranged on the second pixel area and between the first insulating layer and the third insulating layer; a first contact plug electrically connecting the first conductive line to the first conductive member; and a second contact plug electrically connecting the first conductive line to the second conductive member. The first pixel separation layer may be positioned between the first contact plug and the second contact plug.

The first insulating layer may be formed of an inorganic material. The first pixel separation layer may be formed of an organic material.

The display apparatus may include the following elements: a third contact plug arranged on the first pixel area and electrically connecting the second conductive line to the first conductive line; and a fourth contact plug arranged on the second pixel area and electrically connecting the second conductive line to the first conductive line. The first pixel separation layer may be positioned between the third contact plug and the fourth contact plug.

The display apparatus may include the following elements: a third conductive member arranged on the first pixel area, between the substrate and the first conductive line; a fifth contact plug electrically connecting the first conductive line to the third conductive member; a fourth conductive member arranged on the second pixel area and directly on a same layer as the third conductive member; and a sixth contact plug electrically connecting the first conductive line to the fourth conductive member. The first pixel separation layer may be positioned between the fifth contact plug and the sixth contact plug.

The display apparatus may include the following elements: a first semiconductor member arranged on the first pixel area and between the substrate and the first conductive line; a seventh contact plug electrically connecting the first conductive line to the first semiconductor member; a second semiconductor member arranged on the second pixel area and directly on a same layer as the first semiconductor member; and an eighth contact plug electrically connecting the first conductive line to the second semiconductor member. The first pixel separation layer may be positioned between the seventh contact plug and the eighth contact plug.

The display apparatus may include the following elements: a fifth conductive member arranged on the first insulating layer and spaced from the first pixel separation layer; a third conductive line arranged on the second insulating layer and at least partially overlapping the first pixel separation layer; and a ninth contact plug electrically connecting the third conductive line to the fifth conductive member. The third conductive line may be spaced from each of the first conductive line and the second conductive line.

The first conductive line may be electrically connected to the second conductive line. A same signal may be applied to the first conductive line and the second conductive line.

The first conductive line may be electrically isolated from the second conductive line. A first signal may be applied to the first conductive line. A second signal different from the first signal may be applied to the second conductive line.

The display apparatus may include the following elements: a sixth conductive member arranged on the first pixel area; a seventh conductive member arranged on the second pixel area; and a first bridge arranged on the first insulating layer and electrically connecting the sixth conductive member to the seventh conductive member. The first bridge may at least partially overlap the first pixel separation layer.

The display apparatus may include the following elements: a third semiconductor member arranged on the first pixel area; a fourth semiconductor member arranged on the second pixel area; and a second bridge arranged on the first insulating layer and electrically connecting the third semiconductor member to the fourth semiconductor member. The second bridge may at least partially overlap the first pixel separation layer.

The display apparatus may include a third pixel transistor set, a fourth pixel transistor set, and a fifth pixel transistor set respectively arranged on a third pixel area, a fourth pixel area, and a fifth pixel area of the substrate, which may be adjacent to the first pixel area of the substrate. The first insulating layer may have a second opening positioned between the first pixel transistor set and the third pixel transistor set, may have a third opening positioned between the first pixel transistor set and the fourth pixel transistor set, and may have a fourth opening positioned between the first pixel transistor set and the fifth pixel transistor set. The first pixel area may neighbor the second pixel area in a first direction. The first pixel area may neighbor the third pixel area in a second direction different from the first direction. The first pixel area may neighbor the fourth pixel area in a third direction opposite to the first direction. The first pixel area may neighbor the fifth pixel area in a fourth direction opposite to the second direction.

The display apparatus may include the following elements: a second pixel separation layer positioned inside the second opening; a third pixel separation layer positioned inside the third opening; and a fourth pixel separation layer positioned inside the fourth opening. The first pixel separation layer, the second pixel separation layer, the third pixel separation layer, and the fourth pixel separation layer may be connected to each other and may be formed of the second material.

An embodiment may be related to a display apparatus. The display apparatus may include the following elements: a substrate may include pixel areas arranged in a first direction; pixel transistor sets respectively arranged on the pixel areas; a first insulating layer formed of an inorganic material, arranged on the substrate, and having an opening pattern surrounding each of the pixel transistor sets; a pixel separation layer formed of an organic material and positioned inside the opening pattern; a first conductive line arranged on the first insulating layer, extending in the first direction, and at least partially overlapping the pixel separation layer; a second insulating layer arranged on the first conductive line; and a second conductive line arranged on the second insulating layer, extending in the first direction, and at least partially overlapping each of the pixel separation layer and the first conductive line.

The pixel separation layer may have a grid structure in a plan view of the display apparatus.

The display apparatus may include the following elements: first contact plugs respectively arranged on the pixel areas and electrically connecting the second conductive line to the first conductive line; conductive members respectively arranged on the pixel areas and arranged between the substrate and the first conductive line; and second contact plugs respectively arranged on the pixel areas and electrically connecting the first conductive line to the conductive members.

The display apparatus may include the following elements: third contact plugs respectively arranged on the pixel areas and electrically connecting the second conductive line to the first conductive line; semiconductor members respectively arranged on the pixel areas and between the substrate and the first conductive line; and fourth contact plugs respectively arranged on the pixel areas and electrically connecting the first conductive line to the semiconductor members.

The first conductive line may be electrically connected to the second conductive line. A same signal may be applied to the first conductive line and the second conductive line.

The first conductive line may be electrically isolated from the second conductive line. A first signal may be applied to the first conductive line. A second signal different from the first signal may be applied to the second conductive line.

DETAILED DESCRIPTION

Figure 1:
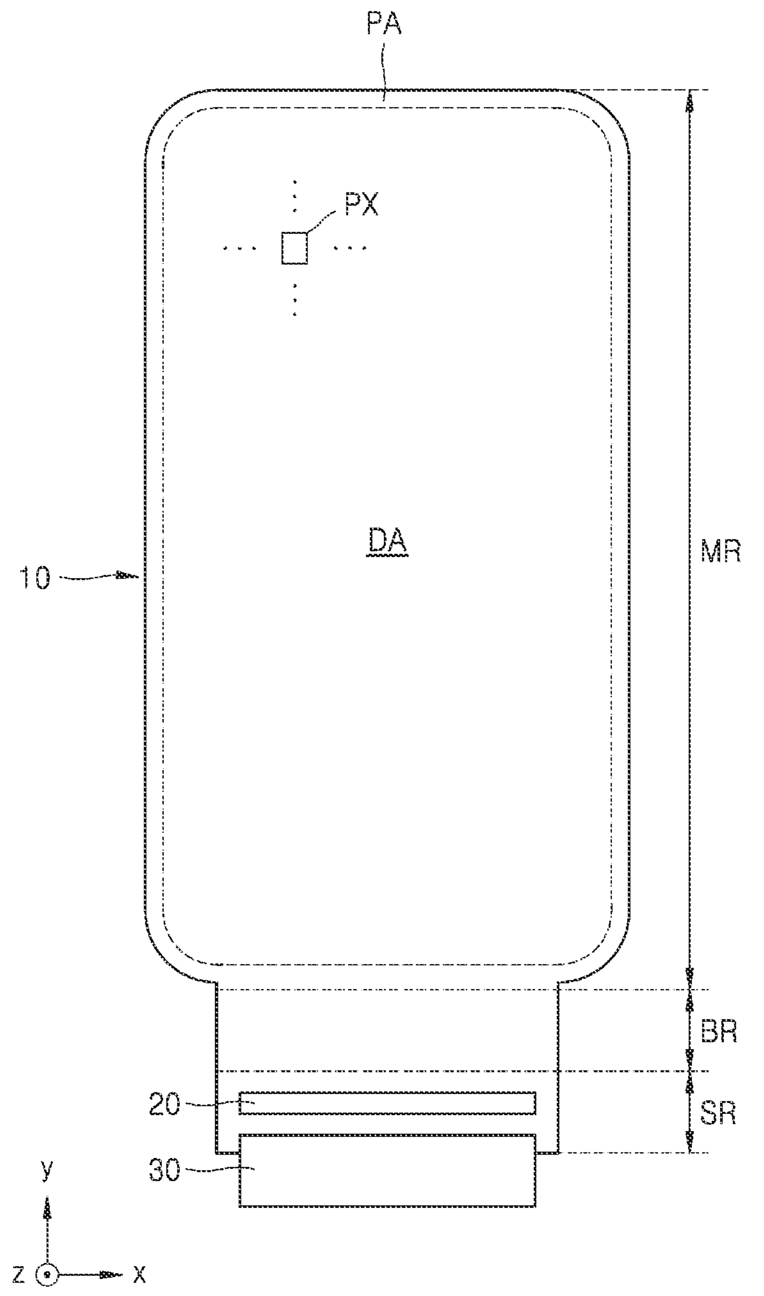
FIG. 1 is a schematic plan view of a display apparatus according to an embodiment.

Examples of embodiments are described with reference to the accompanying drawings, wherein like reference numerals may refer to like elements.

Although the terms "first," "second," etc. may be used to describe various components/elements/features, these components/elements/features should not be limited by these terms. These components are used to distinguish one component/element/feature from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular expressions "a," "an," and "the" may include the plural forms as well, unless the context clearly indicates otherwise.

The terms "comprise(s)" and/or "comprising" may specify the presence of stated features or components, but may not preclude the presence or addition of one or more other features or components.

When a first element is referred to as being formed "on" or "connected to" a second element, the first element can be directly or indirectly on or connected to the second element. Zero or more intervening elements may be present between the first element and the second element.

Dimensions of elements in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

The x-axis, the y-axis and the z-axis may or may not be perpendicular to one another.

The term "connect" may mean "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made/formed of." The term "adjacent" may mean "immediately adjacent." The term "pattern" may mean "member." The term "pixel transistor set" may mean one or more transistors of (part of) a pixel and/or of (part of) a pixel circuit. The expression that an element extends in a particular direction may mean that the lengthwise direction of the element is in the particular direction and/or the element extends lengthwise in the particular direction. The term "formed integrally with each other" may mean "formed of a same material and directly connected to each other." The term "in the first/second pixel area" (of the display apparatus) may mean "on the first/second pixel area" (of the substrate). A listing of items (e.g., materials) may mean at least one of the listed items. The term "correspond to" may mean "be," "represent," "function as," and/or "be equivalent to."

Figure 2:
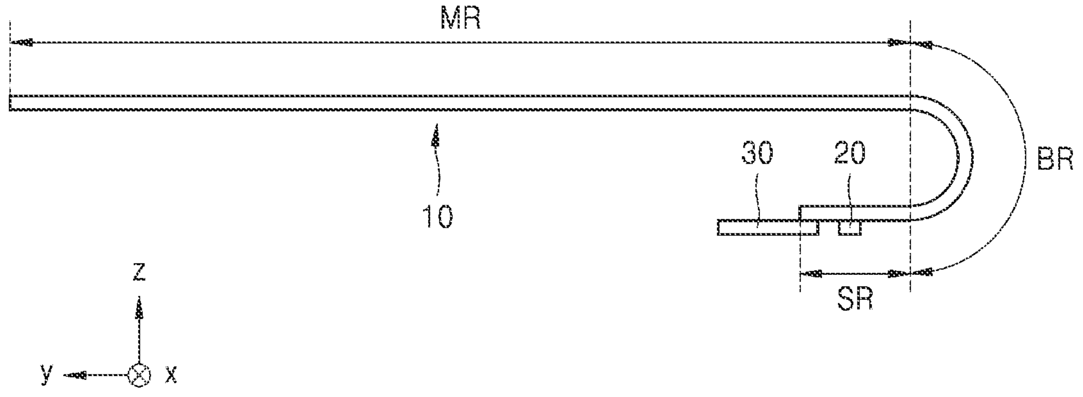
FIG. 2 is a schematic side view of the display apparatus of FIG. 1 according to an embodiment.

FIG. 1 is a schematic plan view of a display apparatus according to an embodiment, and FIG. 2 is a schematic side view of the display apparatus of FIG. 1 according to an embodiment. As illustrated in FIG. 2, the display apparatus has a bent portion connected between two flat portions. FIG. 1 illustrates the bent portion in a flat/unbent state.

As illustrated in FIGS. 1 and 2, the display apparatus may include a display panel 10. For example, the display apparatus may include, may be, or may be included in a smartphone, a tablet, a laptop, a television, or an advertising board.

The display panel 10 may include a display area DA and a peripheral area PA outside the display area DA. The display area DA is configured to display an image, and a plurality of pixels PX may be arranged in the display area DA. Viewed in a direction perpendicular to the display panel 10, the display area DA may have one or more of various shapes including a circular shape, an oval shape, a polygonal shape, a shape of a predetermined figure, etc. FIG. 1 illustrates that the display area DA has a substantially rectangular shape with round edges. The peripheral area PA may be located outside the display area DA.

Figure 13:
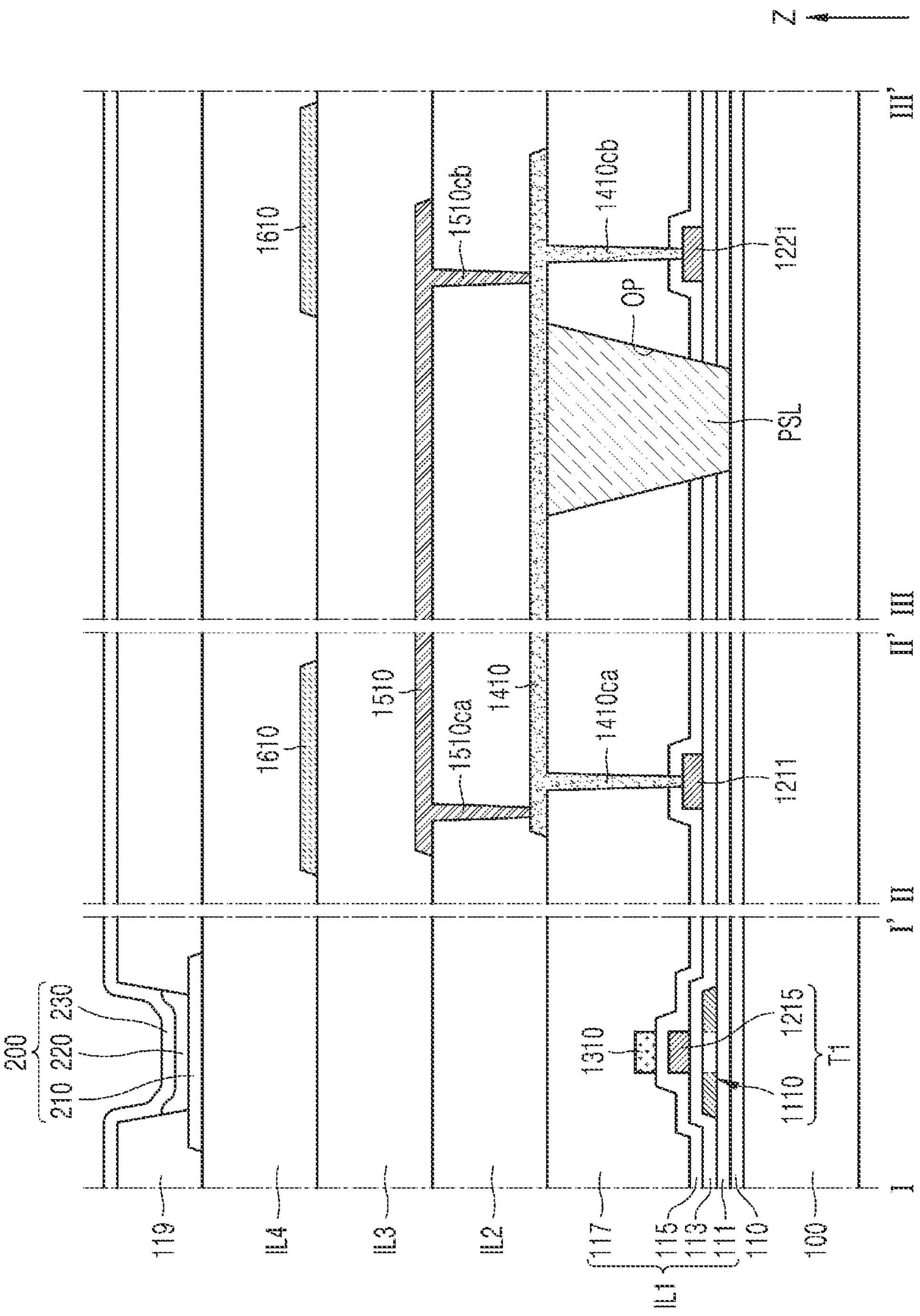
FIG. 13 is a schematic cross-sectional view of a display apparatus taken along lines I-I', II-II', and III-III' of FIG. 4 according to an embodiment.

The display panel 10 may include a substrate 100 (see FIG. 13). The substrate 100 may have corresponding display area DA and a corresponding peripheral area PA. Various components included in the display panel 10 may be located on the substrate 100. The substrate 100 may include glass, metal, or polymer resins. The display panel 10 may be bent in a bending region BR, and the substrate 100 may be flexible or bendable. The substrate 100 may include polymer resins, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including the following elements: two layers including polymer resins; and a barrier layer between the two layers, the barrier layer including an inorganic material (such as silicon oxide, silicon nitride, or silicon oxynitride).

A plurality of pixels PX may be located in the display area DA. Each of the pixels PX may include a display element such as an organic light-emitting diode. The pixel PX may emit, for example, red, green, blue, or white light.

The display panel 10 includes a main region MR, a sub-region SR, and the bending region BR connected between the main region MR and the sub-region SR. The display panel 10 may be bent in the bending region BR as illustrated in FIG. 2, such that when viewed in a Z-axis direction, at least a portion of the sub-region SR may be hidden by the main region MR. The display apparatus may not be bent. The sub-region SR may be a non-display area. Because display panel 10 is bent in the bending region BR, the non-display area of the display apparatus may be invisible when the display apparatus is viewed in a −Z direction. Even when the non-display area of the display apparatus is visible, an area of the visible non-display area may be minimized.

A driving chip 20 may be arranged in the sub-region SR of the display panel 10. The driving chip 20 may include an integrated circuit configured to drive the display panel 10.

The integrated circuit may include a data driving integrated circuit configured to generate a data signal.

The driving chip 20 may be mounted in the sub-region SR of the display panel 10. The driving chip 20 may be mounted on the same surface as a display surface of the display area DA. Because the display panel 10 is bent in the bending region BR, the driving chip 20 may be located on a rear surface of the main region MR.

A printed circuit board 30, etc. may be coupled to an end of the sub-region SR of the display panel 10. The printed circuit board 30, etc. may be electrically connected to the driving chip 20, etc. through a pad (not shown) on the substrate.

An organic light-emitting display apparatus is described as an example of the display apparatus. The display apparatus include/be an inorganic light-emitting display apparatus, an inorganic electroluminescent (EL) display apparatus, or a quantum dot light-emitting display apparatus. An emission layer of a display element in the display apparatus may include an organic material or an inorganic material. The display apparatus may include the emission layer and quantum dots located on a path of light emitted from the emission layer.

Figure 3:
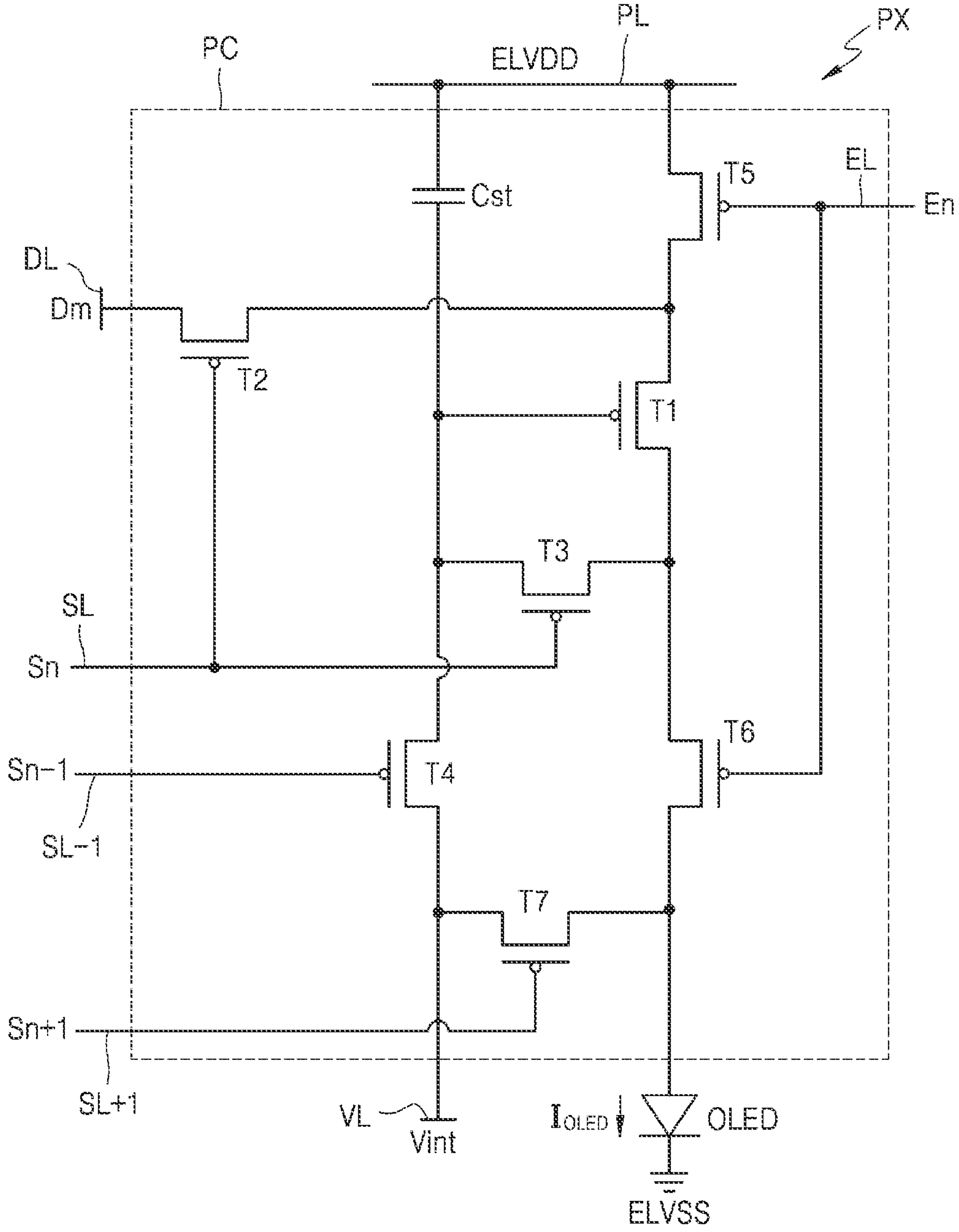
FIG. 3 is an equivalent circuit diagram of a pixel included in the display apparatus of FIG. 1 according to an embodiment.

FIG. 3 is an equivalent circuit diagram of a pixel included in the display apparatus of FIG. 1.

Referring to FIG. 3, one pixel PX may include a pixel circuit PC and an organic light-emitting diode OLED electrically connected to the pixel circuit PC.

The pixel circuit PC may include first through seventh transistors T1 through T7 and a storage capacitor Cst. A pixel transistor set may mean one or more of the transistors T1 through T7 of the pixel PX. The first through seventh transistors T1 through T7 and the storage capacitor Cst may be connected to first through third scan lines SL, SL−1, and SL+1 respectively configured to transmit first through third scan signals Sn, Sn−1, and Sn+1, a data line DL configured to transmit a data voltage Dm, an emission control line EL configured to transmit an emission control signal En, a driving voltage line PL configured to transmit a first driving voltage ELVDD, an initialization voltage line VL configured to transmit an initialization voltage Vint, and a common electrode to which a second driving voltage ELVSS is applied.

The first transistor T1 may be a driving transistor, a magnitude of a drain current of which is determined according to a gate-source voltage, and the second through seventh transistors T2 through T7 may be switching transistors that are turned on/off according to a gate-source voltage, in reality, a gate voltage. The first through seventh transistors T1 through T7 may include thin-film transistors.

The first transistor T1 may be referred to as a driving transistor, the second transistor T2 may be referred to as a scan transistor, the third transistor T3 may be referred to as a compensation transistor, the fourth transistor T4 may be referred to as a gate initialization transistor, the fifth transistor T5 may be referred to as a first emission control transistor, the sixth transistor T6 may be referred to as a second emission control transistor, and the seventh transistor T7 may be referred to as an anode initialization transistor.

The storage capacitor Cst may be connected between the driving voltage line PL and a gate of the driving transistor T1. The storage capacitor Cst may have an upper electrode CE2 connected to the driving voltage line PL and a lower electrode CE1 connected to the gate of the driving transistor T1.

The driving transistor T1 may control a magnitude of a driving current $I_{OLED}$ flowing from the driving voltage line PL to the organic light-emitting diode OLED according to a gate-source voltage. The driving transistor T1 may have the gate connected to the lower electrode CE1 of the storage capacitor Cst, a source connected to the driving voltage line PL through the first emission control transistor T5, and a drain connected to the organic light-emitting diode OLED through the second emission control transistor T6.

The driving transistor T1 may output the driving current $I_{OLED}$ to the organic light-emitting diode OLED according to the gate-source voltage. A magnitude of the driving current $I_{OLED}$ may be determined based on a difference between the gate-source voltage of the driving transistor T1 and a threshold voltage. The organic light-emitting diode OLED may receive the driving current $I_{OLED}$ from the driving transistor T1 and emit light by a brightness according to the magnitude of the driving current $I_{OLED}$.

The scan transistor T2 may transmit the data voltage Dm to the source of the driving transistor T1 in response to the first scan signal Sn. The scan transistor T2 may have a gate connected to the first scan line SL, a source connected to the data line DL, and a drain connected to the source of the driving transistor T1.

Figure 4:
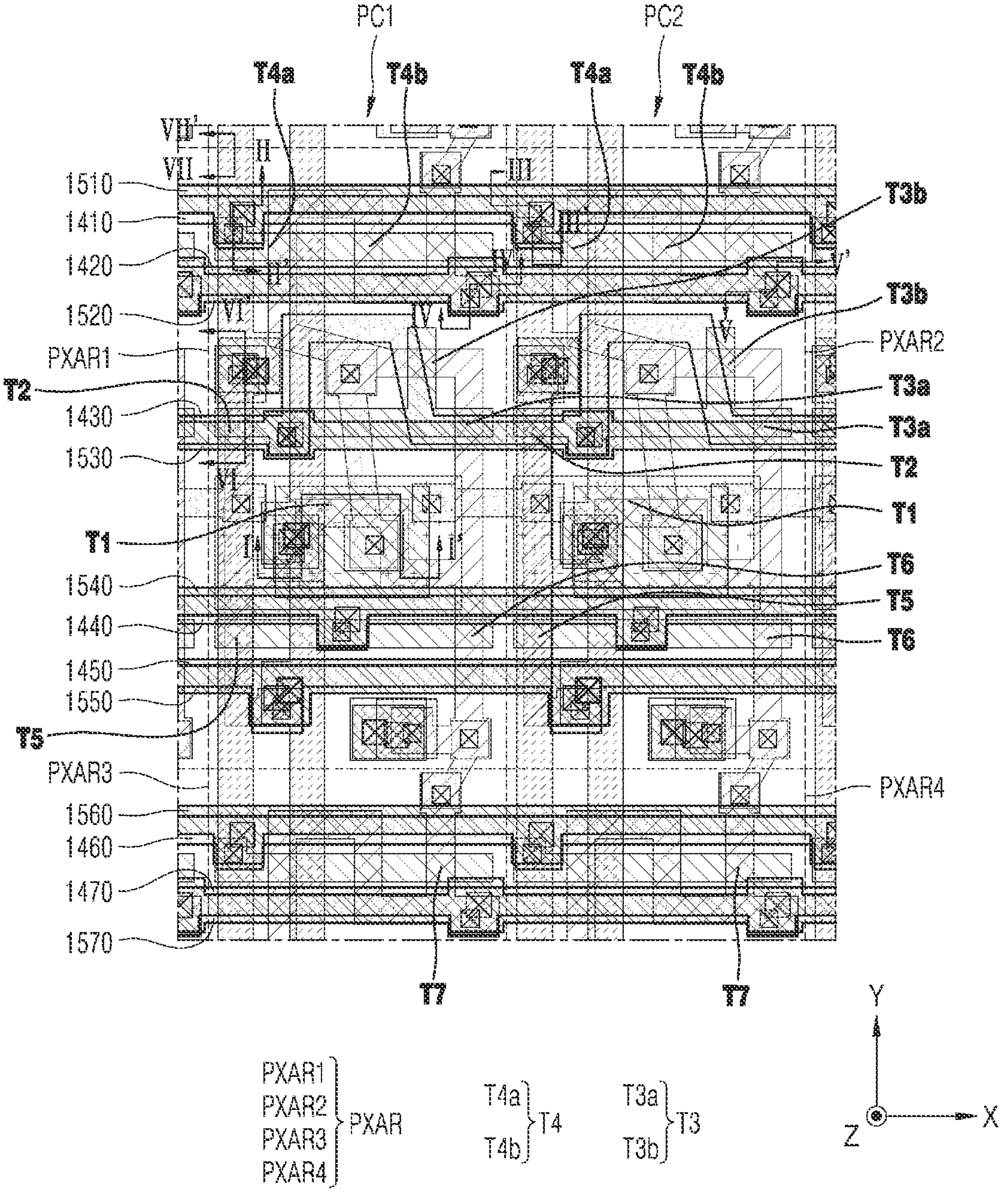
FIG. 4 is a schematic layout diagram illustrating locations of transistors, capacitors, etc. in pixel circuits included in the display apparatus of FIG. 1 according to an embodiment.

The compensation transistor T3 may be connected in series between the drain and the gate of the driving transistor T1 and may connect the drain and the gate of the driving transistor T1 in response to the first scan signal Sn. The compensation transistor T3 may have a gate connected to the first scan line SL, a source connected to the drain of the driving transistor T1, and a drain connected to the gate of the driving transistor T1. FIG. 3 illustrates that the compensation transistor T3 includes one transistor. As illustrated in FIG. 4, the compensation transistor T3 may include two transistors connected with each other in series.

The gate initialization transistor T4 may apply the initialization voltage Vint to the gate of the driving transistor T1 in response to the second scan signal Sn−1. The gate initialization transistor T4 may have a gate connected to the second scan line SL−1, a source connected to the gate of the driving transistor T1, and a drain connected to the initialization voltage line VL. FIG. 3 illustrates that the gate initialization transistor T4 includes one transistor. As illustrated in FIG. 4, the gate initialization transistor T4 may include two transistors connected with each other in series.

The anode initialization transistor T7 may apply the initialization voltage Vint to an anode of the organic light-emitting diode OLED in response to the third scan signal Sn+1. The anode initialization transistor T7 may have a gate connected to the third scan line SL+1, a source connected to the anode of the organic light-emitting diode OLED, and a drain connected to the initialization voltage line VL.

The first emission control transistor T5 may connect the driving voltage line PL with the source of the driving transistor T1 in response to the emission control signal En. The first emission control transistor T5 may have a gate connected to the emission control line EL, a source connected to the driving voltage line PL, and a drain connected to the source of the driving transistor T1.

The second emission control transistor T6 may connect the drain of the driving transistor T1 with the anode of the organic light-emitting diode OLED in response to the emission control signal En. The second emission control transistor T6 may have a gate connected to the emission control line EL, a source connected to the drain of the driving transistor T1, and a drain connected to the anode of the organic light-emitting diode OLED.

The second scan signal Sn−1 may be substantially synchronized with the first scan signal Sn of a previous row. The third scan signal Sn+1 may be substantially synchronized with the first scan signal Sn. As another example, the third scan signal Sn+1 may be substantially synchronized with the first scan signal Sn of a next row.

The first through seventh transistors T1 through T7 may include semiconductor layers including silicon. The first through seventh transistors T1 through T7 may include semiconductor layers including low temperature polysilicon (LTPS). A polysilicon material may have a high electron mobility (100 $_{cm2}$/Vs or higher), and thus, may have low power consumption and high reliability.

The semiconductor layers of the first through seventh transistors T1 through T7 may include an oxide of at least one of In, Ga, Sn, Zr, V, Hf, Cd, Ge, Cr, Ti, Al, Cs, Ce, and Zn. The semiconductor layers may include at least one of an InSnZnO (ITZO) semiconductor layer, an InGaZnO (IGZO) semiconductor layer, etc.

Some of the semiconductor layers of the first through seventh transistors T1 through T7 may include LTPS, and the others of the semiconductor layers may include an oxide semiconductor (IGZO, etc.).

The first through seventh transistors T1 through T7 may be p-type metal oxide semiconductor field-effect transistors (MOSFETs).

When an emission control signal En of a high level is received, the first emission control transistor T5 and the second emission control transistor T6 may be turned off, and the driving transistor T1 may stop outputting a driving current $I_{OLED}$ and the organic light-emitting diode OLED may stop emitting light.

Thereafter, during a gate initialization period during which a second scan signal Sn−1 of a low level is received, the gate initialization transistor T4 may be turned on, and an initialization voltage Vint may be applied to the gate of the driving transistor T1, that is, the lower electrode CE1 of the storage capacitor Cst. A difference ELVDD-Vint between a first driving voltage ELVDD and the initialization voltage Vint may be stored in the storage capacitor Cst.

Thereafter, during a data write period during which a first scan signal Sn of a low level is received, the scan transistor T2 and the compensation transistor T3 may be turned on, and a data voltage Dm may be received by the source of the driving transistor T1. The driving transistor T1 may be diode-connected by the compensation transistor T3 and may be biased in a forward direction. A gate voltage of the driving transistor T1 may rise at the initialization voltage Vint. When the gate voltage of the driving transistor T1 becomes equal to a data compensation voltage Dm−|Vth| obtained by subtracting a threshold voltage Vth of the driving transistor T1 from the data voltage Dm, the driving transistor T1 may be turned off, and the gate voltage of the driving transistor T1 may stop rising. Thus, a difference ELVDD−Dm+|Vth| between the first driving voltage ELVDD and the data compensation voltage Dm−|Vth| may be stored in the storage capacitor Cst.

During an anode initialization period during which a third scan signal Sn+1 of a low level is received, the anode initialization transistor T7 may be turned on, and the initialization voltage Vint may be applied to the anode of the organic light-emitting diode OLED. By completely stopping emission of the organic light-emitting diode OLED by applying the initialization voltage Vint to the anode of the organic light-emitting diode OLED, a pixel PX in a next frame may receive the data voltage Dm corresponding to a black gradation, and at the same time, minute emission of the organic light-emitting diode OLED may be eliminated.

The first scan signal Sn and the third scan signal Sn+1 may be substantially synchronized with each other, and The data write period and the anode initialization period may be the same period.

Thereafter, when an emission control signal En of a low level is received, the first emission control transistor T5 and the second emission control transistor T6 may be turned on, the driving transistor T1 may output a driving current $I_{OLED}$ corresponding to a voltage stored in the storage capacitor Cst, that is, the voltage ELVDD−Dm obtained by subtracting the threshold voltage Vth of the driving transistor T1 from the source-gate voltage ELVDD−Dm+|Vth| of the driving transistor T1, and the organic light-emitting diode OLED may emit light by a brightness corresponding to a magnitude of the driving current $I_{OLED}$.

The pixel circuit PC may include seven transistors and one storage capacitor. The pixel circuit PC may include two or more transistors and/or two or more storage capacitors. The pixel circuit PC may include two transistors and one storage capacitor.

FIG. 4 is a schematic layout diagram of locations of transistors, capacitors, etc. in pixel circuits included in the display apparatus of FIG. 1. FIGS. 5 through 10 are schematic layout diagrams of layers of the components of the transistors, the capacitors, etc. illustrated in FIG. 4.

Referring to FIG. 4 and FIG. 13, the display apparatus and/or the substrate 100 may include a plurality of pixel areas PXAR. The display area DA (see FIG. 1) of the display apparatus may include areas respectively corresponding to the pixel areas PXAR.

The plurality of pixel areas PXAR may be arranged in a first direction (for example, a ±X direction) and a second direction (for example, a ±Y direction). FIG. 4 illustrates a first pixel area PXAR1, a second pixel area PXAR2, a third pixel area PXAR3, and a fourth pixel area PXAR4 among the pixel areas PXAR. The first pixel area PXAR1 and the second pixel area PXAR2 may be adjacent to each other in the first direction, the first pixel area PXAR1 and the third pixel area PXAR3 may be adjacent to each other in the second direction, the second pixel area PXAR2 and the fourth pixel area PXAR4 may be adjacent to each other in the second direction, and the third pixel area PXAR3 and the fourth pixel area PXAR4 may be adjacent to each other in the first direction.

A pixel circuit PC (see FIG. 3) may be arranged on two pixel areas PXAR adjacent to each other in the second direction. For example, a first pixel circuit PC1 may be arranged on the first pixel area PXAR1 and the third pixel area PXAR3, and a second pixel circuit PC2 may be arranged on the second pixel area PXAR2 and the fourth pixel area PXAR4.

FIG. 4 illustrates that the first pixel circuit PC1 and the second pixel circuit PC2 have the same structure. The first pixel circuit PC1 and the second pixel circuit PC2 may be substantially symmetrical with each other based on a boundary of/between the first pixel area PXAR1 and the second pixel area PXAR2.

Each of the first pixel circuit PC1 and the second pixel circuit PC2 may include a driving transistor T1, a scan transistor T2, a compensation transistor T3, a gate initialization transistor T4, a first emission control transistor T5, a second emission control transistor T6, and an anode initialization transistor T7. The compensation transistor T3 may include a first compensation transistor T3*a* and a second compensation transistor T3*b* connected to each other in series. The gate initialization transistor T4 may include a first gate initialization transistor T4*a* and a second gate initialization transistor T4*b* connected to each other in series.

The driving transistor T1, the scan transistor T2, the compensation transistor T3, the gate initialization transistor T4, the first emission control transistor T5, the second emission control transistor T6, and the anode initialization transistor T7 may be distributed in two different pixel areas PXAR. The driving transistor T1, the scan transistor T2, the compensation transistor T3, the gate initialization transistor T4, the first emission control transistor T5, and the second emission control transistor T6 of the first pixel circuit PC1 may be arranged in the first pixel area PXAR1, and the anode initialization transistor T7 of the first pixel circuit PC1 may be arranged in the third pixel area PXAR3.

FIG. 4 illustrates that the anode initialization transistor T7 of the first pixel circuit PC1 is arranged in the third pixel area PXAR3 located in a row next to the first pixel area PXAR1. The anode initialization transistor T7 of the first pixel circuit PC1 may be arranged in a pixel area PXAR located in a row prior to the first pixel area PXAR1.

The display apparatus may include first through seventh conductive lines 1410, 1420, 1430, 1440, 1450, 1460, and 1470 and eighth through fourteenth conductive lines 1510, 1520, 1530, 1540, 1550, 1560, and 1570 extending in the first direction and connected to the first pixel circuit PC1 and the second pixel circuit PC2.

The first conductive line 1410 and the eighth conductive line 1510 may at least partially overlap each other. The first conductive line 1410 and the eighth conductive line 1510 may be connected to each other via at least one contact plug, and thus, the same signal may be applied to the first conductive line 1410 and the eighth conductive line 1510.

Figure 11:
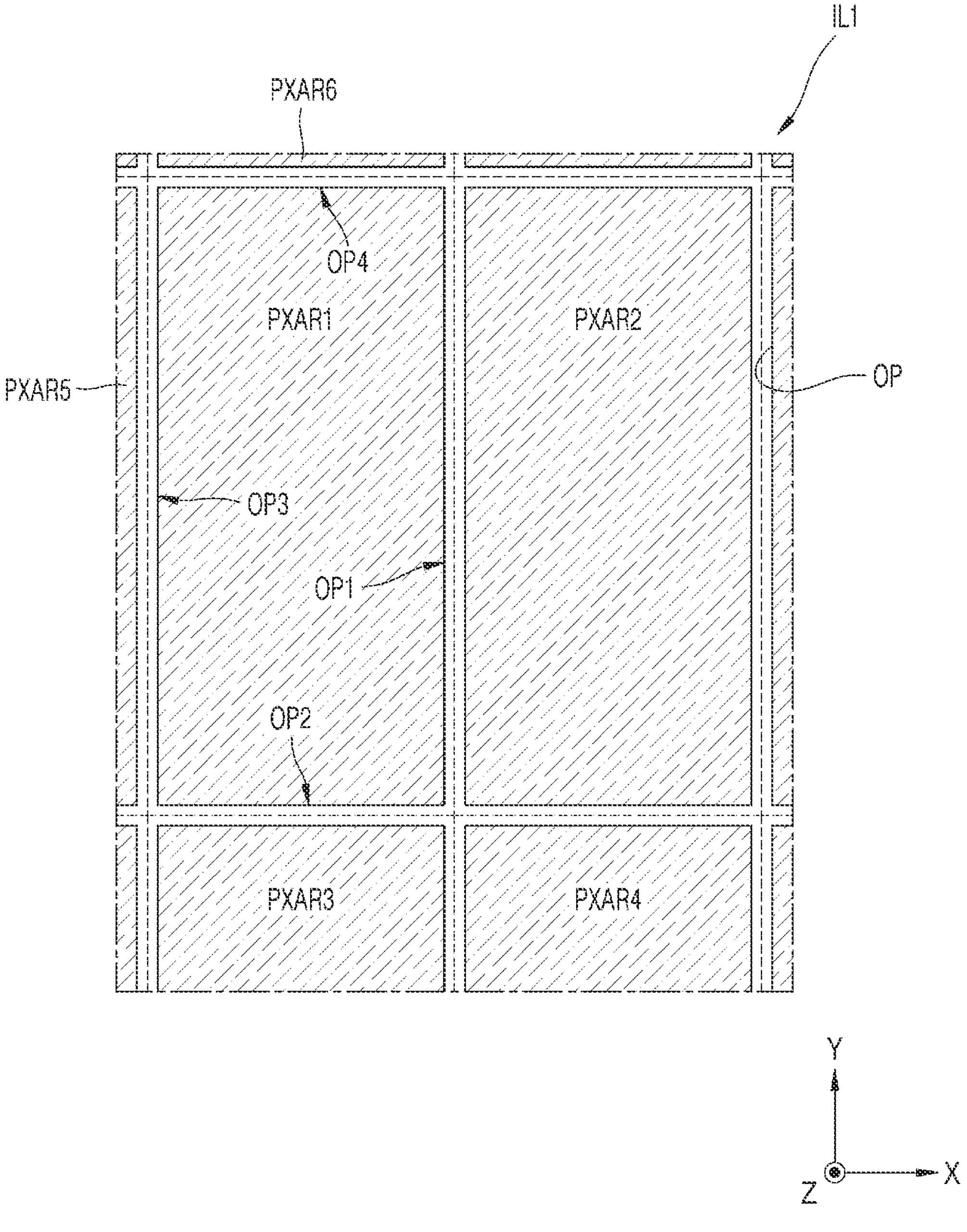
FIG. 11 is a schematic plan view of an insulating layer included in a display apparatus according to an embodiment.
Figure 12:
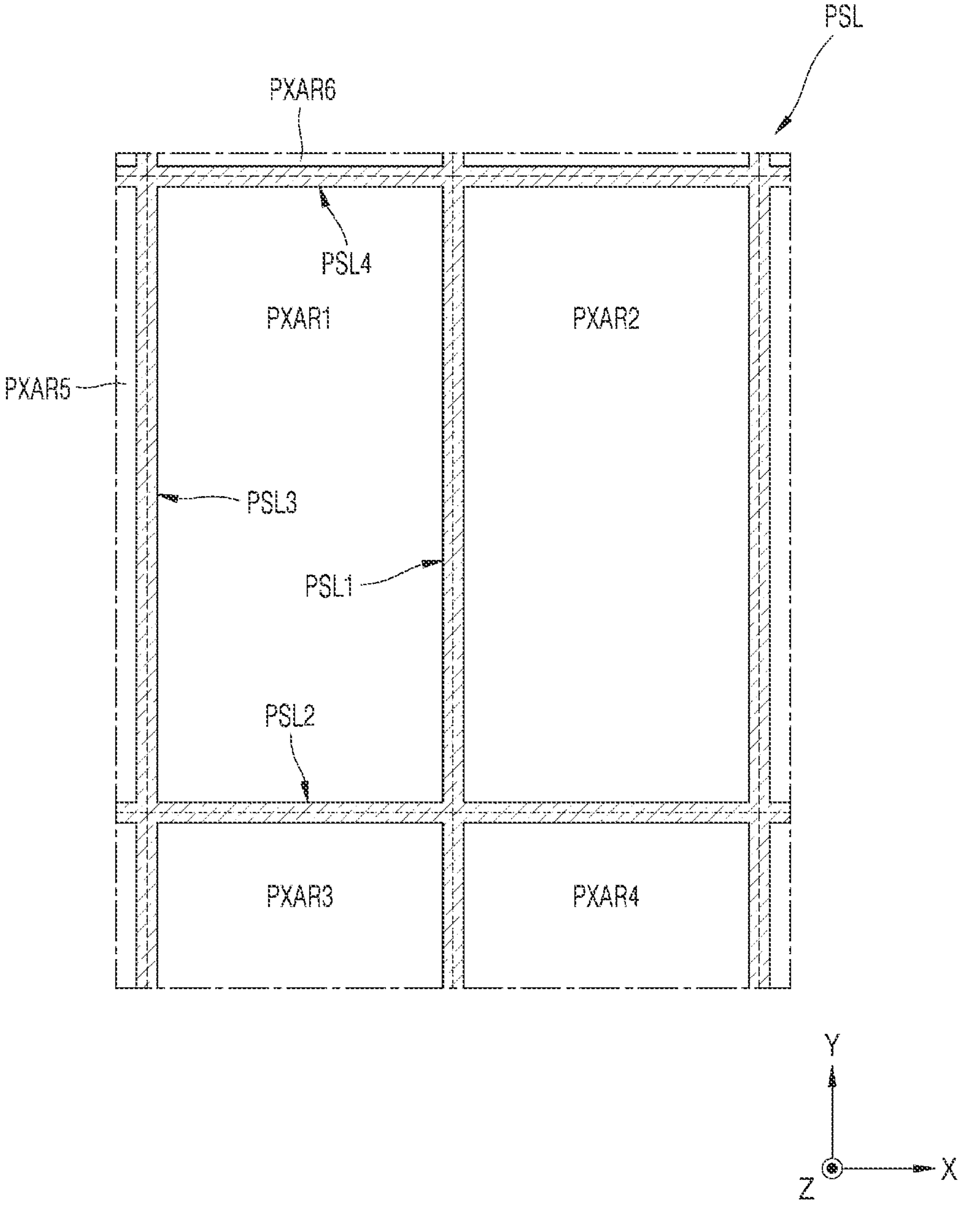
FIG. 12 is a schematic plan view of a pixel separation layer included in a display apparatus according to an embodiment.

Referring to FIGS. 11 and 12, a first insulating layer IL1 including an inorganic material may have an opening OP, and a pixel separation layer PSL including an organic material may be arranged in the opening OP. The opening OP of the first insulating layer IL1 may correspond to boundaries between the pixel areas PXAR, and the pixel separation layer PSL may be arranged on the boundaries between the pixel areas PXAR. The first conductive line 1410 and the eighth conductive line 1510 may extend in the first direction and may overlap pixel areas PXAR. The first conductive line 1410 and the eighth conductive line 1510 may at least partially overlap the pixel separation layer PSL.

Description related to the first conductive line 1410 and the eighth conductive line 1510 may be analogously applied to the second conductive line 1420 and the ninth conductive line 1520, the third conductive line 1430 and the tenth conductive line 1530, the fourth conductive line 1440 and the eleventh conductive line 1540, the fifth conductive line 1450 and the twelfth conductive line 1550, the sixth conductive line 1460 and the thirteenth conductive line 1560, and the seventh conductive line 1470 and the fourteenth conductive line 1570.

FIG. 4 illustrates that the display apparatus includes the first through seventh conductive lines 1410 through 1470 and the eighth through fourteenth conductive lines 1510 through 1570. At least one of the first through seventh conductive lines 1410 through 1470 and the eighth through fourteenth conductive lines 1510 through 1570 may be optional. For example, one of the first conductive line 1410 and the eighth conductive line 1510 may be optional. One of the second conductive line 1420 and the ninth conductive line 1520 may be optional. One of the third conductive line 1430 and the tenth conductive line 1530 may be optional. One of the fourth conductive line 1440 and the eleventh conductive line 1540 may be optional. One of the fifth conductive line 1450 and the twelfth conductive line 1550 may be optional. One of the sixth conductive line 1460 and the thirteenth conductive line 1560 may be optional. One of the seventh conductive line 1470 and the fourteenth conductive line 1570 may be optional.

Components of the transistors, the capacitors, etc. illustrated in FIG. 4 and the associated layers are described with reference to FIGS. 5 through 16.

Figure 5:
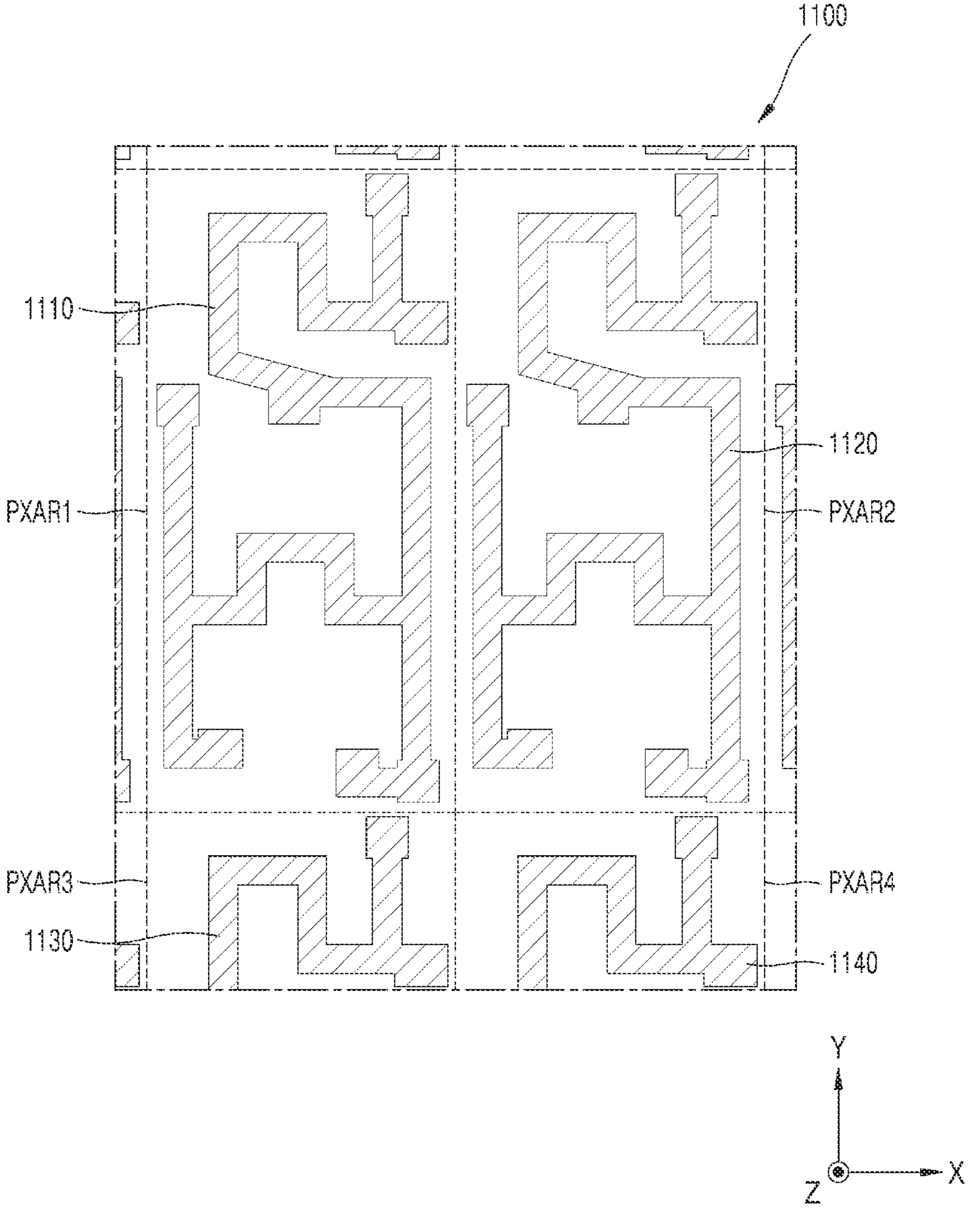
FIG. 5, FIG. 6, FIG. 7, FIG. 8, FIG. 9, and FIG. 10 are schematic layout diagrams of components of the transistors, the capacitors, etc. illustrated in FIG. 4 in different layers according to one or more embodiments.

A semiconductor layer 1100 illustrated in FIG. 5 may be arranged on the substrate 100. The semiconductor layer 1100 may include a silicon semiconductor. The semiconductor layer 1100 may include amorphous silicon or polysilicon. The semiconductor layer 1100 may include polysilicon crystallized in a low temperature. Ions may be injected onto at least a portion of the semiconductor layer 1100.

The semiconductor layer 1100 may include a plurality of semiconductor patterns. The semiconductor patterns may be spaced from one another. For example, as illustrated in FIG. 5, a first semiconductor pattern 1110 may be arranged in/on the first pixel area PXAR1, a second semiconductor pattern 1120 may be arranged in/on the second pixel area PXAR2, a third semiconductor pattern 1130 may be arranged in/on the third pixel area PXAR3, and a fourth semiconductor pattern 1140 may be arranged in/on the fourth pixel area PXAR4. The first through fourth semiconductor patterns 1110 through 1140 may be spaced from each other.

Figure 8:
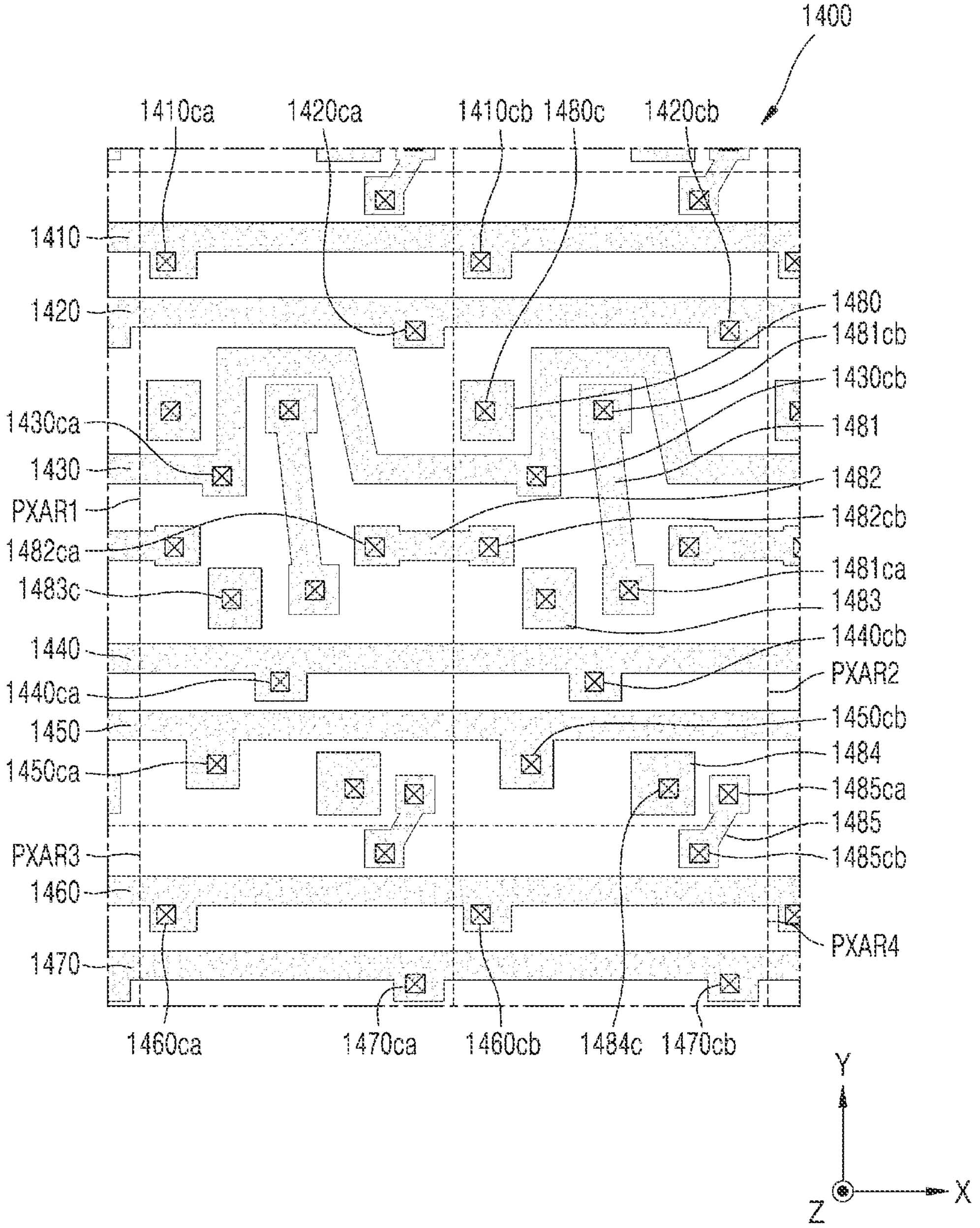

Semiconductor patterns adjacent to each other in the second direction may be connected to each other through first bridges 1485 of FIG. 8. The first semiconductor pattern 1110 may be connected to the third semiconductor pattern 1130 through the first bridge 1485, and the second semiconductor pattern 1120 may be connected to the fourth semiconductor pattern 1140 through the first bridge 1485.

Figure 6:
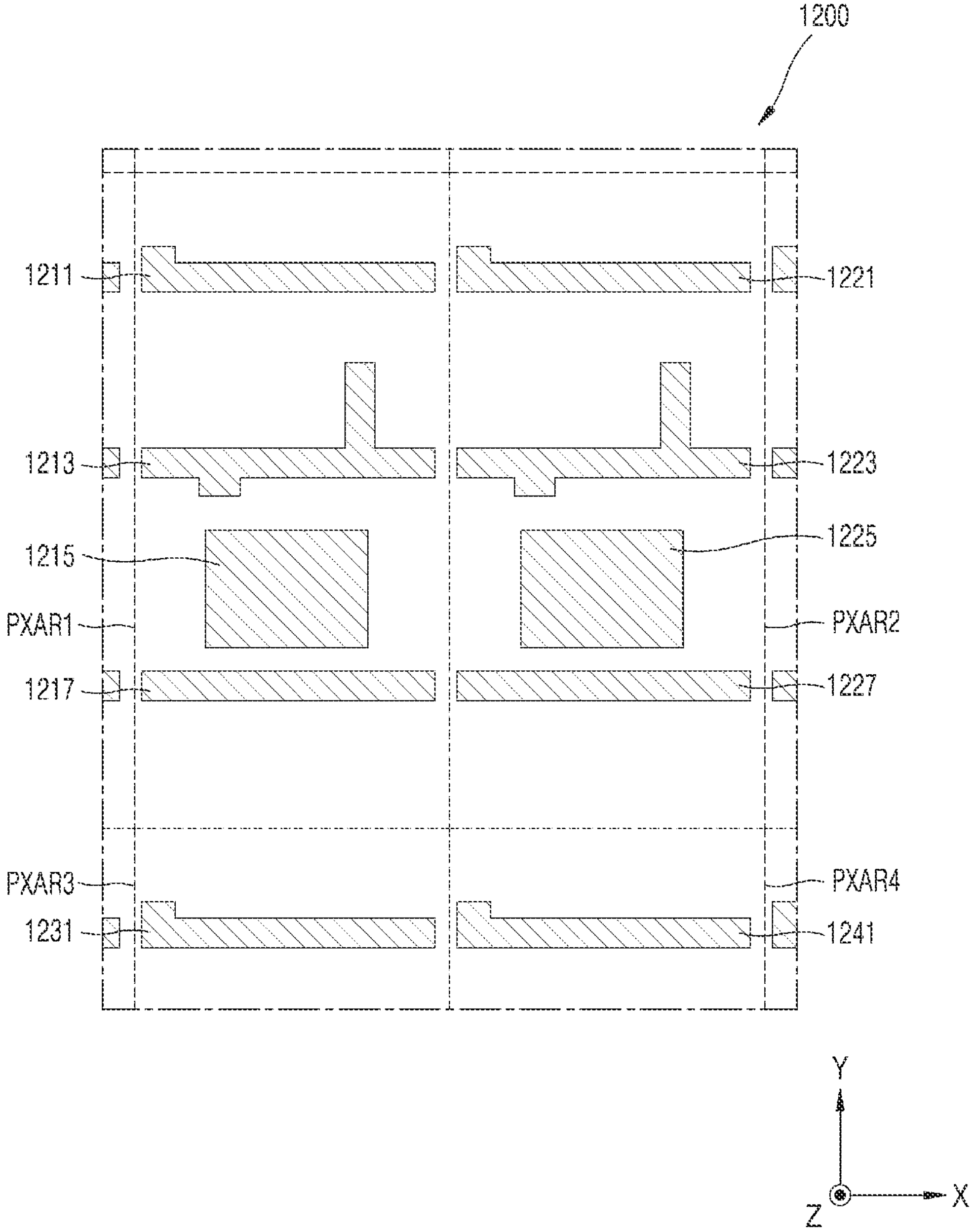

A first conductive layer 1200 of FIG. 6 may be arranged on the semiconductor layer 1100. The first conductive layer 1200 may include at least one of Mo, Al, Cu, Ti, etc., and may include a single layer or multiple layers. The first conductive layer 1200 may include a single Mo layer.

The first conductive layer 1200 may include a plurality of conductive patterns. The conductive patterns of the first conductive layer 1200 may be spaced from one another.

The first conductive layer 1200 may include a first gate electrode 1211, a second gate electrode 1213, a third gate electrode 1215, a fourth gate electrode 1217, a fifth gate electrode 1221, a sixth gate electrode 1223, a seventh gate electrode 1225, an eighth gate electrode 1227, a ninth gate electrode 1231, and a tenth gate electrode 1241. The first gate electrode 1211, the second gate electrode 1213, the third gate electrode 1215, and the fourth gate electrode 1217 may be arranged in the first pixel area PXAR1, the fifth gate electrode 1221, the sixth gate electrode 1223, the seventh gate electrode 1225, and the eighth gate electrode 1227 may be arranged in the second pixel area PXAR2, the ninth gate electrode 1231 may be arranged in the third pixel area PXAR3, and the tenth gate electrode 1241 may be arranged in the fourth pixel area PXAR4.

The first gate electrode 1211 and the fifth gate electrode 1221 may correspond to the second scan line SL−1 of FIG. 3, the second gate electrode 1213 and the sixth gate electrode 1223 may correspond to the first scanline SL of FIG. 3, the fourth gate electrode 1217 and the eighth gate electrode 1227 may correspond to the emission control line EL of FIG. 3, and the ninth gate electrode 1231 and the tenth gate electrode 1241 may correspond to the third scan line SL+1.

Portions of the first gate electrode 1211 and the fifth gate electrode 1221 may overlap the semiconductor layer 1100 and may correspond to the gate of the gate initialization transistor T4. Portions of the second gate electrode 1213 and the sixth gate electrode 1223 may overlap the semiconductor layer 1100 and may correspond to the gate of the scan transistor T2 and the gate of the compensation transistor T3. Portions of the third gate electrode 1215 and the seventh gate electrode 1225 may overlap the semiconductor layer 1100 and may correspond to the gate of the driving transistor T1. Portions of the fourth gate electrode 1217 and the eighth gate electrode 1227 may overlap the semiconductor layer 1100 may correspond to the gate of the first emission control transistor T5 and the gate of the second emission control transistor T6. Portions of the ninth gate electrode 1231 and the tenth gate electrode 1241 may overlap the semiconductor layer 1100 and may correspond to the gate of the anode initialization transistor T7.

One or more conductive patterns adjacent to each other in the first direction may be connected to each other through conductive lines of FIG. 8. The first gate electrode 1211 and the fifth gate electrode 1221 may be connected to each other through the first conductive line 1410, the second gate electrode 1213 and the sixth gate electrode 1223 may be connected to each other through the third conductive line 1430, the fourth gate electrode 1217 and the eighth gate electrode 1227 may be connected to each other through the fourth conductive line 1440, and the ninth gate electrode 1231 and the tenth gate electrode 1241 may be connected to each other through the sixth conductive line 1460.

Figure 7:
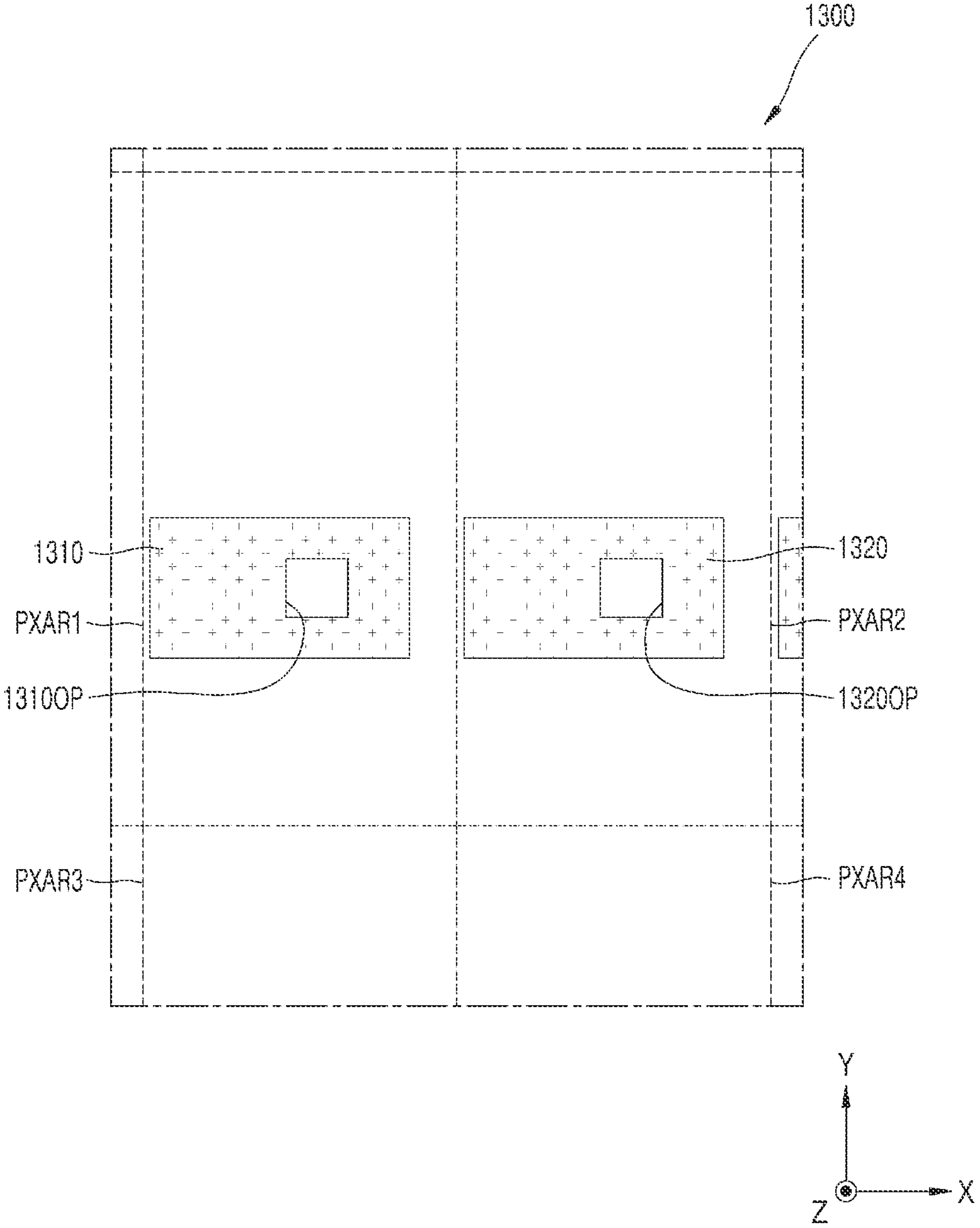

A second conductive layer 1300 of FIG. 7 may be arranged on the first conductive layer 1200. The second conductive layer 1300 may include at least one of Mo, Al, Cu, Ti, etc., and may include a single layer or multiple layers. The second conductive layer 1300 may include a single Mo layer.

The second conductive layer 1300 may include a plurality of conductive patterns. The conductive patterns of the second conductive layer 1300 may be spaced from one another. The second conductive layer 1300 may include a first electrode 1310 arranged in the first pixel area PXAR1 and a second electrode 1320 arranged in the second pixel area PXAR2. The first electrode 1310 and the second electrode 1320 may be spaced from each other.

The first electrode 1310 may at least partially overlap the third gate electrode 1215 of FIG. 6, and the second electrode 1320 may at least partially overlap the seventh gate electrode 1225 of FIG. 6. The first electrode 1310 and the second electrode 1320 may correspond to the upper electrode CE2 of the storage capacitor Cst of FIG. 3, and the third gate electrode 1215 and the seventh gate electrode 1225 may correspond to the lower electrode CE1 of the storage capacitor Cst of FIG. 3. The first electrode 1310 and the third gate electrode 1215 may form a capacitance, and the second electrode 1320 and the seventh gate electrode 1225 may form a capacitance.

Openings 1310OP and 1320OP may be formed in the first electrode 1310 and the second electrode 1320, respectively. The gate of the driving transistor T1 and the drain of the compensation transistor T3 may be connected to each other using the openings 1310OP and the 1320OP of the first and second electrodes 1310 and 1320.

One or more conductive patterns adjacent to each other in the first direction may be connected to each other through second bridges 1482 of FIG. 8. The first electrode 1310 may be connected to the second electrode 1320 through the second bridge 1482.

A third conductive layer 1400 of FIG. 8 may be arranged on the second conductive layer 1300. The third conductive layer 1400 may include a conductive material including at least one of Mo, Al, Cu, Ti, etc. and may include multiple layers or a single layer. The third conductive layer 1400 may have a multi-layered structure of Ti—Al—Ti.

The third conductive layer 1400 may include a plurality of conductive lines. Each of the conductive lines of the third conductive layer 1400 may extend in the first direction and may be connected to the pixel circuits PC arranged in the same row. Some of the conductive lines of the third conductive layer 1400 may be connected to the semiconductor layer 1100 and the others may be connected to the first conductive layer 1200.

The third conductive layer 1400 may include the first through seventh conductive lines 1410 through 1470. The first conductive line 1410 may be connected to the first gate electrode 1211 through a 1-1st contact plug 1410*ca* and to the fifth gate electrode 1221 through a 1-2nd contact plug 1410*cb*. The second conductive line 1420 may be connected to the first semiconductor pattern 1110 (for example, the drain of the gate initialization transistor T4) through a 2-1st contact plug 1420*ca* and to the second semiconductor pattern 1120 (for example, the drain of the gate initialization transistor T4) through a 2-2nd contact plug 1420*cb*. The third conductive line 1430 may be connected to the second gate electrode 1213 through a 3-1st contact plug 1430*ca* and to the sixth gate electrode 1223 through a 3-2nd contact plug 1430*cb*. The fourth conductive line 1440 may be connected to the fourth gate electrode 1217 through a 4-1st contact plug 1440*ca* and to the eighth gate electrode 1227 through a 4-2nd contact plug 1440*cb*. The fifth conductive line 1450 may be connected to the first semiconductor pattern 1110 (for example, the source of the first emission control transistor T5) through a 5-1st contact plug 1450*ca* and to the second semiconductor pattern 1120 (for example, the source of the first emission control transistor T5) through a 5-2nd contact plug 1450*cb*. The sixth conductive line 1460 may be connected to the ninth gate electrode 1231 through a 6-1st contact plug 1460*ca* and to the tenth gate electrode 1241 through a 6-2nd contact plug 1460*cb*. The seventh conductive line 1470 may be connected to the third semiconductor pattern 1130 (for example, the drain of the anode initialization transistor T7) through a 7-1st contact plug 1470*ca* and to the fourth semiconductor pattern 1140 (for example, the drain of the anode initialization transistor T7) through a 7-2nd contact plug 1470*cb*.

The first conductive line 1410 may correspond to the second scan line SL−1 of FIG. 3, the second conductive line 1420 and the seventh conductive line 1470 may correspond to the initialization voltage line VL of FIG. 3, the third conductive line 1430 may correspond to the first scan line SL of FIG. 3, the fourth conductive line 1440 may correspond to the emission control line EL of FIG. 3, the fifth conductive line 1450 may correspond to the driving voltage line PL of FIG. 3, and the sixth conductive line 1460 may correspond to the third scan line SL+1 of FIG. 3.

The third conductive layer 1400 may include a plurality of conductive patterns. The conductive patterns of the third conductive layer 1400 may be spaced from one another. The third conductive layer 1400 may include a first connection electrode 1480, a second connection electrode 1481, a third connection electrode 1483, a fourth connection electrode 1484, the first bridges 1485, and the second bridges 1482. A first connection electrode 1480, a second connection electrode 1481, a third connection electrode 1483, and a fourth connection electrode 1484 may be arranged in each pixel area PXAR. The first bridge 1485 may be arranged in each pair of pixel rows (or pixel area rows), and the second bridge 1482 may be arranged in each pair of pixel columns (or pixel area columns).

Some of the conductive patterns of the third conductive layer 1400 may be connected to the semiconductor layer 1100, others may be connected to the first conductive layer 1200, and yet others may be connected to the second conductive layer 1300.

The first connection electrode 1480 may be connected to the semiconductor layer 1100 (for example, the source of the scan transistor T2) through an eighth contact plug 1480*c*. The second connection electrode 1481 may be connected to the first conductive layer 1200 (The third gate electrode 1215 or the seventh gate electrode 1225) through a 9-1st contact plug 1481*ca* and connected to the semiconductor layer 1100 (for example, the drain of the compensation transistor T3) through a 9-2nd contact plug 1481*cb*. The third connection electrode 1483 may be connected to the second conductive layer 1300 (for example, the first electrode 1310 or the second electrode 1320) through a tenth contact plug 1483*c*. The fourth connection electrode 1484 may be connected to the semiconductor layer 1100 (for example, the drain of the second emission control transistor T6) through an eleventh contact plug 1484*c*.

The first bridge 1485 may be connected to the semiconductor patterns adjacent to each other in the second direction through a 12-1st contact plug 1485*ca* and a 12-2nd contact plug 1485*cb*. The semiconductor patterns adjacent to each other in the second direction may be connected to each other through the first bridge 1485.

The second bridge 1482 may be connected to the semiconductor patterns adjacent to each other in the first direction through a 13-1st contact plug 1482*ca* and a 13-2nd contact plug 1482*cb*. The semiconductor patterns adjacent to each other in the first direction may be connected to each other through the second bridge 1482.

Figure 9:
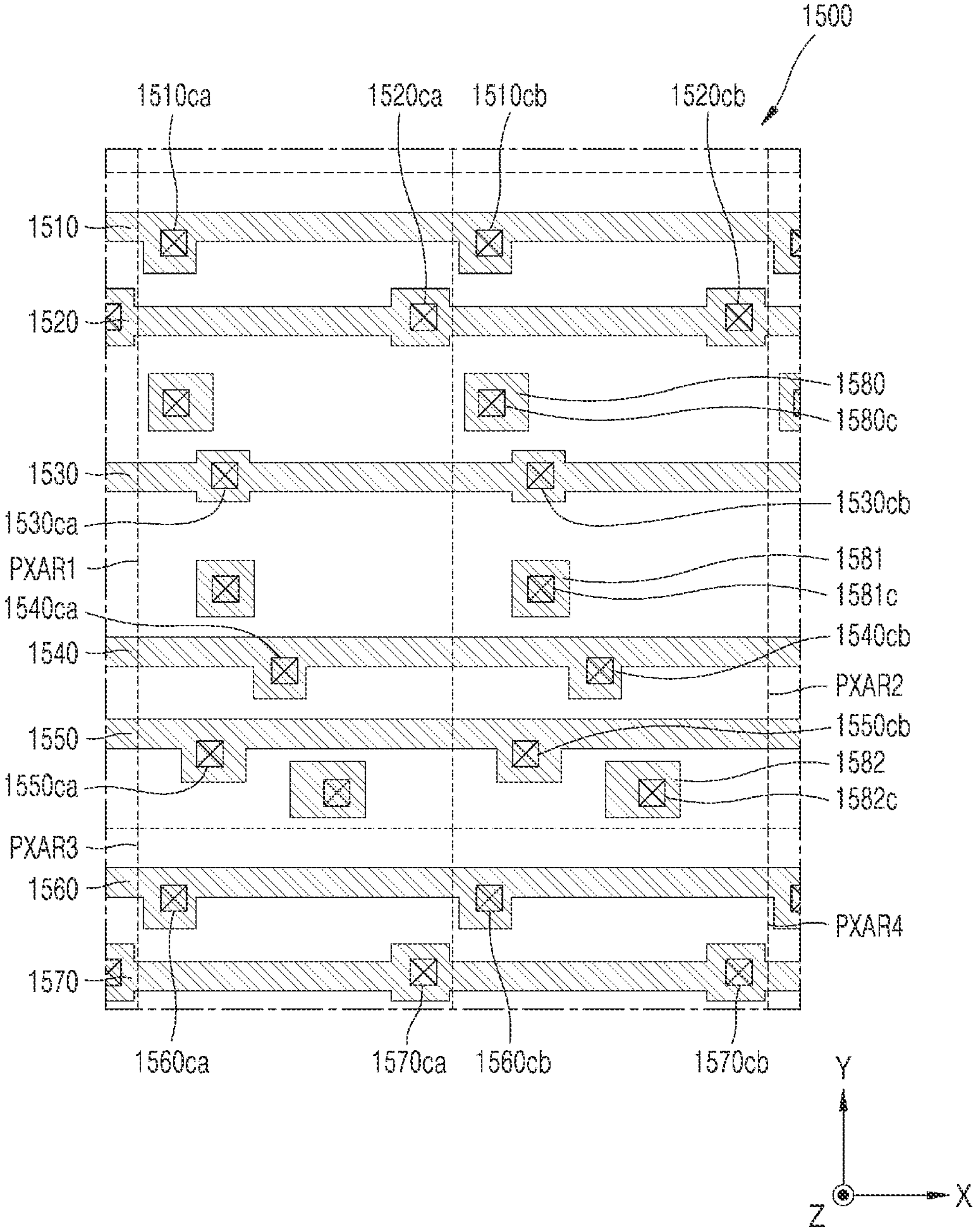

A fourth conductive layer 1500 of FIG. 9 may be arranged on the third conductive layer 1400. The fourth conductive layer 1500 may include a conductive material including at least one of Mo, Al, Cu, Ti, etc. and may include multiple layers or a single layer. The fourth conductive layer 1500 may have a multi-layered structure of Ti—Al—Ti.

The fourth conductive layer 1500 may include a plurality of conductive lines. Each of the conductive lines of the fourth conductive layer 1500 may extend in the first direction and may be connected to the pixel circuits PC arranged in the same row. The conductive lines of the fourth conductive layer 1500 may at least partially overlap the conductive lines of the third conductive layer 1400 and may be connected to the conductive lines of the third conductive layer 1400.

The fourth conductive layer 1500 may include the eighth through fourteenth conductive lines 1510 through 1570. The eighth conductive line 1510 may at least partially overlap the first conductive line 1410 and may be connected to the first conductive line 1410 through a 14-1st contact plug 1510*ca* and a 14-2nd contact plug 1510*cb*. The ninth conductive line 1520 may at least partially overlap the second conductive line 1420 and may be connected to the second conductive line 1420 through a 15-1st contact plug 1520*ca* and a 15-2nd contact plug 1520*cb*. The tenth conductive line 1530 may at least partially overlap the third conductive line 1430 and may be connected to the third conductive line 1430 through a 16-1st contact plug 1530*ca* and a 16-2nd contact plug 1530*cb*. The eleventh conductive line 1540 may at least partially overlap the fourth conductive line 1440 and may be connected to the fourth conductive line 1440 through a 17-1st contact plug 1540*ca* and a 17-2nd contact plug 1540*cb*. The twelfth conductive line 1550 may at least partially overlap the fifth conductive line 1450 and may be connected to the fifth conductive line 1450 through an 18-1st contact plug 1550*ca* and an 18-2nd contact plug 1550*cb*. The thirteenth conductive line 1560 may at least partially overlap the sixth conductive line 1460 and may be connected to the sixth conductive line 1460 through a 19-1st contact plug 1560*ca* and a 19-2nd contact plug 1560*cb*. The fourteenth conductive line 1570 may at least partially overlap the seventh conductive line 1470 and may be connected to the seventh conductive line 1470 through a 20-1st contact plug 1570*ca* and a 20-2nd contact plug 1570*cb*.

The eighth conductive line 1510 may correspond to the second scan line SL−1 of FIG. 3, the ninth conductive line 1520 and the fourteenth conductive line 1570 may correspond to the initialization voltage line VL of FIG. 3, the tenth conductive line 1530 may correspond to the first scan line SL of FIG. 3, the eleventh conductive line 1540 may correspond to the emission control line EL of FIG. 3, the twelfth conductive line 1550 may correspond to the driving voltage line PL of FIG. 3, and the thirteenth conductive line 1560 may correspond to the third scan line SL+1 of FIG. 3.

The fourth conductive layer 1500 may include a plurality of conductive patterns. The conductive patterns of the fourth conductive layer 1500 may be spaced from one another. The conductive patterns of the fourth conductive layer 1500 may be connected to the conductive patterns of the third conductive layer 1400.

The fourth conductive layer 1500 may include a fifth connection electrode 1580, a sixth connection electrode 1581, and a seventh connection electrode 1582. A fifth connection electrode 1580, a sixth connection electrode 1581, and a seventh connection electrode 1582 may be arranged in each pixel area PXAR.

The fifth connection electrode 1580 may be connected to the first connection electrode 1480 through a twenty-first contact plug 1580*c*. The sixth connection electrode 1581 may be connected to the third connection electrode 1483 through a twenty-second contact plug 1581*c*. The seventh connection electrode 1582 may be connected to the fourth connection electrode 1484 through a twenty-third contact plug 1582*c*.

Figure 10:
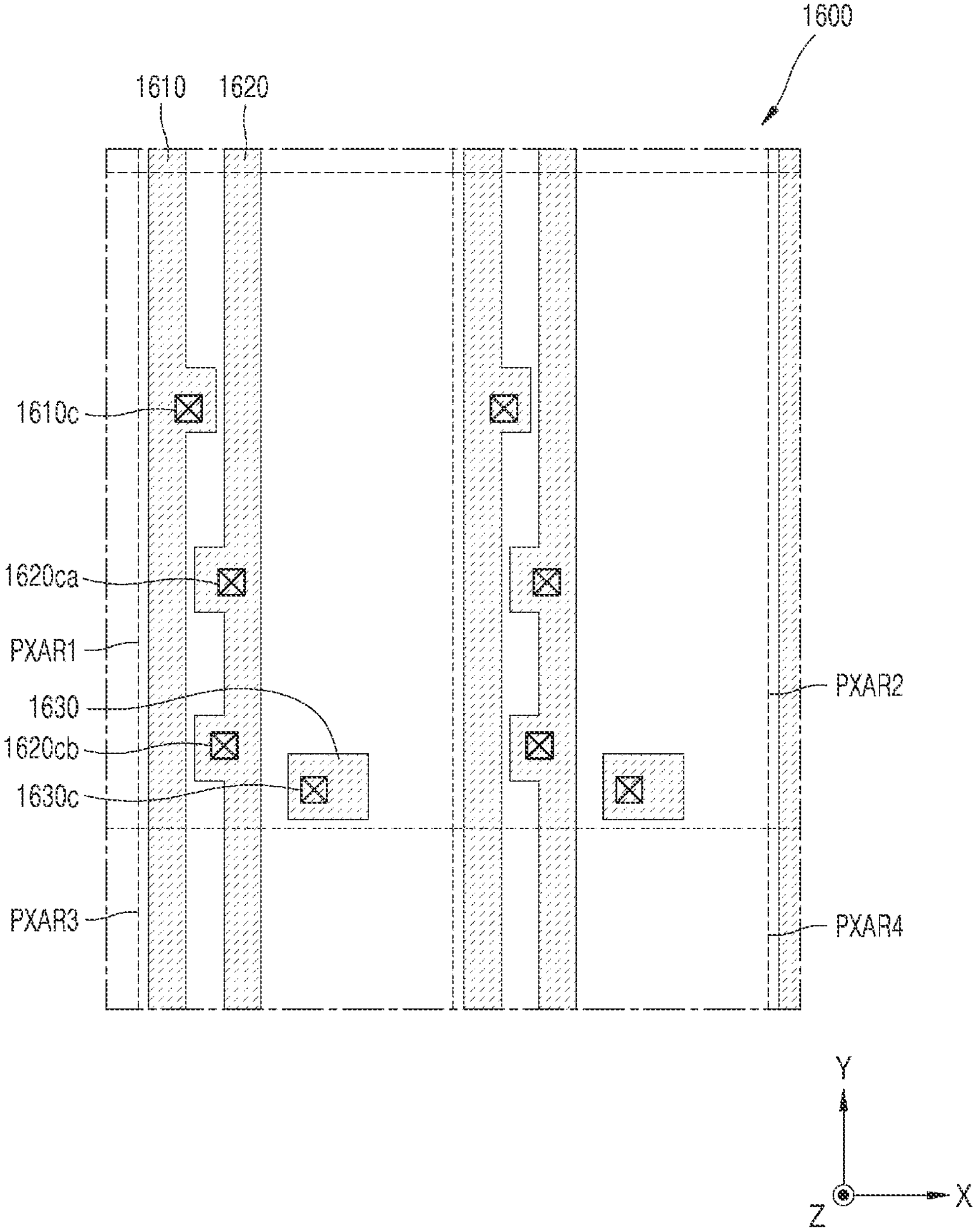

A fifth conductive layer 1600 of FIG. 10 may be arranged on the fourth conductive layer 1500. The fifth conductive layer 1600 may include a conductive material including at least one of Mo, Al, Cu, Ti, etc. and may include multiple layers or a single layer. The fifth conductive layer 1600 may have a multi-layered structure of Ti—Al—Ti.

The fifth conductive layer 1600 may include a plurality of conductive lines. Each of the conductive lines of the fifth conductive layer 1600 may extend in the second direction and may be connected to the pixel circuits PC arranged in the same column. The conductive lines of the fifth conductive layer 1600 may be connected to the fourth conductive layer 1500.

The fifth conductive layer 1600 may include a fifteenth conductive line 1610 and a sixteenth conductive line 1620. The fifteenth conductive line 1610 may be connected to the fifth connection electrode 1580 through a twenty-fourth contact plug 1610*c*. The sixteenth conductive line 1620 may be connected to the sixth connection electrode 1581 through a 25-1st contact plug 1620*ca* and to the twelfth conductive line 1550 through a 25-2nd contact plug 1620*cb*.

The fifteenth conductive line 1610 may correspond to the data line DL of FIG. 3, and the sixteenth conductive line 1620 may correspond to the driving voltage line PL of FIG.

3. The driving voltage line PL may have a grid structure including the fifth conductive line 1450, the twelfth conductive line 1550, and the sixteenth conductive line 1620.

The fifth conductive layer 1600 may include a plurality of conductive patterns. The conductive patterns of the fifth conductive layer 1600 may be spaced from one another. The conductive patterns of the fifth conductive layer 1600 may be connected to the conductive patterns of the fourth conductive layer 1500.

The fifth conductive layer 1600 may include an eighth connection electrode 1630. An eighth connection electrode 1630 may be arranged in each pixel area PXAR. The eighth connection electrode 1630 may be connected to the seventh connection electrode 1582 through a twenty-sixth contact plug 1630*c*. The eighth connection electrode 1630 may be connected to an anode (or a pixel electrode) of a display element, and thus, the display element may be connected to the semiconductor layer 1100 (for example, the drain of the second emission control transistor T6) through the seventh connection electrode 1582 and the eighth connection electrode 1630.

FIG. 11 is a schematic plan view of an insulating layer included in a display apparatus and arranged throughout a plurality of pixels according to an embodiment.

The first insulating layer IL1 may include an inorganic material and may have the opening OP. The opening OP of the first insulating layer IL1 may correspond to boundaries between the pixel areas PXAR. The opening OP of the first insulating layer IL1 may have a grid structure (or a mesh structure) in a plan view of the display apparatus.

A first opening OP1 may correspond to a boundary between a first pixel area PXAR1 and a second pixel area PXAR2 adjacent to the first pixel area PXAR1 in an +X direction, a second opening OP2 may correspond to a boundary between the first pixel area PXAR1 and a third pixel area PXAR3 adjacent to the first pixel area PXAR1 in a −Y direction, a third opening OP3 may correspond to a boundary between the first pixel area PXAR1 and a fifth pixel area PXAR5 adjacent to the first pixel area PXAR1 in a −X direction, and a fourth opening OP4 may correspond to a boundary between the first pixel area PXAR1 and a sixth pixel area PXAR6 adjacent to the first pixel area PXAR1 in a +Y direction.

FIG. 11 illustrates that a length of each of the first through fourth openings OP1, OP2, OP3, and OP4 is substantially the same as a length of each boundary between two pixel areas PXAR. At least one of the first through fourth openings OP1, OP2, OP3, and OP4 may include sub-openings separated by one or more portions of the first insulating layer IL1. A sum of lengths of the sub-openings may be less than the length of the corresponding boundary between two pixel areas PXAR.

When a shock/impact is applied to a display apparatus, cracks may occur in an insulating layer including an inorganic material in the display apparatus. The cracks occurring in one pixel area may grow along the insulating layer and may extend to an adjacent pixel area. Thus, defects may occur in a plurality of pixels if the opening OP is not implemented.

Because the first insulating layer IL1 of the display apparatus has the opening OP corresponding to the boundaries between the pixel areas PXAR, growth of cracks may be prevented or minimized.

For example, due to a shock/impact, cracks may occur in the portion of the first insulating layer IL1 in the first pixel area PXAR1. The cracks may grow toward the second pixel area PXAR2 until they reach the first opening OP1 and may not grow into the second pixel area PXAR2. The cracks may grow toward the third pixel area PXAR3 until they reach the second opening OP2 and may not grow into the third pixel area PXAR3, according to the display apparatus Advantageously, defects may be effectively prevented or minimized.

FIG. 12 is a schematic plan view of a pixel separation layer PSL included in a display apparatus and arranged throughout a plurality of pixels according to an embodiment.

Referring to FIG. 12, the pixel separation layer PSL may be arranged in the opening OP of the first insulating layer IL1. Because the pixel separation layer PSL is arranged in the opening OP, a height difference generated due to the opening OP may be removed or minimized.

The/a material of the first insulating layer IL1 may be different from the/a material of the pixel separation layer PSL. The first insulating layer IL1 may include an inorganic material, and the pixel separation layer PSL may include an organic material. Because the pixel separation layer PSL includes an organic material, cracks occurring in the inorganic material of the first insulating layer IL1 may be substantially prevented from growing into an adjacent pixel.

The pixel separation layer PSL may correspond to boundaries between the pixel areas PXAR. The pixel separation layer PSL may have a grid structure (or a mesh structure) in a plan view of the display apparatus.

For example, a first pixel separation layer PSL1 may correspond to a boundary between the first pixel area PXAR1 and the second pixel area PXAR2 adjacent to the first pixel area PXAR1 in the +X direction, a second pixel separation layer PSL2 may correspond to a boundary between the first pixel area PXAR1 and the third pixel area PXAR3 adjacent to the first pixel area PXAR1 in the −Y direction, a third pixel separation layer PSL3 may correspond to a boundary between the first pixel area PXAR1 and the fifth pixel area PXAR5 adjacent to the first pixel area PXAR1 in the −X direction, and a fourth pixel separation layer PSL4 may correspond to a boundary between the first pixel area PXAR1 and the sixth pixel area PXAR6 adjacent to the first pixel area PXAR1 in the +Y direction. The first through fourth pixel separation layers PSL1, PSL2, PSL3, and PSL4 may be formed integrally with each other and formed of the same organic material.

FIG. 12 illustrates that a length of each of the first through fourth pixel separation layers PSL1, PSL2, PSL3, and PSL4 is substantially the same as a length of a boundary between two pixel areas PXAR. At least one of the first through fourth pixel separation layers PSL1, PSL2, PSL3, and PSL4 may include portions separated by one or more portion of the first insulating layer IL1. A length of each of the portions or a sum of the lengths of the portions may be less than the length of the corresponding boundary between two pixel areas PXAR.

FIG. 13 is a schematic cross-sectional view of the display apparatus, taken along lines I-I', II-II', and III-III' of FIG. 4.

The substrate 100 may include glass or polymer resins. The polymer resins may include at least one of polyethersulfone, polyacrylate, polyetherimide, polyethylene naphthalate, polyethylene terephthalate, polyphenylene sulfide, polyarylate, polyimide, polycarbonate, cellulose acetate propionate, etc. The substrate 100 including the polymer resins may be flexible, rollable, or bendable. The substrate 100 may have a multi-layered structure including a layer including the polymer resins and an inorganic layer (not shown).

A barrier layer 110 may be arranged on the substrate 100. The barrier layer 110 may prevent or minimize penetration of impurities into the semiconductor layer 1100 (see FIG. 5) from the substrate 100, etc. The barrier layer 110 may include an inorganic material, such as oxide or nitride, an organic material, or an organic and inorganic compound, and may have a single-layered structure or a multi-layered structure.

The first insulating layer IL1 may be arranged on the barrier layer 110. The first insulating layer IL1 may include $SiO_2$, $SiN_x$, SiON, $Al_2O_3$, $TiO_2$, $Ta_2O_5$, $HfO_2$, or $ZnO_2$. The first insulating layer IL1 may have the opening OP corresponding to boundaries between the pixel areas PXAR. For example, as illustrated in FIG. 13, the first insulating layer IL1 may have the opening OP corresponding to the boundary between the first pixel area PXAR1 and the second pixel area PXAR2.

FIG. 13 illustrates that the first insulating layer IL1 includes a buffer layer 111, a first gate insulating layer 113, a second gate insulating layer 115, and an interlayer insulating layer 117, and each of the buffer layer 111, the first gate insulating layer 113, the second gate insulating layer 115, and the interlayer insulating layer 117 has part of the opening OP. At least one of the buffer layer 111, the first gate insulating layer 113, the second gate insulating layer 115, and the interlayer insulating layer 117 may not have an opening corresponding to the boundary between the pixel areas PXAR1 and PXAR2. For example, the buffer layer 111 may not have an opening corresponding to the boundary between the pixel areas PXAR1 and PXAR2.

FIG. 13 illustrates that the barrier layer 110 does not have an opening corresponding to the boundary between the pixel areas PXAR1 and PXAR2. The barrier layer 110 may have an opening corresponding to the boundary between the pixel areas PXAR1 and PXAR2. That is, the barrier layer 110 may have an opening corresponding to the opening OP of the first insulating layer IL1.

The pixel separation layer PSL may be arranged in the opening OP of the first insulating layer IL1. Because the pixel separation layer PSL is arranged in the opening OP, a height difference generated due to the opening OP may be compensated for or minimized. The pixel separation layer PSL may include a single layer or multiple layers including an organic material. The pixel separation layer PSL may include benzocyclobutene (BCB), polyimide, hexamethyldisiloxane (HMDSO), polymethylmethacrylate (PMMA), or a general-purpose polymer, such as polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of two or more of the above materials.

The semiconductor layer 1100 may be arranged on the buffer layer 111. The semiconductor layer 1100 may include amorphous silicon or polysilicon. The semiconductor layer 1100 may include an oxide of at least one of In, Ga, Sn, Zr, V, Hf, Cd, Ge, Cr, Ti, Al, Cs, Ce, and Zn.

The semiconductor layer 1100 may include a channel area, a source area and a drain area at opposite sides of the channel area. The semiconductor layer 1100 may include a single layer or multiple layers.

The first gate insulating layer 113 and the second gate insulating layer 115 may be stacked on the substrate 100 to cover the semiconductor layer 1100, and the first conductive layer 1200 (see FIG. 6) may be arranged on the first gate insulating layer 113. FIG. 13 illustrates the third gate electrode 1215, the first gate electrode 1211, and the fifth gate electrode 1221 of the first conductive layer 1200. The third gate electrode 1215 may correspond to the gate of the driving transistor T1 and the lower electrode CE1 of the storage capacitor Cst of FIG. 3.

The second conductive layer 1300 (see FIG. 7) may be arranged on the second gate insulating layer 115. FIG. 13 illustrates the first electrode 1310 of the second conductive layer 1300. The first electrode 1310 may correspond to the upper electrode CE2 of the storage capacitor Cst of FIG. 3.

The storage capacitor Cst may overlap the driving transistor T1. The gate of the driving transistor T1 may function as the lower electrode CE1 of the storage capacitor Cst. Alternatively, the storage capacitor Cst may not overlap the driving transistor T1 and may be separately provided.

The interlayer insulating layer 117 may be provided on the second gate insulating layer 115 to cover the second conductive layer 1300, and the third conductive layer 1400 (see FIG. 8) may be arranged on the interlayer insulating layer 117. FIG. 13 illustrates the first conductive line 1410 of the third conductive layer 1400.

The first conductive line 1410 may be connected to the first gate electrode 1211 through a contact hole formed in the second gate insulating layer 115 and the interlayer insulating layer 117. A portion of the first conductive line 1410 may be positioned in the contact hole, and the portion of the first conductive line 1410 that is positioned in the contact hole may be referred to as the 1-1st contact plug 1410*ca*. The first conductive line 1410 and the 1-1st contact plug 1410*ca* may be formed integrally with each other.

The first conductive line 1410 may be connected to the fifth gate electrode 1221 through a contact hole formed in the second gate insulating layer 115 and the interlayer insulating layer 117. A portion of the first conductive line 1410 may be positioned in the contact hole, and the portion of the first conductive line 1410 that is positioned in the contact hole may be referred to as the 1-2nd contact plug 1410*cb*. The first conductive line 1410 and the 1-2nd contact plug 1410*cb* may be formed integrally with each other.

Figure 25:
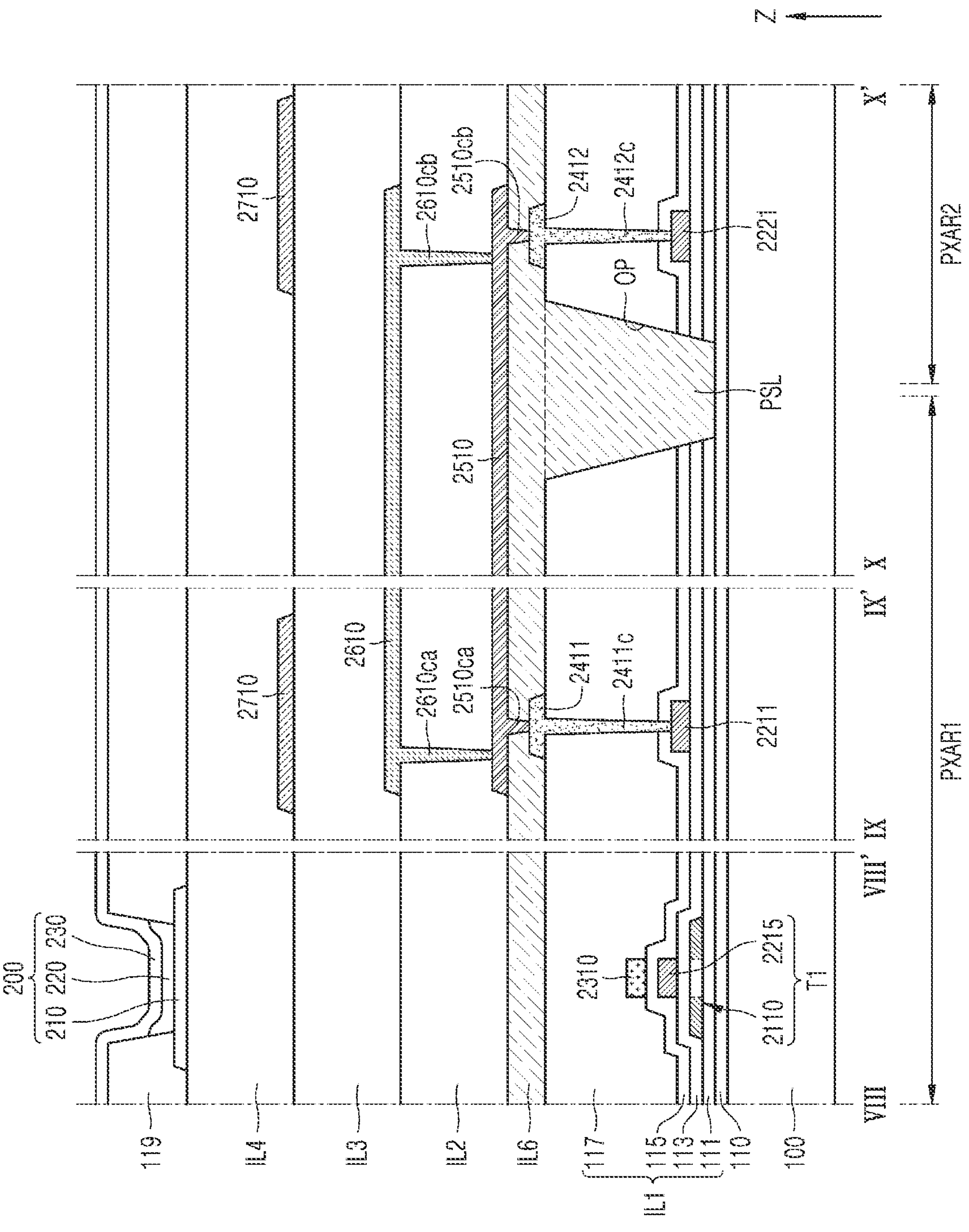
FIG. 25 is a schematic cross-sectional view of a display apparatus taken along lines VIII-VIII', IX-IX', and X-X' of FIG. 17 according to an embodiment.

FIG. 13 illustrates that the first conductive line 1410 directly contacts the pixel separation layer PSL. The first conductive line 1410 and the pixel separation layer PSL may not directly contact each other. For example, as illustrated in FIG. 25, a sixth insulating layer IL6 may be arranged between the first conductive line 1410 and the pixel separation layer PSL.

A second insulating layer IL2 may be arranged on the interlayer insulating layer 117 to cover the third conductive layer 1400. The second insulating layer IL2 may include a single layer or multiple layers including an organic material and may provide a flat upper surface. The second insulating layer IL2 may include BCB, polyimide, HMDSO, PMMA, or a general-purpose polymer, such as PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the above materials.

The fourth conductive layer 1500 (see FIG. 9) may be arranged on the second insulating layer IL2. FIG. 13 illustrates the eighth conductive line 1510 of the fourth conductive layer 1500.

The eighth conductive line 1510 may be connected to a portion of the first conductive line 1410 through a contact hole formed in the second insulating layer IL2. A portion of the eighth conductive line 1510 may be positioned in the contact hole, and the portion of the eighth conductive line 1510 that is positioned in the contact hole may be referred to as the 14-1st contact plug 1510*ca*. The eighth conductive line 1510 and the 14-1st contact plug 1510*ca* may be formed integrally with each other.

The eighth conductive line 1510 may be connected to another portion of the first conductive line 1410 through a contact hole formed in the second insulating layer IL2. A portion of the eighth conductive line 1510 may be positioned in the contact hole, and the portion of the eighth conductive line 1510 that is positioned in the contact hole may be referred to as the 14-2nd contact plug 1510*cb*. The eighth conductive line 1510 and the 14-2nd contact plug 1510*cb* may be formed integrally with each other.

Each of the first conductive line 1410 and the eighth conductive line 1510 may at least partially overlap the pixel separation layer PSL. The first conductive line 1410 and the eighth conductive line 1510 may at least partially overlap each other. Because the first conductive line 1410 and the eighth conductive line 1510 may be connected to each other, the same signal may be applied to the first conductive line 1410 and the eighth conductive line 1510. The second scan signal Sn−1 of FIG. 3 may be applied to the first conductive line 1410 and the eighth conductive line 1510.

A third insulating layer IL3 may be arranged on the second insulating layer IL2 to cover the fourth conductive layer 1500. The third insulating layer IL3 may include a single layer or multiple layers including an organic material and may provide a flat upper surface. The third insulating layer IL3 may include BCB, polyimide, HMDSO, PMMA, or a general-purpose polymer, such as PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the above materials.

The fifth conductive layer 1600 (see FIG. 10) may be arranged on the third insulating layer IL3. FIG. 13 illustrates the fifteenth conductive line 1610 of the fifth conductive layer 1600.

A fourth insulating layer IL4 may be arranged on the third insulating layer IL3 to cover the fifth conductive layer 1600. The fourth insulating layer IL4 may include a single layer or multiple layers including an organic material and may provide a flat upper surface. The fourth insulating layer IL4 may include BCB, polyimide, HMDSO, PMMA, or a general-purpose polymer, such as PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the above materials.

A display element 200 may be arranged on the fourth insulating layer IL4. The display element 200 may be an organic light-emitting diode OLED and may include a pixel electrode 210, an intermediate layer 220 including an organic emission layer, and an opposite electrode 230.

The pixel electrode 210 may include a transflective electrode or a reflective electrode. The pixel electrode 210 may include a reflective layer including at least one of Ag, Mg, Al, Pt, Pd, Au, Ni, Nd, Ir, and Cr, and may include a transparent or semi-transparent electrode layer on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may include ITO-Ag-ITO.

In the display area of the substrate 100, a pixel-defining layer 119 may be arranged on the fourth insulating layer IL4. The pixel-defining layer 119 may cover an edge of the pixel electrode 210 and may have an opening exposing a central portion of the pixel electrode 210. An emission area of the display element 200 may be defined by the opening.

The pixel-defining layer 119 may increase a distance between the edge of the pixel electrode 210 and the opposite electrode 230 above the pixel electrode 210 so as to prevent arcs, etc. from occurring at the edge of the pixel electrode 210.

The pixel-defining layer 119 may be formed by spin coating, etc. and may include at least one organic insulating material selected from polyimide, polyamide, acryl resins, BCB, and phenol resins. The pixel-defining layer 119 may include an inorganic insulating material, such as silicon nitride, silicon oxynitride, or silicon oxide. The pixel-defining layer 119 may include an organic insulating material and an inorganic insulating material. The pixel-defining layer 119 may include a light-shielding material and/or a black material. The light-shielding material may include a resin or paste including carbon black, a carbon nano-tube, and a black dye, a metal particle, such as Ni, Al, and/or Mo, a metal oxide particle (for example, chromium oxide), and/or a metal nitride particle (for example, chromium nitride). When the pixel-defining layer 119 includes the light-shielding material, reflection of external light due to metal structures arranged below the pixel-defining layer 119 may be reduced.

The intermediate layer 220 may be arranged in the opening formed by the pixel-defining layer 119 and may include an organic emission layer. The organic emission layer may include an organic material including a fluorescent or phosphorescent material for emitting red, green, blue, or white light. The organic emission layer may include a low molecular-weight organic material or a high molecular-weight organic material. A hole transport layer (HTL), a hole injection layer (HIL), an electron transport layer (ETL), and/or an electron injection layer (EIL) may be arranged above and/or below the organic emission layer.

The opposite electrode 230 may include a transmissive electrode or a reflective electrode. The opposite electrode 230 may include a transparent or semi-transparent electrode and may include a metal thin-film having a low work function, such as at least one of Li, Ca, LiF—Ca, LiF—Al, Al, Ag, and Mg. A transparent conductive oxide (TCO) layer, such as ITO, IZO, ZnO, or $In_2O_3$, may be arranged above the metal thin-film. The opposite electrode 230 may be arranged on the entire display area and may be arranged above the intermediate layer 220 and the pixel-defining layer 119. The opposite electrode 230 may be shared by a plurality of display elements 200 and may overlap a plurality of pixel electrodes 210.

The display element 200 may be damaged by moisture or oxygen; thus, an encapsulation layer (not shown) may cover and protect the display element 200. The encapsulation layer may cover the display area and extend to at least a portion of the peripheral area. The encapsulation layer may include a first inorganic encapsulation layer, an organic encapsulation layer, and a second inorganic encapsulation layer.

Figure 14:
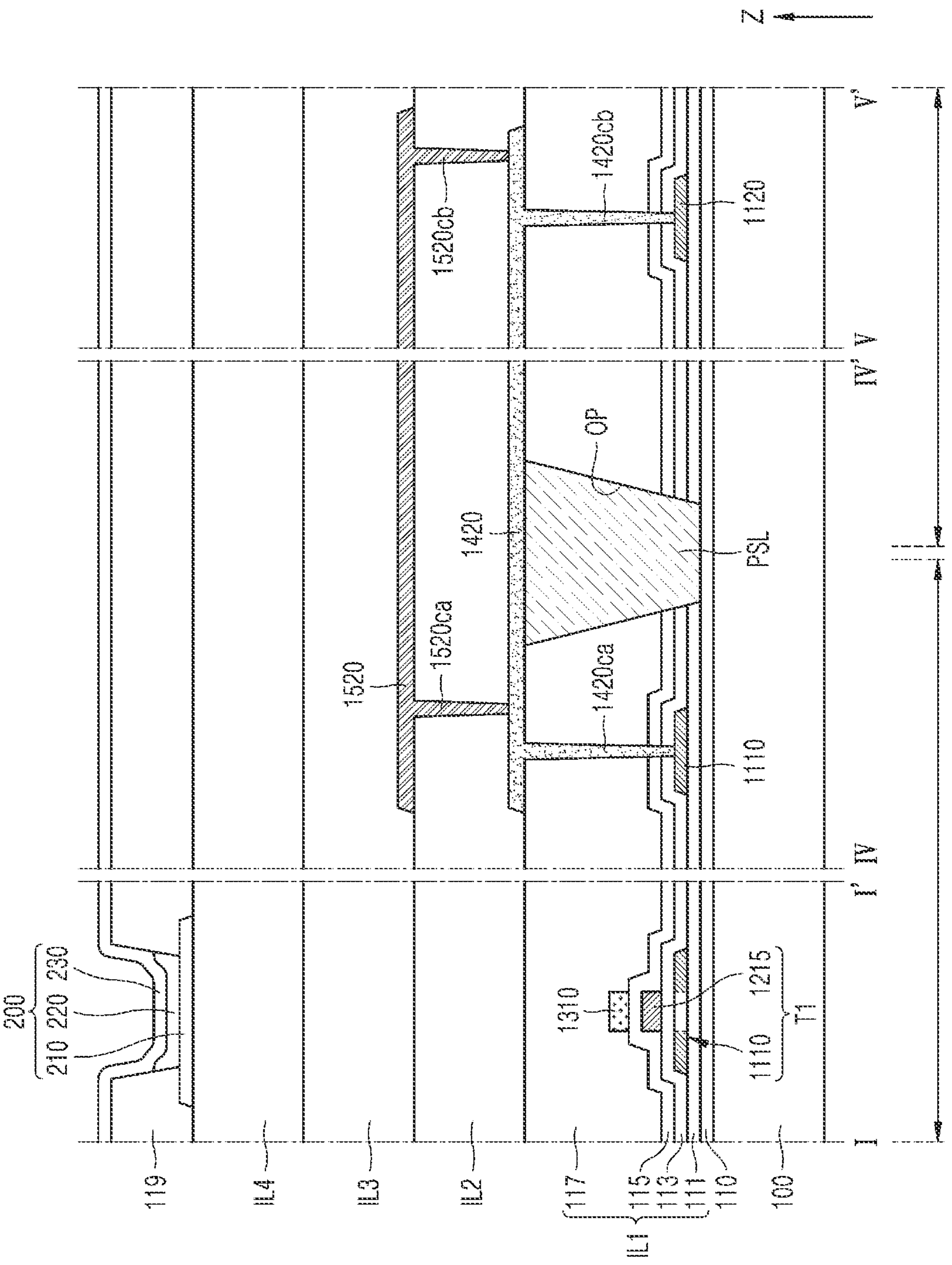
FIG. 14 is a schematic cross-sectional view of a display apparatus taken along lines I-I', IV-IV', and V-V' of FIG. 4 according to an embodiment.

FIG. 14 is a schematic cross-sectional view of the display apparatus, taken along lines I-I', IV-IV', and V-V' of FIG. 4.

Referring to FIG. 14, the first semiconductor pattern 1110 and the second semiconductor pattern 1120 may be arranged on the buffer layer 111, the second conductive line 1420 may be arranged on the interlayer insulating layer 117, and the ninth conductive line 1520 may be arranged on the second insulating layer IL2.

The second conductive line 1420 may be connected to the first semiconductor pattern 1110 through a contact hole formed in the first gate insulating layer 113, the second gate insulating layer 115, and the interlayer insulating layer 117. A portion of the second conductive line 1420 may be positioned in the contact hole, and the portion of the second conductive line 1420 that is positioned in the contact hole may be referred to as the 2-1st contact plug 1420*ca*. The second conductive line 1420 and the 2-1st contact plug 1420*ca* may be formed integrally with each other.

The second conductive line 1420 may be connected to the second semiconductor pattern 1120 through a contact hole formed in the first gate insulating layer 113, the second gate insulating layer 115, and the interlayer insulating layer 117. A portion of the second conductive line 1420 may be positioned in the contact hole, and the portion of the second conductive line 1420 that is positioned in the contact hole may be referred to as the 2-2nd contact plug 1420*cb*. The second conductive line 1420 and the 2-2nd contact plug 1420*cb* may be formed integrally with each other.

The ninth conductive line 1520 may be connected to a portion of the second conductive line 1420 through a contact hole formed in the second insulating layer IL2. A portion of the ninth conductive line 1520 may be positioned in the contact hole, and the portion of the ninth conductive line 1520 that is positioned in the contact hole may be referred to as the 15-1st contact plug 1520*ca*. The ninth conductive line 1520 and the 15-1st contact plug 1520*ca* may be formed integrally with each other.

The ninth conductive line 1520 may be connected to another portion of the second conductive line 1420 through a contact hole formed in the second insulating layer IL2. A portion of the ninth conductive line 1520 may be positioned in the contact hole, and the portion of the ninth conductive line 1520 that is positioned in the contact hole may be referred to as the 15-2nd contact plug 1520*cb*. The ninth conductive line 1520 and the 15-2nd contact plug 1520*cb* may be formed integrally with each other.

Each of the second conductive line 1420 and the ninth conductive line 1520 may at least partially overlap the pixel separation layer PSL. The second conductive line 1420 and the ninth conductive line 1520 may at least partially overlap each other. Because the second conductive line 1420 and the ninth conductive line 1520 may be connected to each other, the same signal may be applied to the second conductive line 1420 and the ninth conductive line 1520. The initialization voltage Vint of FIG. 3 may be applied to the second conductive line 1420 and the ninth conductive line 1520.

FIG. 14 illustrates that the second conductive line 1420 directly contacts the pixel separation layer PSL. The second conductive line 1420 and the pixel separation layer PSL may not directly contact each other. An additional insulating layer may be arranged between the second conductive line 1420 and the pixel separation layer PSL.

Figure 15:
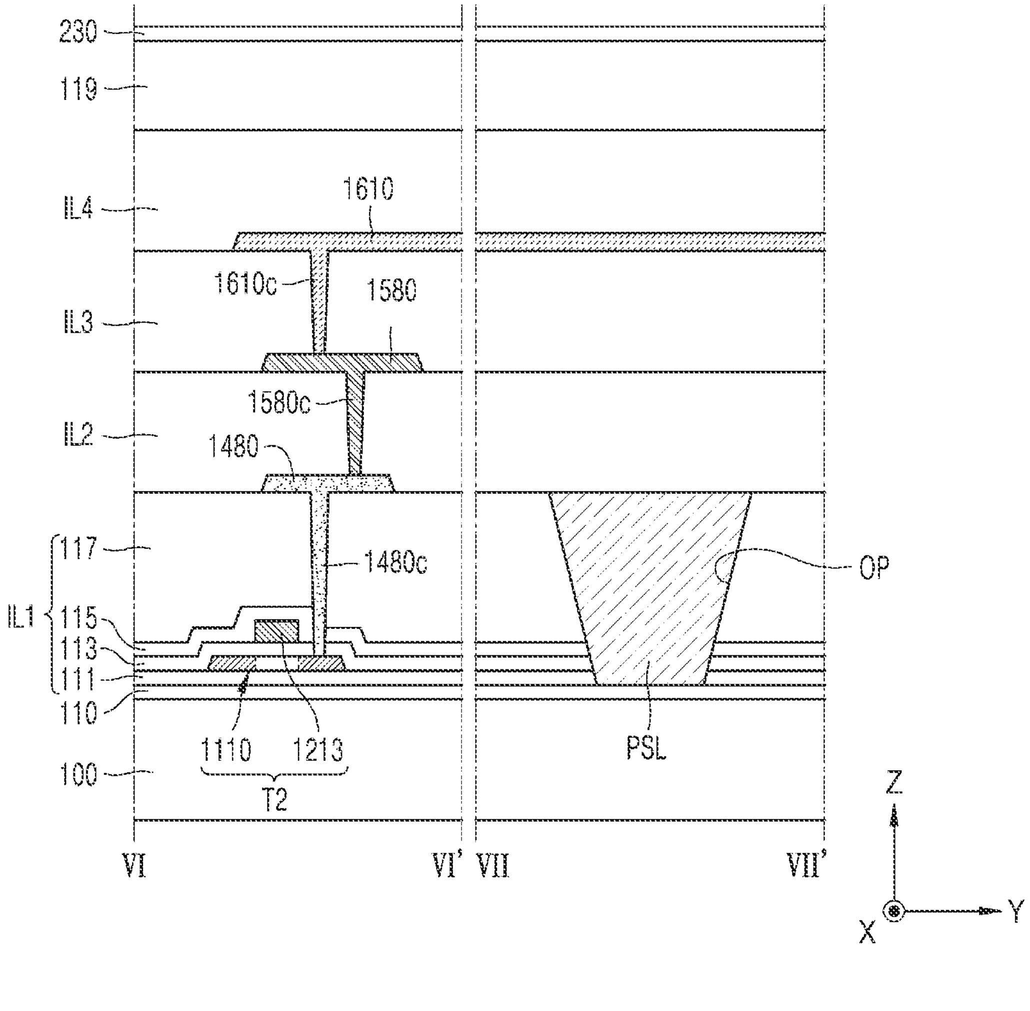
FIG. 15 is a schematic cross-sectional view of a display apparatus taken along lines VI-VI' and VII-VII' of FIG. 4 according to an embodiment.
Figure 16:
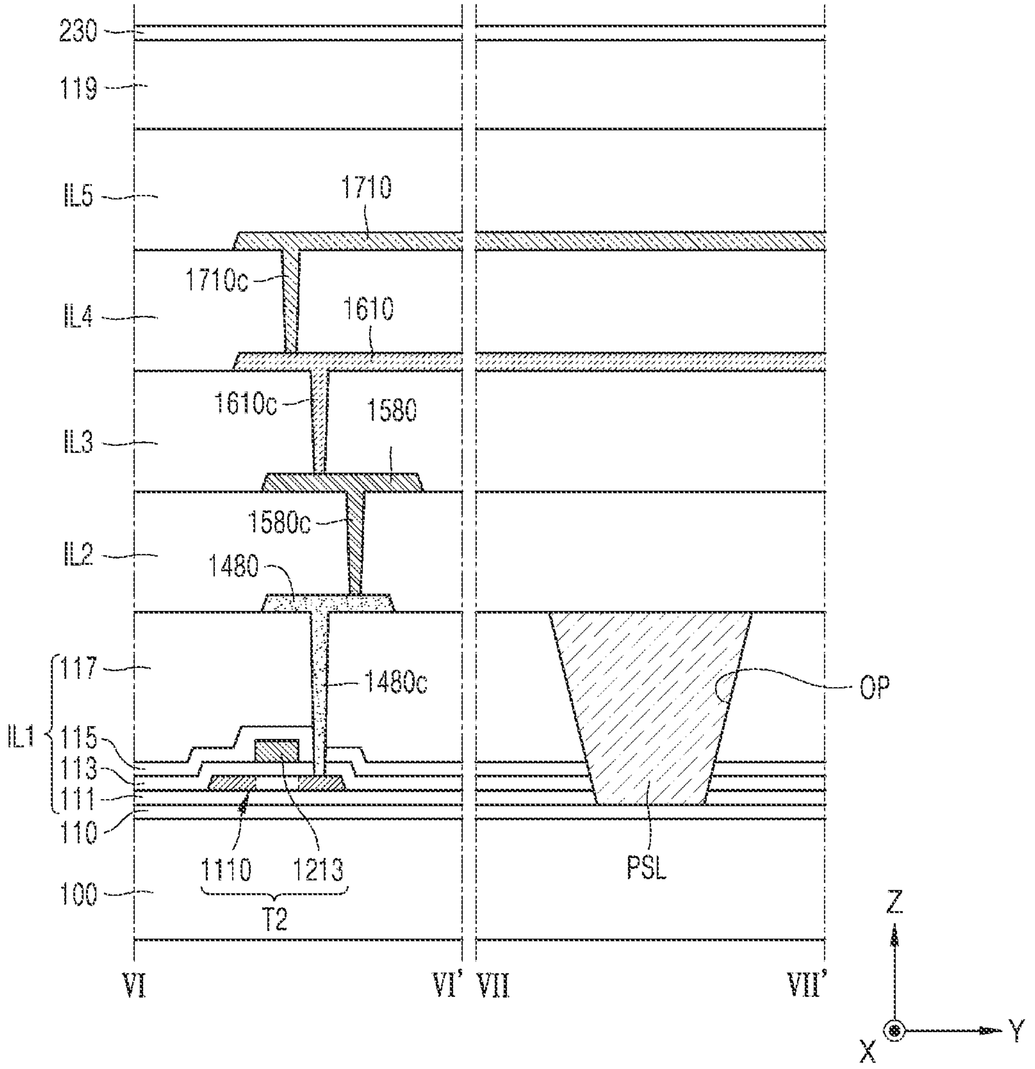
FIG. 16 is a schematic cross-sectional view of a display apparatus taken along lines VI-VI' and VII-VII' of FIG. 4 according to an embodiment.

FIGS. 15 and 16 are schematic cross-sectional views of the display apparatus, taken along lines VI-VI' and VII-VII' of FIG. 4. FIG. 16 illustrates a modified embodiment of FIG. 15.

Referring to FIG. 15, the scan transistor T2 may include a portion of the semiconductor layer 1100 (see FIG. 5) and a portion of the first conductive layer 1200 (see FIG. 6). The scan transistor T2 arranged in/on the first pixel area PXAR1 (see FIG. 4) may include a portion of the first semiconductor pattern 1110 and a portion of the second gate electrode 1213. The portion of the second gate electrode 1213 may overlap the portion of the first semiconductor pattern 1110.

The fifteenth conductive line 1610 may be connected to the scan transistor T2. The fifteenth conductive line 1610 may be connected to the portion of the first semiconductor pattern 1110 of the scan transistor T2. The portion of the first semiconductor pattern 1110 may be connected through the eighth contact plug 1480*c* to the first connection electrode 1480 arranged on the interlayer insulating layer 117. The first connection electrode 1480 may be connected through the twenty-first contact plug 1580*c* to the fifth connection electrode 1580 arranged on the second insulating layer IL2. The fifth connection electrode 1580 may be connected through the twenty-fourth contact plug 1610*c* to the fifteenth conductive line 1610 arranged on the third insulating layer IL3. The fifteenth conductive line 1610 may be connected to the scan transistor T2 through the eighth contact plug 1480*c*, the first connection electrode 1480, the twenty-first contact plug 1580*c*, the fifth connection electrode 1580, and the twenty-fourth contact plug 1610*c*.

The fifteenth conductive line 1610 may extend in the second direction and may overlap pixel areas PXAR (see FIG. 4). The fifteenth conductive line 1610 may at least partially overlap the pixel separation layer PSL corresponding to the boundaries between the pixel areas PXAR.

As illustrated in FIG. 16, a seventeenth conductive line 1710 may be arranged on the fourth insulating layer IL4, and a fifth insulating layer IL5 may be arranged on the seventeenth conductive line 1710. The fifteenth conductive line 1610 and the seventeenth conductive line 1710 may at least partially overlap each other. The fifteenth conductive line 1610 and the seventeenth conductive line 1710 may be connected to each other through a twenty-sixth contact plug 1710*c*. Because the fifteenth conductive line 1610 and the seventeenth conductive line 1710 may be connected to each other, the same signal may be applied to the fifteenth conductive line 1610 and the seventeenth conductive line 1710. The data voltage Dm of FIG. 3 may be applied to the fifteenth conductive line 1610 and the seventeenth conductive line 1710.

The seventeenth conductive line 1710 may extend in the second direction and may overlap pixel areas PXAR, like the fifteenth conductive line 1610. The seventeenth conductive line 1710 may at least partially overlap the pixel separation layer PSL corresponding to the boundaries between the pixel areas PXAR.

Figure 17:
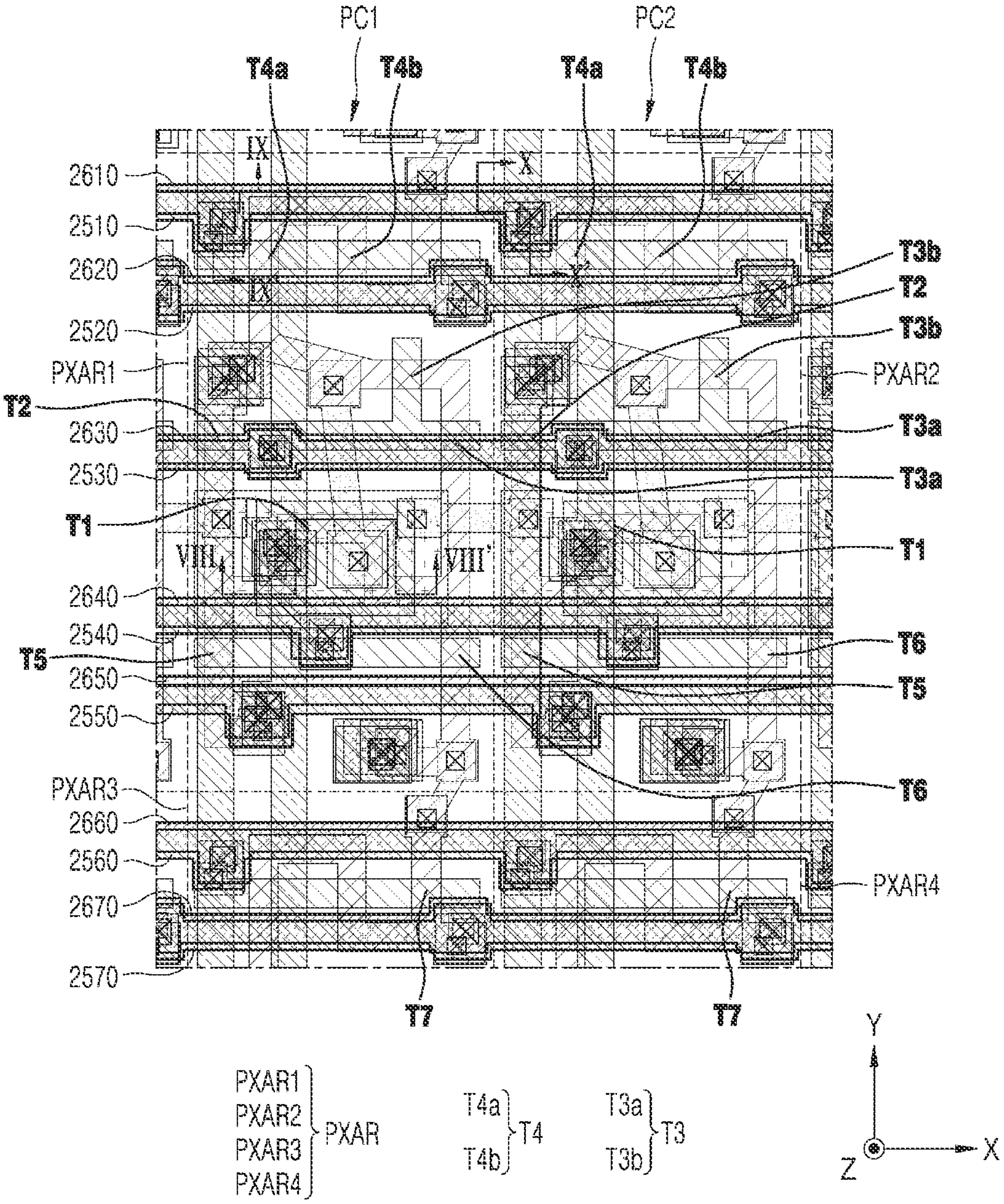
FIG. 17 is a schematic layout diagram of locations of transistors, capacitors, etc. in pixel circuits included in the display apparatus of FIG. 1 according to an embodiment.

FIG. 17 is a schematic layout diagram illustrating locations of transistors, capacitors, etc. in pixel circuits included in the display apparatus of FIG. 1. FIGS. 18 through 24 are schematic layout diagrams illustrating layers of components of the transistors, the capacitors, etc. illustrated in FIG. 17.

Referring to FIG. 17, the display apparatus may include first through seventh conductive lines 2510, 2520, 2530, 2540, 2550, 2560, and 2570, and eighth through fourteenth conductive lines 2610, 2620, 2630, 2640, 2650, 2660, and 2670 extending in a first direction (for example, a ±X direction) and connected to the first pixel circuit PC1 and the second pixel circuit PC2.

The first conductive line 2510 and the eighth conductive line 2610 may at least partially overlap each other. The first conductive line 2510 and the eighth conductive line 2610 may be connected to each other through at least one contact plug, and thus, the same signal may be applied to the first conductive line 2510 and the eighth conductive line 2610.

Referring to FIGS. 11 and 12, the first insulating layer IL1 (including an inorganic material) may have the opening OP, and the pixel separation layer PSL (including an organic material) may be arranged in the opening OP. The opening OP of the first insulating layer IL1 may correspond to the boundaries between the pixel areas PXAR, and the pixel separation layer PSL may be arranged on the boundaries between the pixel areas PXAR. The first conductive line 2510 and the eighth conductive line 2610 may extend in the first direction and may overlap pixel areas PXAR; thus, the first conductive line 2510 and the eighth conductive line 2610 may at least partially overlap the pixel separation layer PSL.

The above description related to the first conductive line 2510 and the eighth conductive line 2610 may be analogously applied to the second conductive line 2520 and the ninth conductive line 2620, the third conductive line 2530 and the tenth conductive line 2630, the fourth conductive line 2540 and the eleventh conductive line 2640, the fifth conductive line 2550 and the twelfth conductive line 2650, the sixth conductive line 2560 and the thirteenth conductive line 2660, and the seventh conductive line 2570 and the fourteenth conductive line 2670.

FIG. 17 illustrates that the display apparatus includes the first through seventh conductive lines 2510 through 2570 and the eighth through fourteenth conductive lines 2610 through 2670. At least one of the first through seventh conductive lines 2510 through 2570 and the eighth through fourteenth conductive lines 2610 through 2670 may be optional. For example, one of the first conductive line 2510 and the eighth conductive line 2610 may be optional. One of the second conductive line 2520 and the ninth conductive line 2620 may be optional. One of the third conductive line 2530 and the tenth conductive line 2630 may be optional. One of the fourth conductive line 2540 and the eleventh conductive line 2640 may be optional. One of the fifth conductive line 2550 and the twelfth conductive line 2650 may be optional. One of the sixth conductive line 2560 and the thirteenth conductive line 2660 may be optional. One of the seventh conductive line 2570 and the fourteenth conductive line 2670 may be optional.

Components of the transistors, the capacitors, etc. illustrated in FIG. 17 and the associated layers are described with reference to FIGS. 18 through 25.

Figure 18:
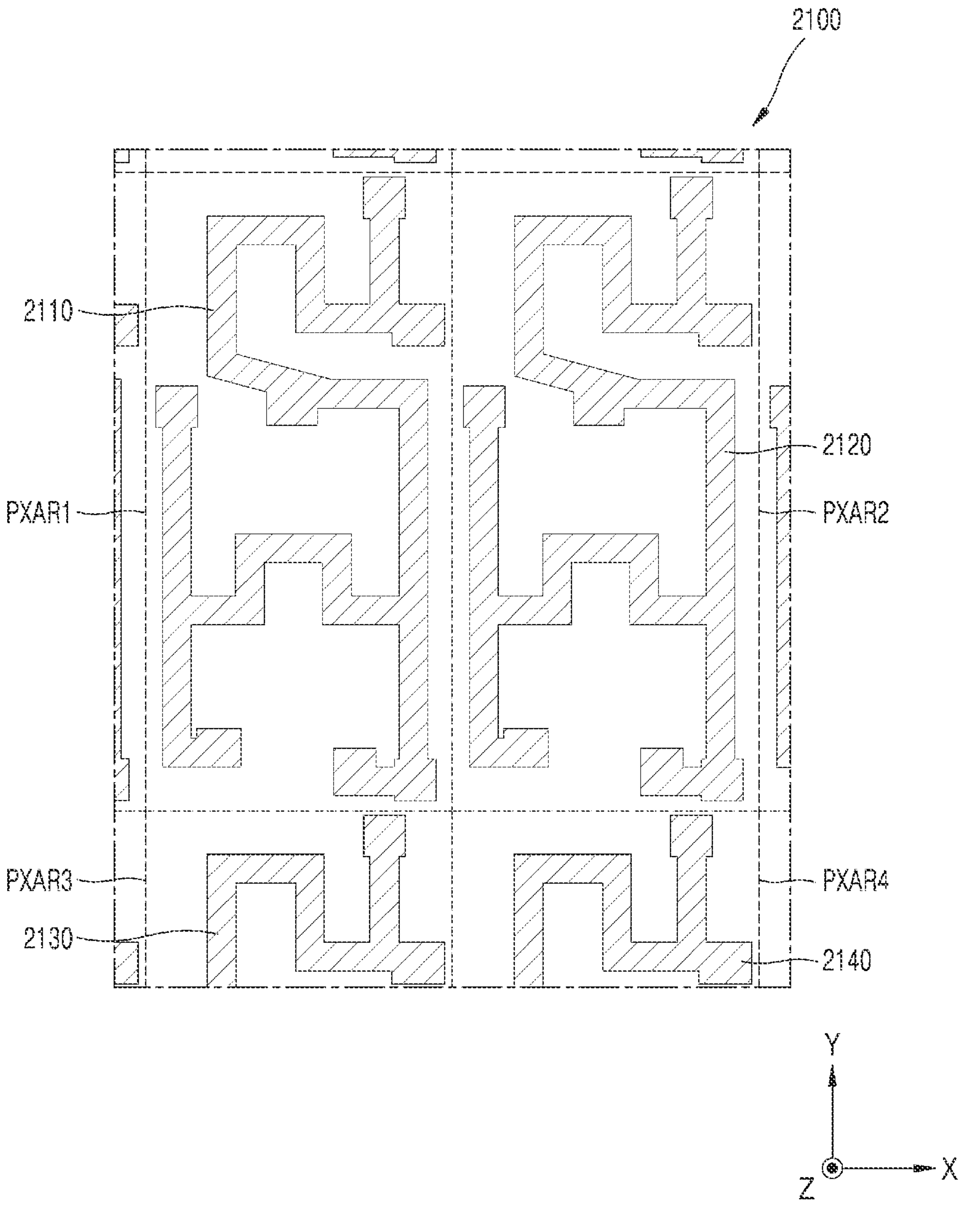
FIG. 18, FIG. 19, FIG. 20, FIG. 21, FIG. 22, FIG. 23, and FIG. 24 are schematic layout diagrams of components of the transistors, the capacitors, etc. illustrated in FIG. 17 in different layers according to one or more embodiments.

A semiconductor layer 2100 illustrated in FIG. 18 may be arranged on the substrate 100 (see FIG. 25). The description about the semiconductor layer 1100 of FIG. 5 may be likewise applied to the semiconductor layer 2100 of FIG. 18. The semiconductor layer 2100 may include first through fourth semiconductor patterns 2110, 2120, 2130, and 2140 that are spaced from each other.

Figure 19:
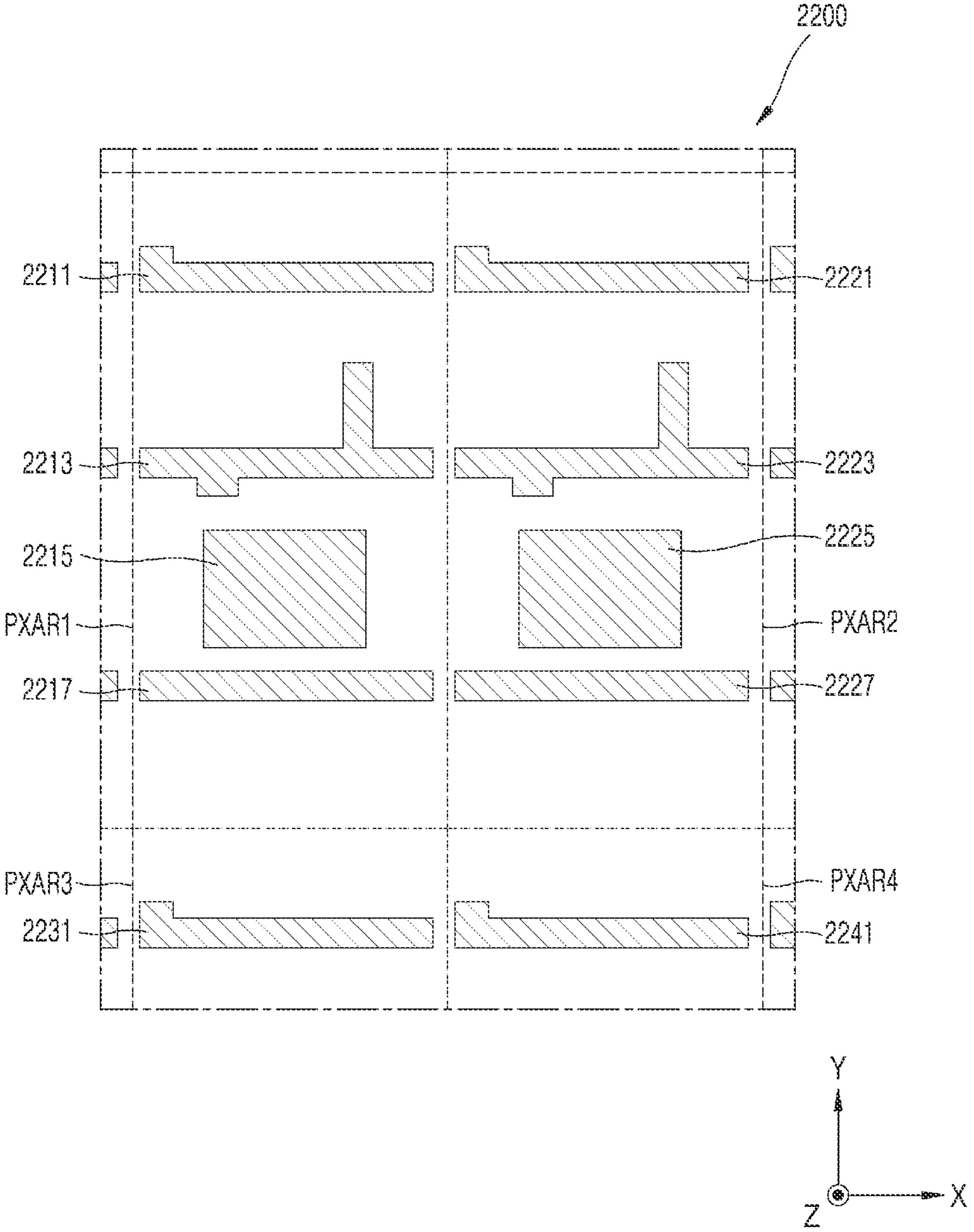

A first conductive layer 2200 of FIG. 19 may be arranged on the semiconductor layer 2100. The description about the first conductive layer 1200 of FIG. 6 may be likewise applied to the first conductive layer 2200 of FIG. 19. The first conductive layer 2200 may include first through tenth gate electrodes 2211, 2213, 2215, 2217, 2221, 2223, 2225, 2227, 2231, and 2241. The description about the first through tenth gate electrodes 1211, 1213, 1215, 1217, 1221, 1223, 1225, 1227, 1231, and 1241 of FIG. 6 may be likewise applied to the first through tenth gate electrodes 2211, 2213, 2215, 2217, 2221, 2223, 2225, 2227, 2231, and 2241 of FIG. 19.

Figure 20:
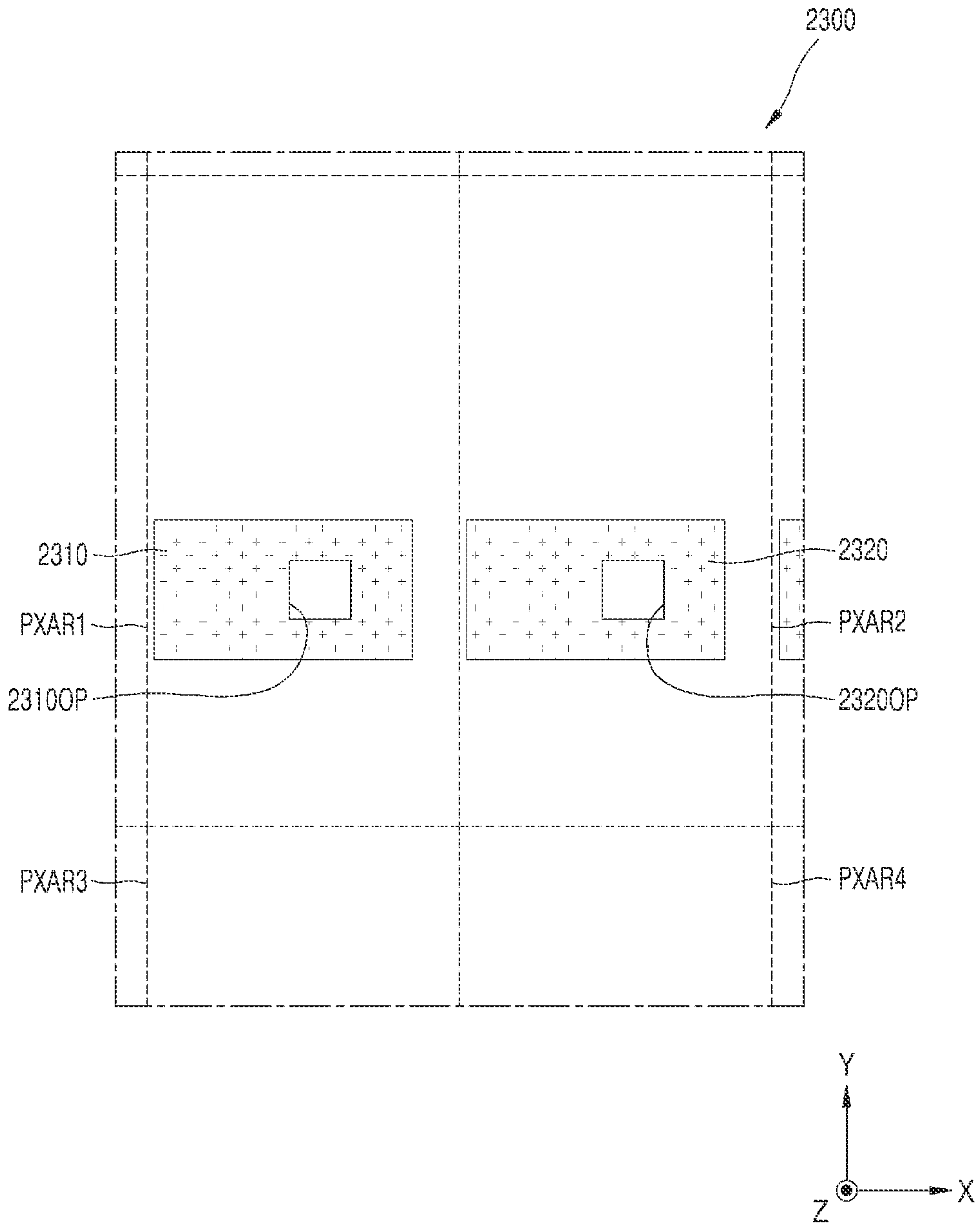

A second conductive layer 2300 of FIG. 20 may be arranged on the first conductive layer 2200. The description about the second conductive layer 1300 of FIG. 7 may be likewise applied to the second conductive layer 2300 of FIG. 20. The second conductive layer 2300 may include a first electrode 2310 arranged in the first pixel area PXAR1 and a second electrode 2320 arranged in the second pixel area PXAR2. Openings 23100P and 23200P may be formed in the first electrode 2310 and the second electrode 2320, respectively.

Figure 21:
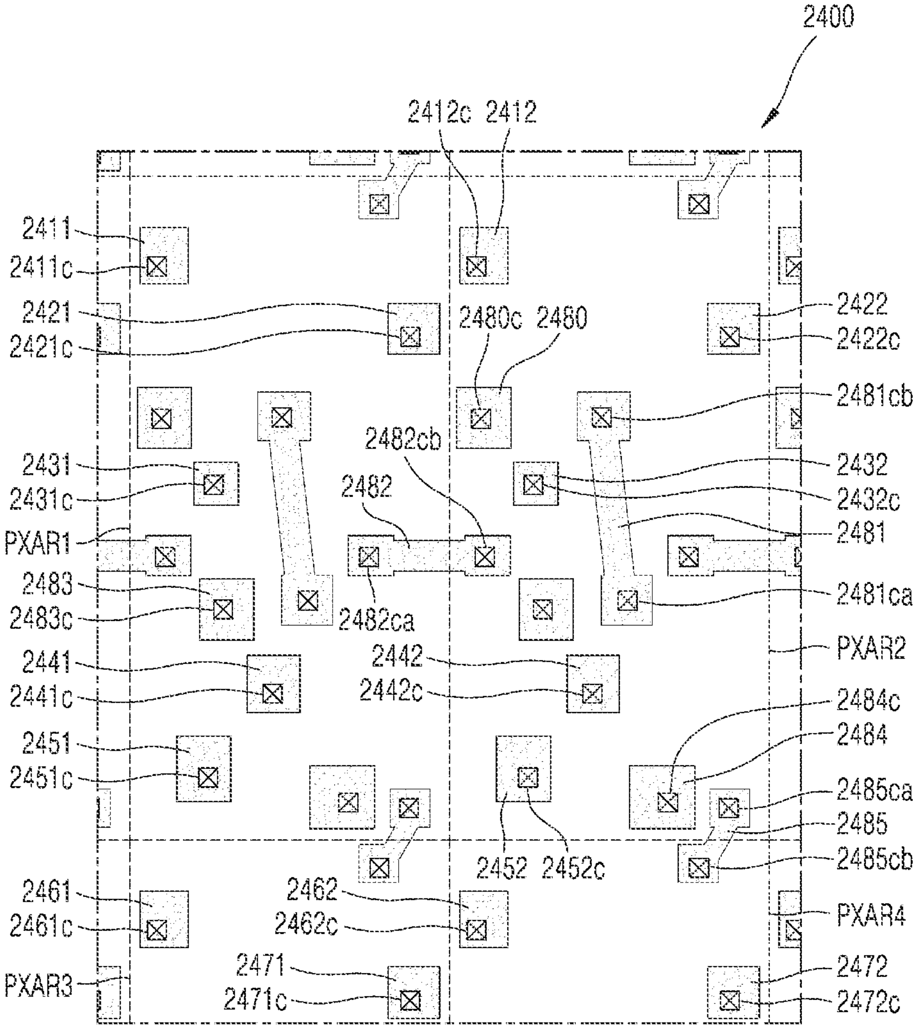

A third conductive layer 2400 of FIG. 21 may be arranged on the second conductive layer 2300. The third conductive layer 2400 may include a conductive material including at least one of Mo, Al, Cu, Ti, etc. and may include multiple layers or a single layer. The third conductive layer 2400 may have a multi-layered structure of Ti—Al—Ti.

The third conductive layer 2400 may include a plurality of conductive patterns. The conductive patterns of the third conductive layer 2400 may be spaced from one another. The third conductive layer 2400 may include first through eighteenth connection electrodes 2411, 2412, 2421, 2422, 2431, 2432, 2441, 2442, 2451, 2452, 2461, 2462, 2471, 2472, 2480, 2481, 2483, and 2484, a first bridge 2485, and a second bridge 2482. A set of fifteenth through eighteenth connection electrodes 2480, 2481, 2483, and 2484 may be arranged in each pixel area PXAR. A first bridge 2485 may be arranged in each pair of immediately neighboring pixel rows (or pixel area rows), and a second bridge 2482 may be arranged in each pair of immediately neighboring pixel columns (or pixel area columns).

Some of the conductive patterns of the third conductive layer 2400 may be connected to the semiconductor layer 2100, some may be connected to the first conductive layer 2200, and some may be connected to the second conductive layer 2300.

The first connection electrode 2411 may be connected to the first gate electrode 2211 through a first contact plug 2411*c*. The second connection electrode 2412 may be connected to the fifth gate electrode 2221 through a second contact plug 2412*c*. The third connection electrode 2421 may be connected to the first semiconductor pattern 2110 (for example, the drain of the gate initialization transistor T4) through a third contact plug 2421*c*. The fourth connection electrode 2422 may be connected to the second semiconductor pattern 2120 (for example, the drain of the gate initialization transistor T4) through a fourth contact plug 2422*c*. The fifth connection electrode 2431 may be connected to the second gate electrode 2213 through a fifth contact plug 2431*c*. The sixth connection electrode 2432 may be connected to the sixth gate electrode 2223 through a sixth contact plug 2432*c*. The seventh connection electrode 2441 may be connected to the fourth gate electrode 2217 through a seventh contact plug 2441*c*. The eighth connection electrode 2442 may be connected to the eighth gate electrode 2227 through an eighth contact plug 2442*c*. The ninth connection electrode 2451 may be connected to the first semiconductor pattern 2110 (for example, the source of the first emission control transistor T5) through a ninth contact plug 2451*c*. The tenth connection electrode 2452 may be connected to the second semiconductor pattern 2120 (for example, the source of the first emission control transistor T5) through a tenth contact plug 2452*c*. The eleventh connection electrode 2461 may be connected to the ninth gate electrode 2231 through an eleventh contact plug 2461*c*. The twelfth connection electrode 2462 may be connected to the tenth gate electrode 2241 through a twelfth contact plug 2462*c*. The thirteenth connection electrode 2471 may be connected to the third semiconductor pattern 2130 (for example, the drain of the anode initialization transistor T7) through a thirteenth contact plug 2471*c*. The fourteenth connection electrode 2472 may be connected to the fourth semiconductor pattern 2140 (for example, the drain of the anode initialization transistor T7) through a fourteenth contact plug 2472*c*.

The fifteenth connection electrode 2480 may be connected to the semiconductor layer 2100 (for example, the source of the scan transistor T2) through a fifteenth contact plug 2480*c*. The sixteenth connection electrode 2481 may be connected to the first conductive layer 2200 (for example, the third gate electrode 2215 or the seventh gate electrode 2225) through a 16-1st contact plug 2481$ca$ and to the semiconductor layer 2100 (for example, the drain of the compensation transistor T3) through a 16-2nd contact plug 2481$cb$. The seventeenth connection electrode 2483 may be connected to the second conductive layer 2300 (for example, the first electrode 2310 or the second electrode 2320) through a seventeenth contact plug 2483$c$. The eighteenth connection electrode 2484 may be connected to the semiconductor layer 2100 (for example, the drain of the second emission control transistor T6) through an eighteenth contact plug 2484$c$.

The first bridge 2485 may be connected to the semiconductor patterns adjacent to each other in the second direction (for example, the ±Y direction) through a 19-1st contact plug 2485$ca$ and a 19-2nd contact plug 2485$cb$. The semiconductor patterns adjacent to each other in the second direction may be connected to each other through the first bridge 2485.

The second bridge 2482 may be connected to the semiconductor patterns adjacent to each other in the first direction (for example, the ±X direction) through a 20-1st contact plug 2482$ca$ and a 20-2nd contact plug 2482$cb$. The semiconductor patterns adjacent to each other in the first direction may be connected to each other through the second bridge 2482.

Figure 22:
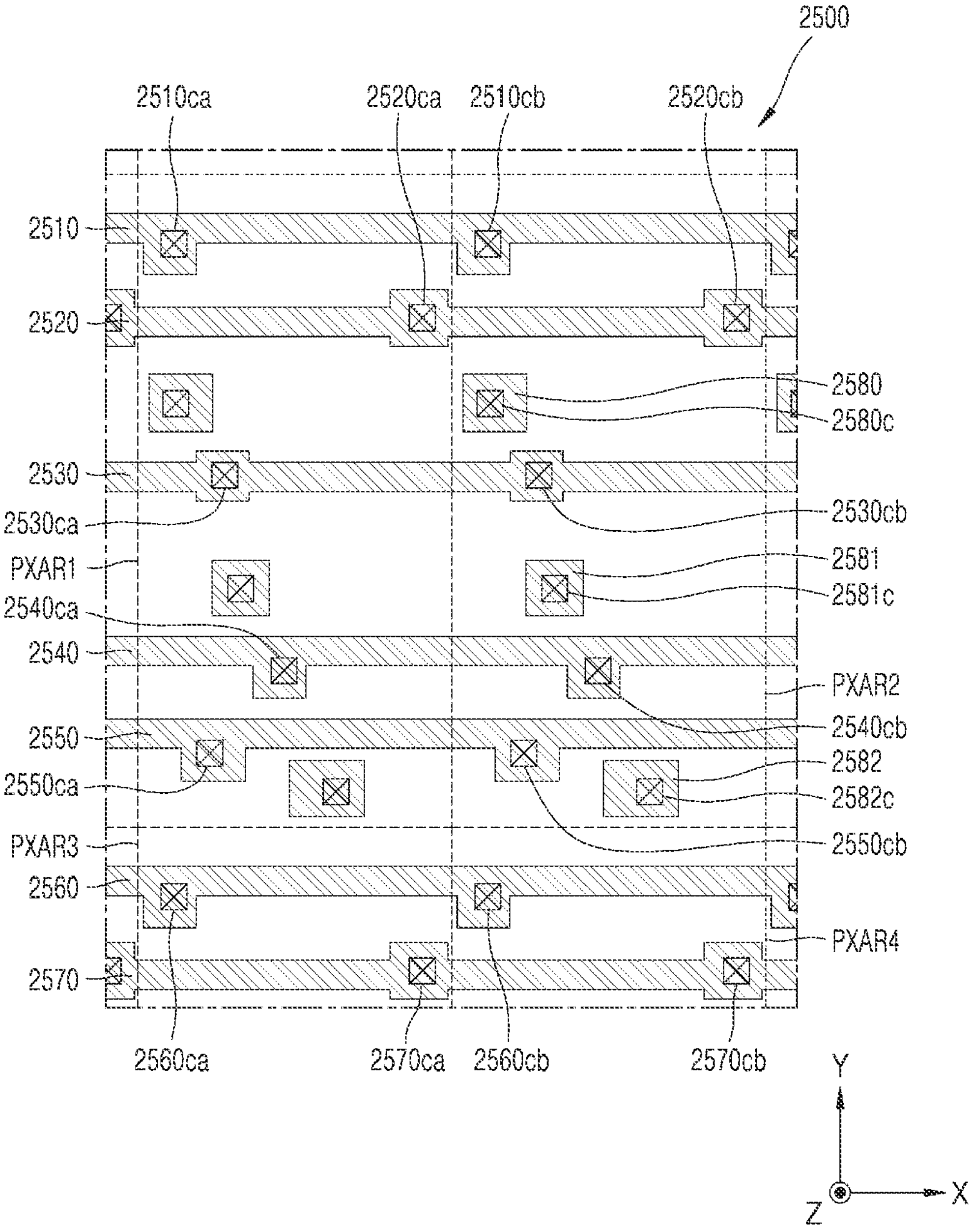

A fourth conductive layer 2500 of FIG. 22 may be arranged on the third conductive layer 2400. The fourth conductive layer 2500 may include a conductive material including at least one of Mo, Al, Cu, Ti, etc. and may include multiple layers or a single layer. The fourth conductive layer 2500 may have a multi-layered structure of Ti—Al—Ti.

The fourth conductive layer 2500 may include a plurality of conductive lines. Each of the conductive lines of the fourth conductive layer 2500 may extend in the first direction and may be connected to the pixel circuits PC arranged in the same row. The conductive lines of the fourth conductive layer 2500 may be connected to the conductive patterns of the third conductive layer 2400.

The fourth conductive layer 2500 may include the first through seventh conductive lines 2510 through 2570. The first conductive line 2510 may be connected to the first connection electrode 2411 through a 21-1st contact plug 2510$ca$ and to the second connection electrode 2412 through a 21-2nd contact plug 2510$cb$. The second conductive line 2520 may be connected to the third connection electrode 2421 through a 22-1st contact plug 2520$ca$ and to the fourth connection electrode 2422 through a 22-2nd contact plug 2520$cb$. The third conductive line 2530 may be connected to the fifth connection electrode 2431 through a 23-1st contact plug 2530$ca$ and to the sixth connection electrode 2432 through a 23-2nd contact plug 2530$cb$. The fourth conductive line 2540 may be connected to the seventh connection electrode 2441 through a 24-1st contact plug 2540$ca$ and to the eighth connection electrode 2442 through a 24-2nd contact plug 2540$cb$. The fifth conductive line 2550 may be connected to the ninth connection electrode 2451 through a 25-1st contact plug 2550$ca$ and to the tenth connection electrode 2452 through a 25-2nd contact plug 2550$cb$. The sixth conductive line 2560 may be connected to the eleventh connection electrode 2461 through a 26-1st contact plug 2560$ca$ and to the twelfth connection electrode 2462 through a 26-2nd contact plug 2560$cb$. The seventh conductive line 2570 may be connected to the thirteenth connection electrode 2471 through a 27-1st contact plug 2570$ca$ and to the fourteenth connection electrode 2472 through a 27-2nd contact plug 2570$cb$.

The first conductive line 2510 may correspond to the second scan line SL−1 of FIG. 3, the second conductive line 2520 and the seventh conductive line 2570 may correspond to the initialization voltage line VL of FIG. 3, the third conductive line 2530 may correspond to the first scan line SL of FIG. 3, the fourth conductive line 2540 may correspond to the emission control line EL of FIG. 3, the fifth conductive line 2550 may correspond to the driving voltage line PL of FIG. 3, and the sixth conductive line 2560 may correspond to the third scan line SL+1 of FIG. 3.

The fourth conductive layer 2500 may include a plurality of conductive patterns. The conductive patterns of the fourth conductive layer 2500 may be spaced from one another. The conductive patterns of the fourth conductive layer 2500 may be connected to the conductive patterns of the third conductive layer 2400.

The fourth conductive layer 2500 may include nineteenth through twenty-first connection electrodes 2580, 2581 and 2582. A set of nineteenth through twenty-first connection electrodes 2580, 2581, and 2582 may be arranged in each pixel area PXAR.

The nineteenth connection electrode 2580 may be connected to the fifteenth connection electrode 2480 through a twenty-eighth contact plug 2580$c$. The twentieth connection electrode 2581 may be connected to the seventeenth connection electrode 2483 through a twenty-ninth contact plug 2581$c$. The twenty-first connection electrode 2582 may be connected to the eighteenth connection electrode 2484 through a thirtieth contact plug 2582$c$.

Figure 23:
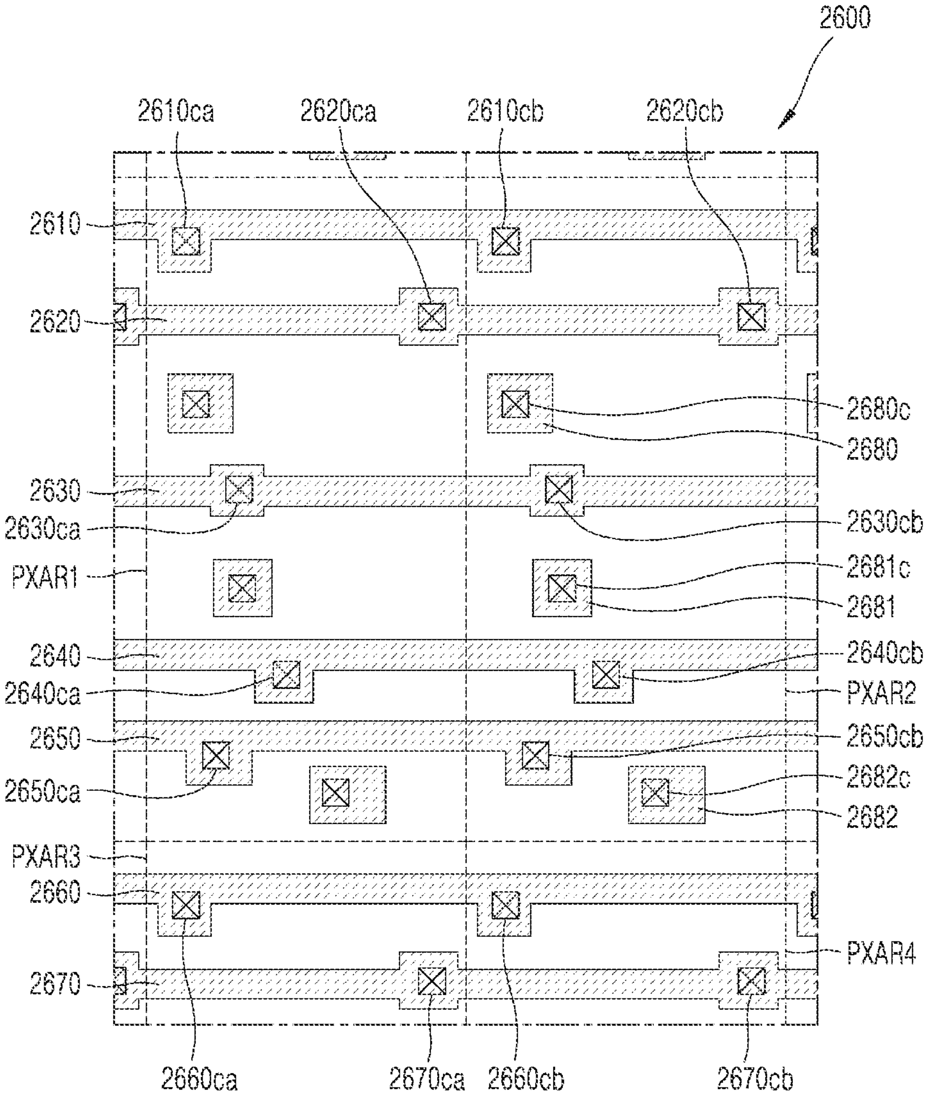

A fifth conductive layer 2600 of FIG. 23 may be arranged on the fourth conductive layer 2500. The fifth conductive layer 2600 may include a conductive material including at least one of Mo, Al, Cu, Ti, etc. and may include multiple layers or a single layer. The fifth conductive layer 2600 may have a multi-layered structure of Ti—Al—Ti.

The fifth conductive layer 2600 may include a plurality of conductive lines. Each of the conductive lines of the fifth conductive layer 2600 may extend in the first direction and may be connected to the pixel circuits PC arranged in the same row. The conductive lines of the fifth conductive layer 2600 may at least partially overlap the conductive lines of the fourth conductive layer 2500 and may be connected to the conductive lines of the fourth conductive layer 2500.

The fifth conductive layer 2600 may include the eighth through fourteenth conductive lines 2610 through 2570. The eighth conductive line 2610 may at least partially overlap the first conductive line 2510 and may be connected to the first conductive line 2510 through a 31-1st contact plug 2610$ca$ and a 31-2nd contact plug 2610$cb$. The ninth conductive line 2620 may at least partially overlap the second conductive line 2520 and may be connected to the second conductive line 2520 through a 32-1st contact plug 2620$ca$ and a 32-2nd contact plug 2620$cb$. The tenth conductive line 2630 may at least partially overlap the third conductive line 2530 and may be connected to the third conductive line 2530 through a 33-1st contact plug 2630$ca$ and a 33-2nd contact plug 2630$cb$. The eleventh conductive line 2640 may at least partially overlap the fourth conductive line 2540 and may be connected to the fourth conductive line 2540 through a 34-1st contact plug 2640$ca$ and a 34-2nd contact plug 2640$cb$. The twelfth conductive line 2650 may at least partially overlap the fifth conductive line 2550 and may be connected to the fifth conductive line 2550 through a 35-1st contact plug 2650$ca$ and a 35-2nd contact plug 2650$cb$. The thirteenth conductive line 2660 may at least partially overlap the sixth conductive line 2560 and may be connected to the sixth conductive line 2560 through a 36-1st contact plug

2660*ca* and a 36-2nd contact plug 2660*cb*. The fourteenth conductive line 2670 may at least partially overlap the seventh conductive line 2570 and may be connected to the seventh conductive line 2570 through a 37-1st contact plug 2670*ca* and a 37-2nd contact plug 2670*cb*.

The eighth conductive line 2610 may correspond to the second scan line SL−1 of FIG. 3, the ninth conductive line 2620 and the fourteenth conductive line 2670 may correspond to the initialization voltage line VL of FIG. 3, the tenth conductive line 2630 may correspond to the first scan line SL of FIG. 3, the eleventh conductive line 2640 may correspond to the emission control line EL of FIG. 3, the twelfth conductive line 2650 may correspond to the driving voltage line PL of FIG. 3, and the thirteenth conductive line 2660 may correspond to the third scan line SL+1 of FIG. 3.

The fifth conductive layer 2600 may include a plurality of conductive patterns. The conductive patterns of the fifth conductive layer 2600 may be spaced from one another. The conductive patterns of the fifth conductive layer 2600 may be connected to the conductive patterns of the fourth conductive layer 2500.

The fifth conductive layer 2600 may include twenty-second through twenty-fourth connection electrodes 2680, 2681 and 2682. A set of twenty-second through twenty-fourth connection electrodes 2680, 2681, and 2682 may be arranged in each pixel area PXAR.

The twenty-second connection electrode 2680 may be connected to the nineteenth connection electrode 2580 through a thirty-eighth contact plug 2680*c*. The twenty-third connection electrode 2681 may be connected to the twentieth connection electrode 2581 through a thirty-ninth contact plug 2681*c*. The twenty-fourth connection electrode 2682 may be connected to the twenty-first connection electrode 2582 through a fortieth contact plug 2682*c*.

Figure 24:
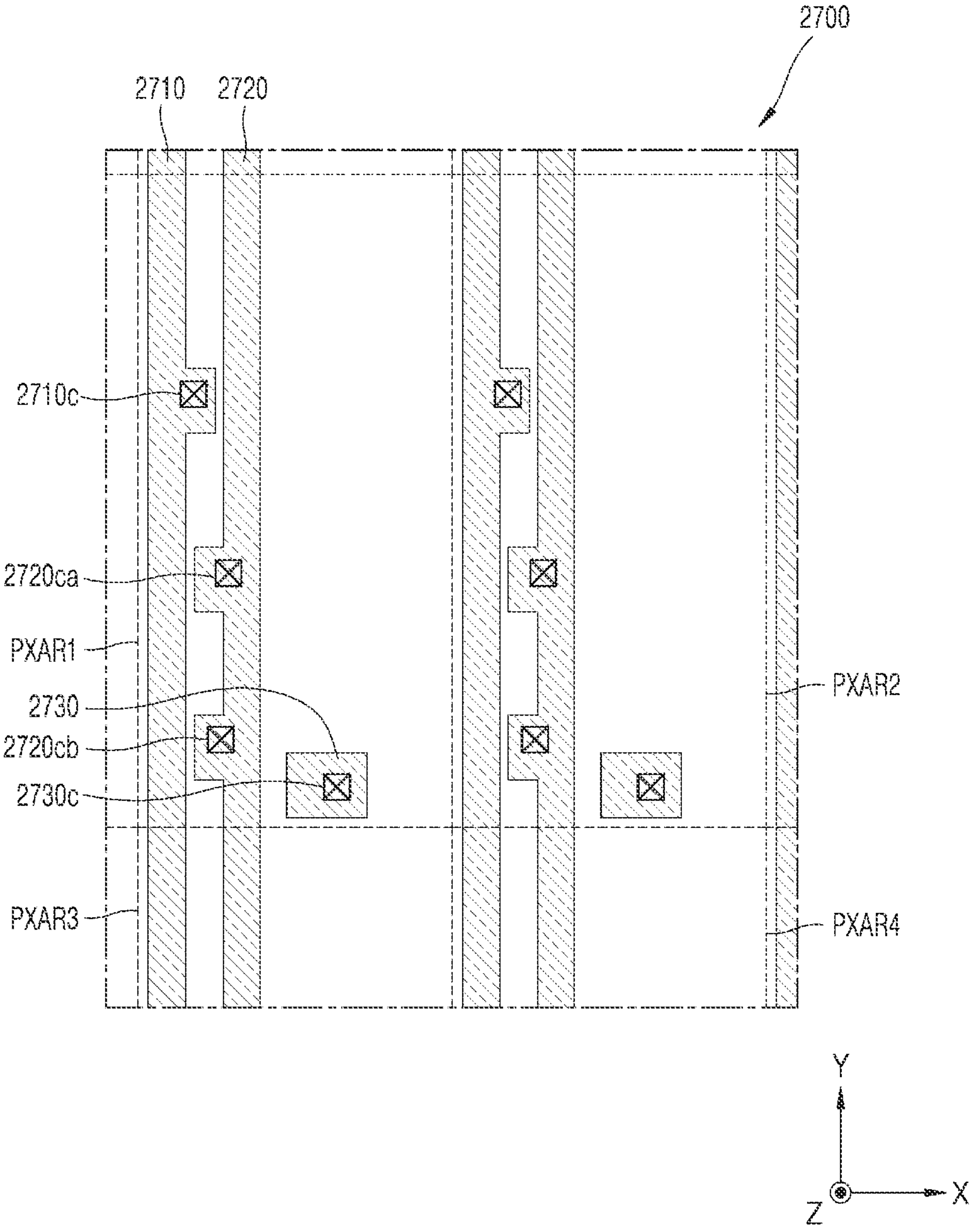

A sixth conductive layer 2700 of FIG. 24 may be arranged on the fifth conductive layer 2600. The sixth conductive layer 2700 may include a conductive material including at least one of Mo, Al, Cu, Ti, etc. and may include multiple layers or a single layer. The sixth conductive layer 2700 may have a multi-layered structure of Ti—Al—Ti.

The sixth conductive layer 2700 may include a plurality of conductive lines. Each of the conductive lines of the sixth conductive layer 2700 may extend in the second direction and may be connected to the pixel circuits PC arranged in the same column. The conductive lines of the sixth conductive layer 2700 may be connected to the fifth conductive layer 2600.

The sixth conductive layer 2700 may include a fifteenth conductive line 2710 and a sixteenth conductive line 2720. The fifteenth conductive line 2710 may be connected to the twenty-second connection electrode 2680 through a forty-first contact plug 2710*c*. The sixteenth conductive line 2720 may be connected to the twenty-third connection electrode 2681 through a 42-1st contact plug 2720*ca* and to the twelfth conductive line 2650 through a 42-2nd contact plug 2720*cb*.

The fifteenth conductive line 2710 may correspond to the data line DL of FIG. 3, and the sixteenth conductive line 2720 may correspond to the driving voltage line PL of FIG. 3. The driving voltage line PL may have a grid shape through the fifth conductive line 2550, the twelfth conductive line 2650, and the sixteenth conductive line 2720.

The sixth conductive layer 2700 may include a plurality of conductive patterns. The conductive patterns of the sixth conductive layer 2700 may be spaced from one another. The conductive patterns of the sixth conductive layer 2700 may be connected to the conductive patterns of the fifth conductive layer 2600.

The sixth conductive layer 2700 may include a twenty-fifth connection electrode 2730. The twenty-fifth connection electrode 2730 may be arranged in each pixel area PXAR. The twenty-fifth connection electrode 2730 may be connected to the twenty-fourth connection electrode 2682 through a forty-third contact plug 2730*c*. The twenty-fifth connection electrode 2730 may be connected to an anode (or a pixel electrode) of a display element; thus, the display element may be connected to the semiconductor layer 1100 (for example, the drain of the second emission control transistor T6) through the eighteenth connection electrode 2484, the twenty-fourth connection electrode 2682, and the twenty-fifth connection electrode 2730.

FIG. 25 is a schematic cross-sectional view of the display apparatus, taken along lines VIII-VIII', IX-IX', and X-X' of FIG. 17. FIG. 25 illustrates a modified embodiment of FIG. 13 and is different from FIG. 13 in structures related to insulating layers.

The first semiconductor pattern 2110, the third gate electrode 2215, the first gate electrode 2211, the fifth gate electrode 2221, the first electrode 2310, the first conductive line 2510, the eighth conductive line 2610, and the fifteenth conductive line 2710 illustrated in FIG. 25 may correspond to the first semiconductor pattern 1110, the third gate electrode 1215, the first gate electrode 1211, the fifth gate electrode 1221, the first electrode 1310, the first conductive line 1410, the eighth conductive line 1510, and the fifteenth conductive line 1610 of FIG. 13, respectively.

The third conductive layer 2400 (see FIG. 21) may be arranged on the interlayer insulating layer 117. FIG. 25 illustrates the first connection electrode 2411 and the second connection electrode 2412 of the third conductive layer 2400. The first connection electrode 2411 may be connected to the first gate electrode 2211 through the first contact plug 2411*c*. The second connection electrode 2412 may be connected to the fifth gate electrode 2221 through the second contact plug 2412*c*.

The sixth insulating layer IL6 may be arranged on the interlayer insulating layer 117 to cover the third conductive layer 2400. The sixth insulating layer IL6 may include a single layer or multiple layers including an organic material and may provide a flat upper surface. The sixth insulating layer IL6 may include BCB, polyimide, HMDSO, PMMA, or a general-purpose polymer, such as PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the above materials. The sixth insulating layer IL6 and the pixel separation layer PSL may be formed integrally with each other.

The fourth conductive layer 2500 (see FIG. 22) may be arranged on the sixth insulating layer IL6. FIG. 25 illustrates the first conductive line 2510 of the fourth conductive layer 2500. The first conductive line 2510 may be connected to the first connection electrode 2411 through the 21-1st contact plug 2510*ca* and to the second connection electrode 2421 through the 21-2nd contact plug 2510*cb*.

The fifth conductive layer 2600 (see FIG. 23) may be arranged on the second insulating layer IL2. FIG. 25 illustrates the eighth conductive line 2610 of the fifth conductive layer 2600. The eighth conductive line 2610 may be connected to the first conductive line 2510 through the 31-1st contact plug 2610*ca* and the 31-2nd contact plug 2610*cb*.

Each of the first conductive line 2510 and the eighth conductive line 2610 may at least partially overlap the pixel separation layer PSL. The first conductive line 2510 and the eighth conductive line 2610 may at least partially overlap each other. Because the first conductive line 2510 and the eighth conductive line 2610 may be connected to each other, the same signal may be applied to the first conductive line 2510 and the eighth conductive line 2610. The second scan signal Sn−1 of FIG. 3 may be applied to the first conductive line 2510 and the eighth conductive line 2610.

Figure 26:
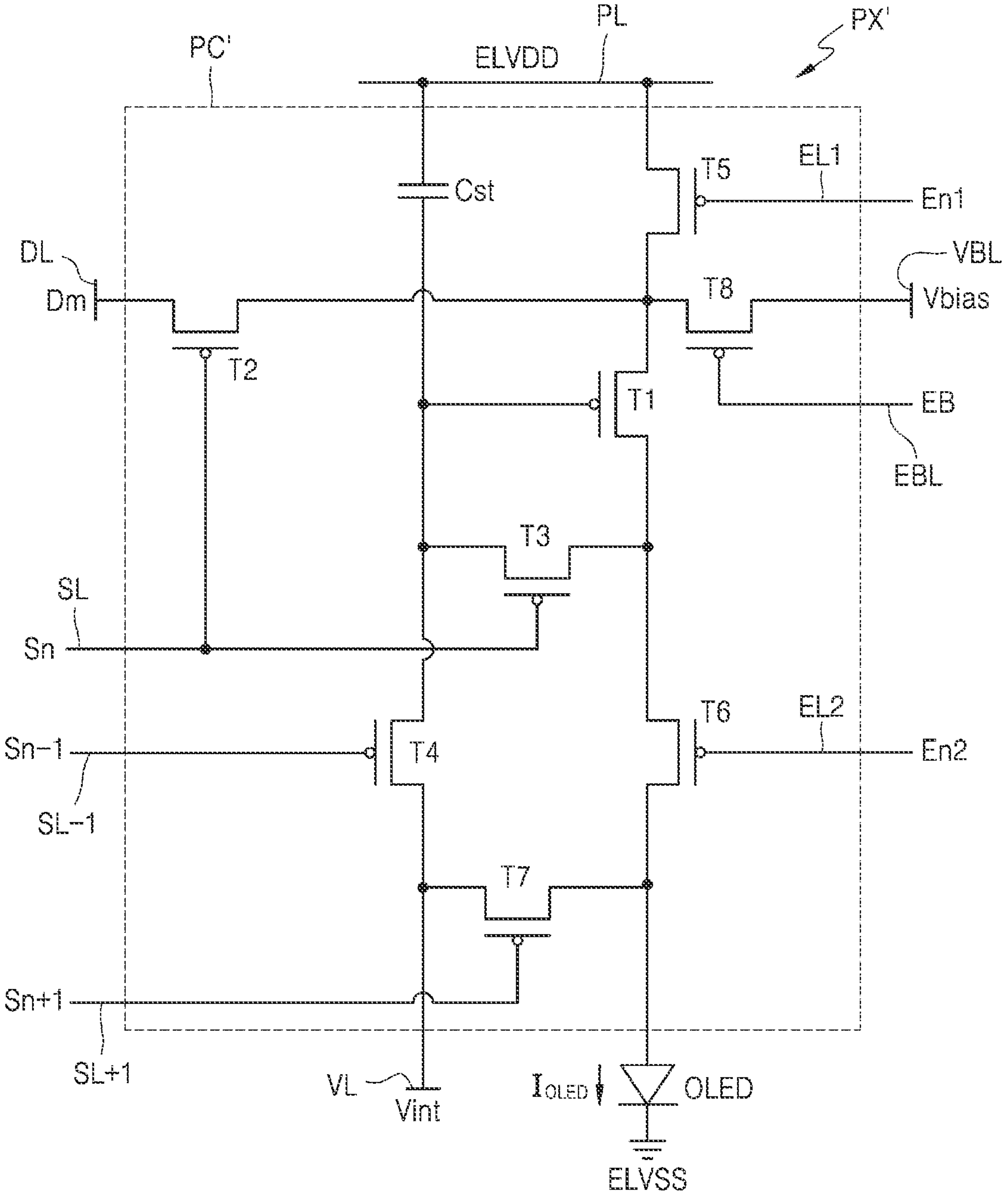
FIG. 26 is an equivalent circuit diagram of a pixel included in the display apparatus of FIG. 1 according to an embodiment.

FIG. 26 is an equivalent circuit diagram of a pixel included in the display apparatus of FIG. 1. FIG. 26 illustrates a modified embodiment of FIG. 3 and is different from FIG. 3 in structures related to transistors.

Referring to FIG. 26, one pixel PX' may include a pixel circuit PC' and an organic light-emitting diode OLED electrically connected to the pixel circuit PC'. Unlike the pixel circuit PC of FIG. 3, the pixel circuit PC' of FIG. 26 may include an eighth transistor T8.

The eighth transistor T8 may apply a bias voltage Vbias to the source of the driving transistor T1 in response to a control signal EB. The eighth transistor T8 may have a gate connected to a control line EBL, a source (or a drain) connected to the source of the driving transistor T1, and a drain (or a source) connected to a bias voltage line VBL.

The first emission control transistor T5 and the second emission control transistor T6 may be connected to different emission control lines from each other. The gate of the first emission control transistor T5 may be connected to a first emission control line EL1, and the first emission control transistor T5 may operate in response to a first emission control signal En1. The gate of the second emission control transistor T5 may be connected to a second emission control line EL2, and the second emission control transistor T6 may operate in response to a second emission control signal En2.

Figure 27:
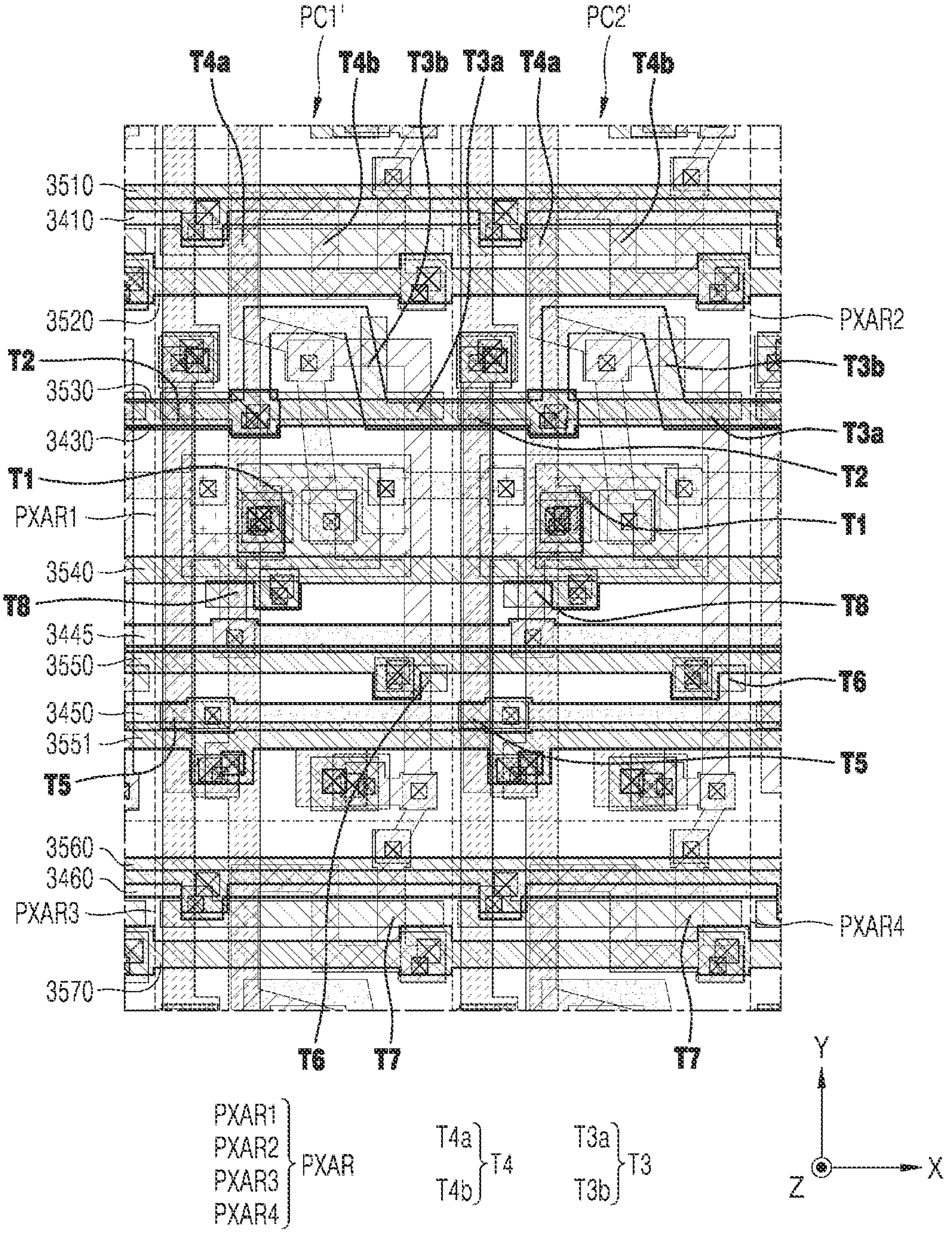
FIG. 27 is a schematic layout diagram of locations of transistors, capacitors, etc. in pixel circuits included in the display apparatus of FIG. 1 according to an embodiment.

FIG. 27 is a schematic layout diagram illustrating locations of transistors, capacitors, etc. in pixel circuits included in the display apparatus of FIG. 1. FIGS. 28 through 33 are schematic layout diagrams illustrating layers of components of the transistors, the capacitors, etc. illustrated in FIG. 27.

Referring to FIG. 27, the display apparatus may include first through fifth conductive lines 3410, 3430, 3445, 3450, and 3460, and sixth through thirteenth conductive lines 3510, 3520, 3530, 3540, 3550, 3551, 3560, and 3570 extending in a first direction (for example, a ±X direction) and connected to a first pixel circuit PC1' and a second pixel circuit PC2'.

The first through fifth conductive lines 3410, 3430, 3445, 3450, and 3460 and the sixth through thirteenth conductive lines 3510, 3520, 3530, 3540, 3550, 3551, 3560, and 3570 may belong to different conductive layers. At least one of the first through fifth conductive lines 3410, 3430, 3445, 3450, and 3460 and at least one of the sixth through thirteenth conductive lines 3510, 3520, 3530, 3540, 3550, 3551, 3560, and 3570 may at least partially overlap each other.

For example, as illustrated in FIG. 27, the first conductive line 3410 and the sixth conductive line 3510 may at least partially overlap each other. The second conductive line 3430 and the eighth conductive line 3530 may at least partially overlap each other. The third conductive line 3445 and the tenth conductive line 3550 may at least partially overlap each other. The fourth conductive line 3450 and the eleventh conductive line 3551 may at least partially overlap each other. The fifth conductive line 3460 and the twelfth conductive line 3560 may at least partially overlap each other.

FIG. 27 illustrates that conductive lines at least partially overlap each other. According to an embodiment, more conductive lines may be arranged, and each of the illustrated conductive lines may at least partially overlap a conductive line in an immediately neighboring conductive layer. According to an embodiment, one or more of the illustrated conductive lines may be optional, and one or more of the illustrated conductive lines may not overlap any conductive line in an immediately neighboring conductive layer.

The same signal may be applied to two conductive lines at least partially overlapping each other and electrically connected to each other. The first conductive line 3410 and the sixth conductive line 3510 may be connected to each other through at least one contact plug; thus, the same signal (for example, the second scan signal Sn−1 of FIG. 26) may be applied to the first conductive line 3410 and the sixth conductive line 3510.

Different signals may be respectively applied to two conductive lines at least partially overlapping each other and electrically isolated from each other. For example, a first signal (The bias voltage Vbias of FIG. 26) may be applied to the third conductive line 3445, and a second signal (for example, the second emission control signal En2 of FIG. 26) may be applied to the tenth conductive line 3550.

Referring to FIGS. 11 and 12, the first insulating layer IL1 (including an inorganic material) may have the opening OP, and the pixel separation layer PSL (including an organic material) may be arranged in the opening OP. The opening OP of the first insulating layer IL1 may correspond to boundaries between the pixel areas PXAR, and the pixel separation layer PSL may be arranged on the boundaries between the pixel areas PXAR. The first conductive line 3410 and the sixth conductive line 3510 may extend in the first direction and may overlap pixel areas PXAR; thus, the first conductive line 3410 and the sixth conductive line 3510 may at least partially overlap the pixel separation layer PSL. The description related to the first conductive line 3410 and the sixth conductive line 3510 may be analogously applied to the other conductive lines.

The pixel circuit PC' illustrated in FIG. 26 may be driven at a high speed through the eight transistors. Eight signal lines may be required for each pixel row in order to drive pixels that each includes a pixel circuit PC'. The number of signal lines may increase for every increase of one transistor. Because the eight signal lines are implemented in different conductive layers, the number of pixel circuits per unit area may be maintained or increased. Thus, a display apparatus may display images with a high resolution and with satisfactory performance.

Components of the transistors, the capacitors, etc. illustrated in FIG. 27 and the associated layers are described with reference to FIGS. 25 through 33.

Figure 28:
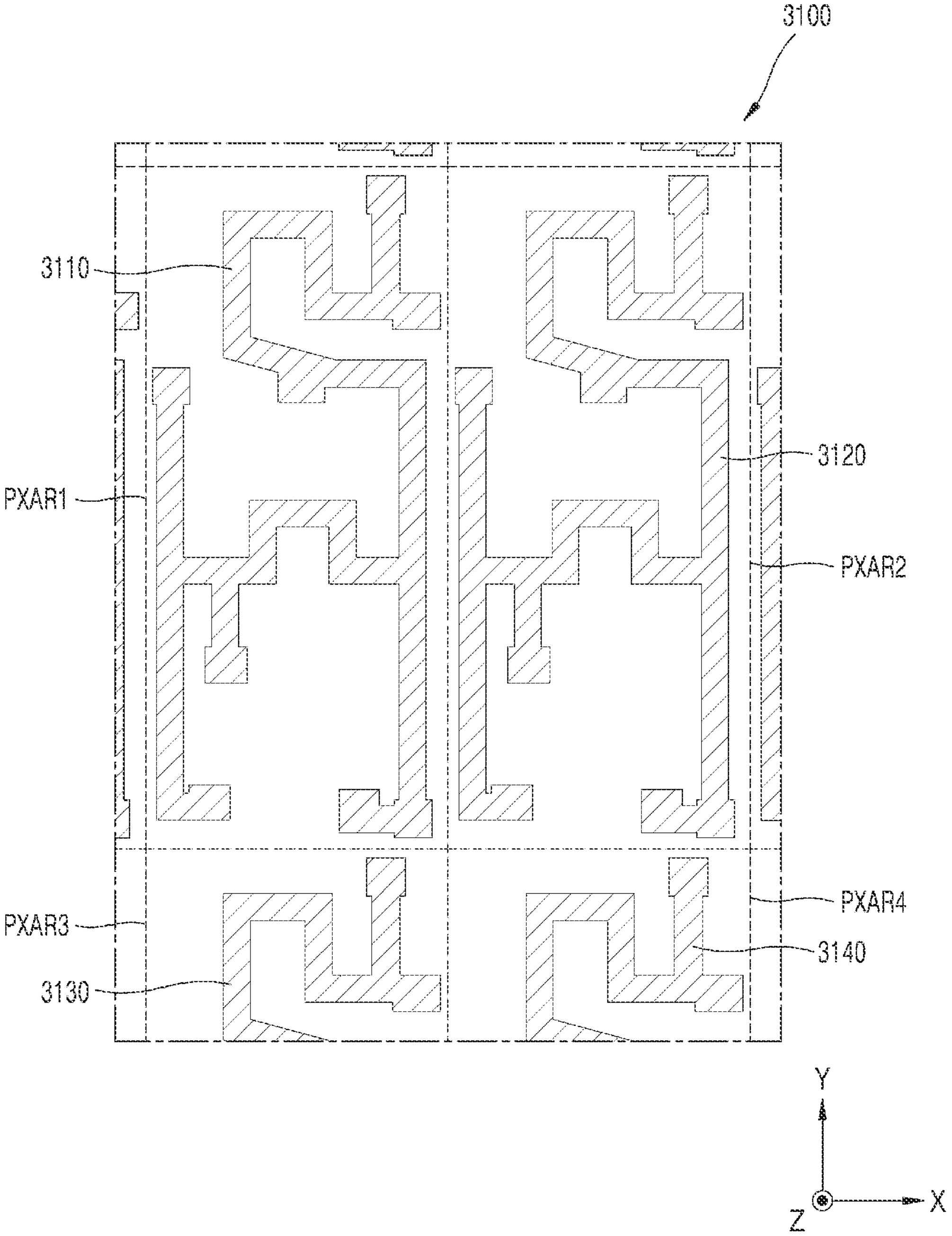
FIG. 28, FIG. 29, FIG. 30, FIG. 31, FIG. 32, and FIG. 33 are schematic layout diagrams of components of the transistors, the capacitors, etc. illustrated in FIG. 27 in different layers according to an embodiment.

A semiconductor layer 3100 illustrated in FIG. 28 may be arranged on the substrate 100 (see FIG. 25). The description about the semiconductor layer 1100 of FIG. 5 may be likewise applied to the semiconductor layer 3100 of FIG. 28. The semiconductor layer 3100 may include first through fourth semiconductor patterns 3110, 3120, 3130, and 3140 that are spaced from each other.

Figure 29:
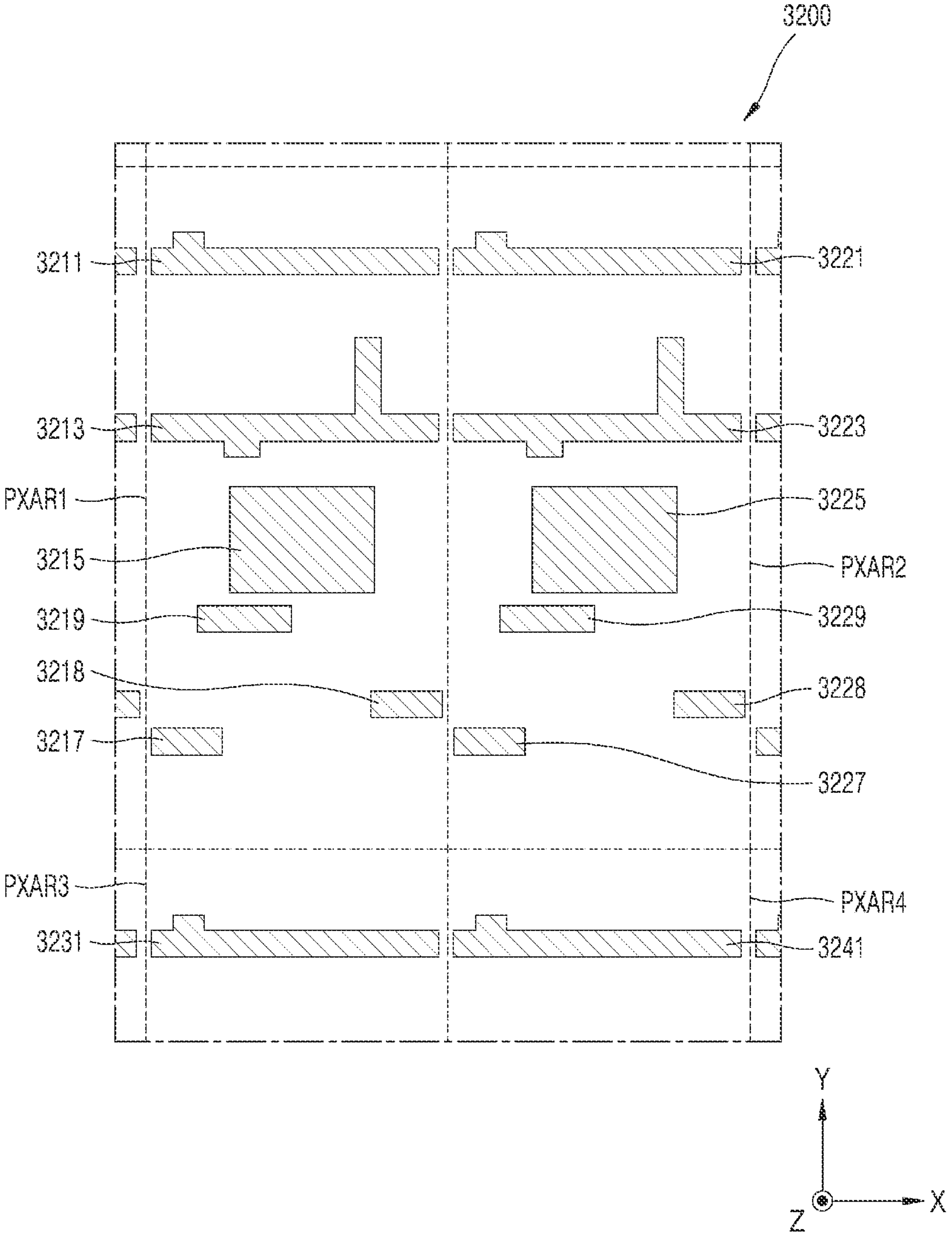

A first conductive layer 3200 of FIG. 29 may be arranged on the conductive layer 3100. The description about the first conductive layer 1200 of FIG. 6 may be likewise applied to the first conductive layer 3200 of FIG. 29. The first conductive layer 3200 may include first through fourteenth gate electrodes 3211, 3213, 3215, 3217, 3218, 3219, 3221, 3223, 3225, 3227, 3228, 3229, 3231, and 3241. The first through sixth gate electrodes 3211, 3213, 3215, 3217, 3218, and 3219 may be arranged in the first pixel area PXAR1, the seventh through twelfth gate electrodes 3221, 3223, 3225, 3227, 3228, and 3229 may be arranged in the second pixel area PXAR2, the thirteenth gate electrode 3231 may be arranged in the third pixel area PXAR3, and the fourteenth gate electrode 3241 may be arranged in the fourth pixel area PXAR4.

The first gate electrode 3211 and the seventh gate electrode 3221 may correspond to a second scan line SL−1 of FIG. 26, the second gate electrode 3213 and the eighth gate electrode 3223 may correspond to a first scan line SL of FIG. 26, the fourth gate electrode 3217 and the tenth gate electrode 3227 may correspond to a first emission control line ELI of FIG. 26, the fifth gate electrode 3218 and the eleventh gate electrode 3228 may correspond to a second emission control line EL2 of FIG. 26, the sixth gate electrode 3219 and the twelfth gate electrode 3229 may correspond to a control line EBL of FIG. 26, and the thirteenth gate electrode 3231 and the fourteenth gate electrode 3241 may correspond to a third scan line SL+1 of FIG. 26.

Portions of the first gate electrode 3211 and the seventh gate electrode 3221 may overlap the semiconductor layer 3100 and may correspond to the gate of the gate initialization transistor T4. Portions of the second gate electrode 3213 and the eighth gate electrode 3223 may overlap the semiconductor layer 3100 and may correspond to the gate of the scan transistor T2 and the gate of the compensation transistor T3. Portions of the third gate electrode 3215 and the ninth gate electrode 3225 may overlap the semiconductor layer 3100 and may correspond to the gate of the driving transistor T1. Portions of the fourth gate electrode 3217 and the tenth gate electrode 3227 may overlap the semiconductor layer 3100 and may correspond to the gate of the first emission control transistor T5. Portions of the fifth gate electrode 3218 and the eleventh gate electrode 3228 may overlap the semiconductor layer 3100 and may correspond to the gate of the second emission control transistor T6. Portions of the sixth gate electrode 3219 and the twelfth gate electrode 3219 may overlap the semiconductor layer 3100 and may correspond to the gate of the eighth transistor T8. Portions of the thirteenth gate electrode 3231 and the fourteenth gate electrode 3241 may overlap the semiconductor layer 3100 and may correspond to the gate of the anode initialization transistor T7.

Figure 30:
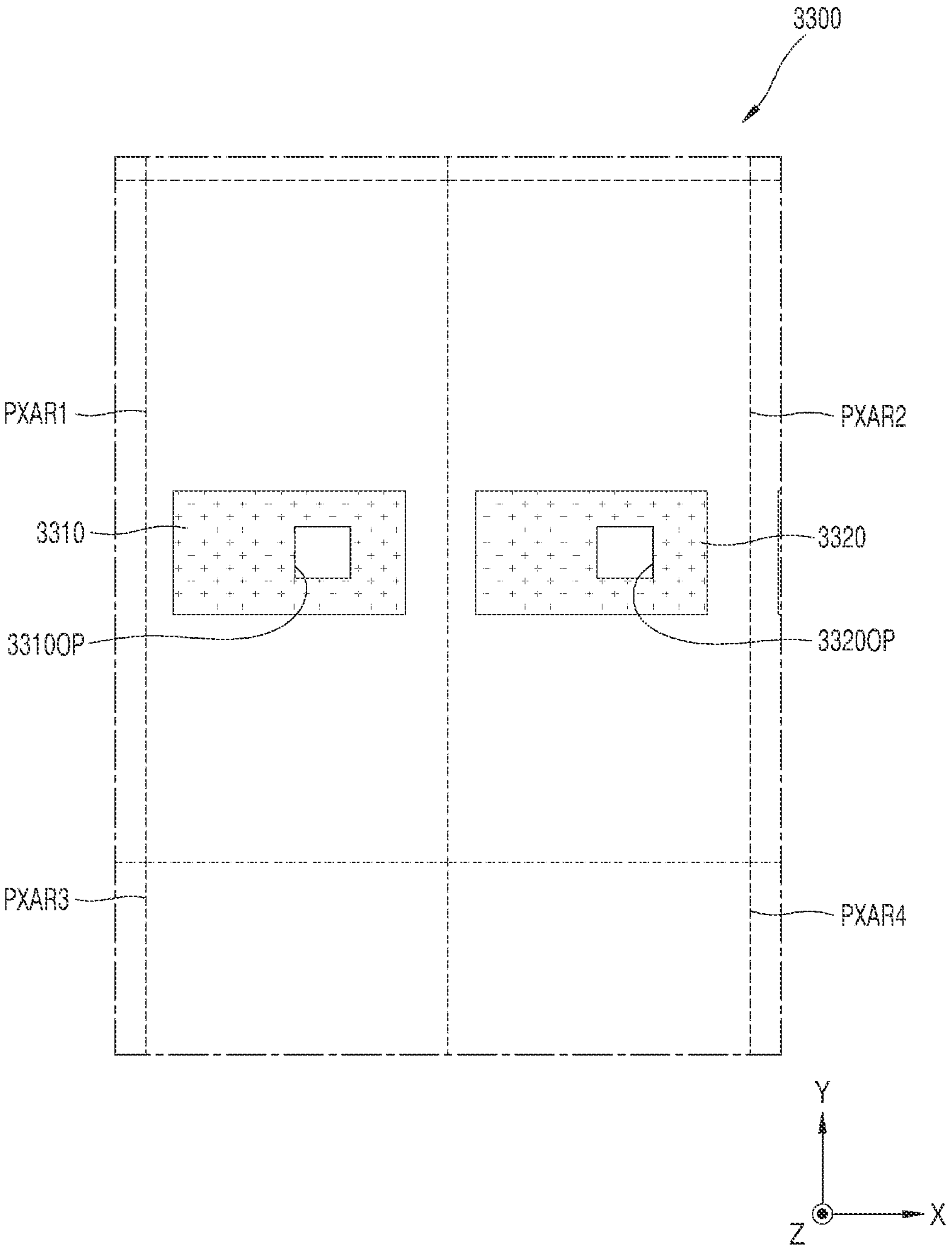

A second conductive layer 3300 of FIG. 30 may be arranged on the first conductive layer 3200. The description about the second conductive layer 1300 of FIG. 7 may be likewise applied to the second conductive layer 3300 of FIG. 30. The second conductive layer 3300 may include a first electrode 3310 arranged in the first pixel area PXAR1 and a second electrode 3320 arranged in the second pixel area PXAR2. Openings 33100P and 33200P may be formed in the first electrode 3310 and the second electrode 3320, respectively.

Figure 31:
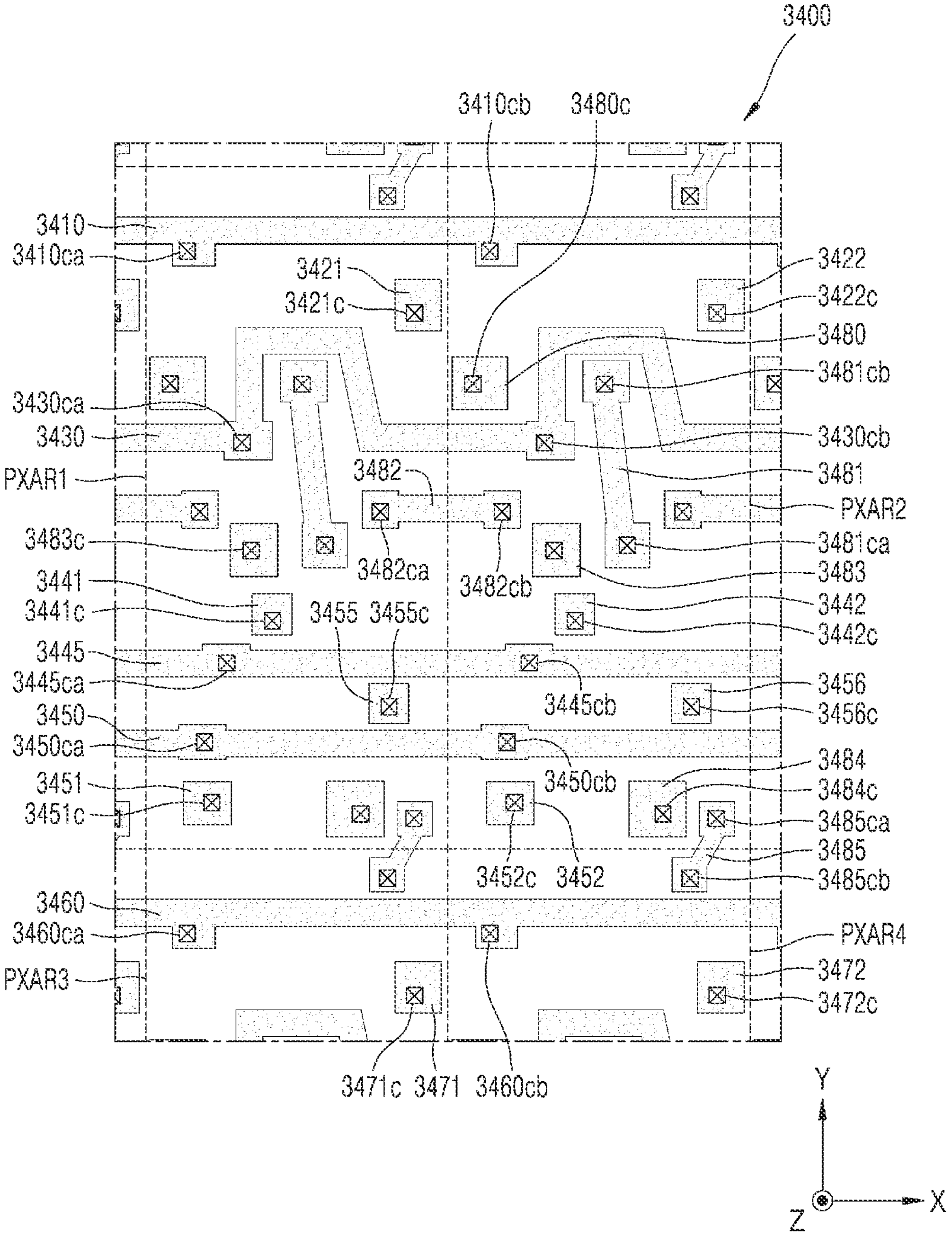

A third conductive layer 3400 of FIG. 31 may be arranged on the second conductive layer 3300. The third conductive layer 3400 may include a conductive material including at least one of Mo, Al, Cu, Ti, etc. and may include multiple layers or a single layer. The third conductive layer 3400 may have a multi-layered structure of Ti—Al—Ti.

The third conductive layer 3400 may include a plurality of conductive lines. Each of the conductive lines of the third conductive layer 3400 may extend in the first direction and may be connected to the pixel circuits PC' arranged in the same row. Some of the conductive lines of the third conductive layer 3400 may be connected to the semiconductor layer 3100 and the others may be connected to the first conductive layer 3200.

The third conductive layer 3400 may include the first through fifth conductive lines 3410, 3430, 3445, 3450, and 3460. The first conductive line 3410 may be connected to the first gate electrode 3211 through a 1-1st contact plug 3410*ca* and to the seventh gate electrode 3221 through a 1-2nd contact plug 3410*cb*. The second conductive line 3430 may be connected to the second gate electrode 3213 through a 2-1st contact plug 3430*ca* and to the eighth gate electrode 3223 through a 2-2nd contact plug 3430*cb*. The third conductive line 3445 may be connected to the first semiconductor pattern 3110 (for example, the source or the drain of the eighth transistor T8) through a 3-1st contact plug 3445*ca* and to the second semiconductor pattern 3120 (for example, the source or the drain of the eighth transistor T8) through a 3-2nd contact plug 3445*cb*. The fourth conductive line 3450 may be connected to the fourth gate electrode 3217 through a 4-1st contact plug 3450*ca* and to the tenth gate electrode 3227 through a 4-2nd contact plug 3450*cb*. The fifth conductive line 3460 may be connected to the thirteenth gate electrode 3231 through a 5-1st contact plug 3460*ca* and to the fourteenth gate electrode 3241 through a 5-2nd contact plug 3460*cb*.

The first conductive line 3410 may correspond to the second scan line SL−1 of FIG. 26, the second conductive line 3430 may correspond to the first scan line SL of FIG. 26, the third conductive line 3445 may correspond to a bias voltage line VBL of FIG. 26, the fourth conductive line 3450 may correspond to the first emission control line EL1 of FIG. 26, and the fifth conductive line 3460 may correspond to the third scan line SL+1 of FIG. 26.

The third conductive layer 3400 may include a plurality of conductive patterns. The conductive patterns of the third conductive layer 3400 may be spaced from one another. The third conductive layer 3400 may include first through fourteenth connection electrodes 3421, 3422, 3441, 3442, 3451, 3452, 3455, 3456, 3471, 3472, 3480, 3481, 3483, and 3484, a first bridge 3485, and a second bridge 3482. A set of eleventh through fourteenth connection electrodes 3480, 3481, 3484, and 3484 may be arranged in each pixel area PXAR. The first bridge 3485 may be arranged in each pair of pixel rows (or pixel area rows), and the second bridge 3482 may be arranged in each pair of pixel columns (or pixel area columns).

Some of the conductive patterns of the third conductive layer 3400 may be connected to the semiconductor layer 3100, some may be connected to the first conductive layer 3200, and some may be connected to the second conductive layer 3300.

The first connection electrode 3421 may be connected to the first semiconductor pattern 3110 (for example, the drain of the gate initialization transistor T4) through a sixth contact plug 3421*c*. The second connection electrode 3422 may be connected to the second semiconductor pattern 3120 (for example, the drain of the gate initialization transistor T4) through a seventh contact plug 3422*c*. The third connection electrode 3441 may be connected to the sixth gate electrode 3219 through an eighth contact plug 3441*c*. The fourth connection electrode 3442 may be connected to the twelfth gate electrode 3229 through a ninth contact plug 3442*c*. The fifth connection electrode 3451 may be connected to the first semiconductor pattern 3110 (for example, the source of the first emission control transistor T5) through a tenth contact plug 3451*c*. The sixth connection electrode 3452 may be connected to the second semiconductor pattern 3120 (for example, the source of the first emission control transistor T5) through an eleventh contact plug 3452*c*. The seventh connection electrode 3455 may be connected to the fifth gate electrode 3218 through a twelfth contact plug 3455*c*. The eighth connection electrode 3456 may be connected to the eleventh gate electrode 3228 through a thirteenth contact plug 3456*c*. The ninth connection electrode 3471 may be connected to the third semiconductor pattern 3130 (for example, the drain of the anode initialization transistor T7) through a fourteenth contact plug 3471*c*. The tenth connection electrode 3472 may be connected to the fourth semiconductor pattern 3140 (for example, the drain of the anode initialization transistor T7) through a fifteenth contact plug 3472*c*.

The eleventh connection electrode 3480 may be connected to the semiconductor layer 3100 (for example, the source of the scan transistor T2) through a sixteenth contact plug 3480*c*. The twelfth connection electrode 3481 may be connected to the first conductive layer 3200 (for example, the third gate electrode 3215 or the ninth gate electrode 3225) through a 17-1st contact plug 3481*ca* and to the semiconductor layer 3100 (for example, the drain of the compensation transistor T3) through a 17-2nd contact plug 3481*cb*. The thirteenth connection electrode 3483 may be connected to the second conductive layer 3300 (for example, the first electrode 3310 or the second electrode 3320) through an eighteenth contact plug 3483*c*. The fourteenth connection electrode 3484 may be connected to the semiconductor layer 3100 (for example, the drain of the second emission control transistor T6) through a nineteenth contact plug 3484*c*.

The first bridge 3485 may be connected to two semiconductor patterns adjacent to each other in the second direction (for example, the ±Y direction), through a 20-1st contact plug 3485*ca* and a 20-2nd contact plug 3485*cb*. The semiconductor patterns adjacent to each other in the second direction may be connected to each other through the first bridge 3485.

The second bridge 3482 may be connected to two semiconductor patterns adjacent to each other in the first direction (for example, the ±X direction), through a 21-1st contact plug 3482*ca* and a 21-2nd contact plug 3482*cb*. The semiconductor patterns adjacent to each other in the first direction may be connected to each other through the second bridge 3482.

Figure 32:
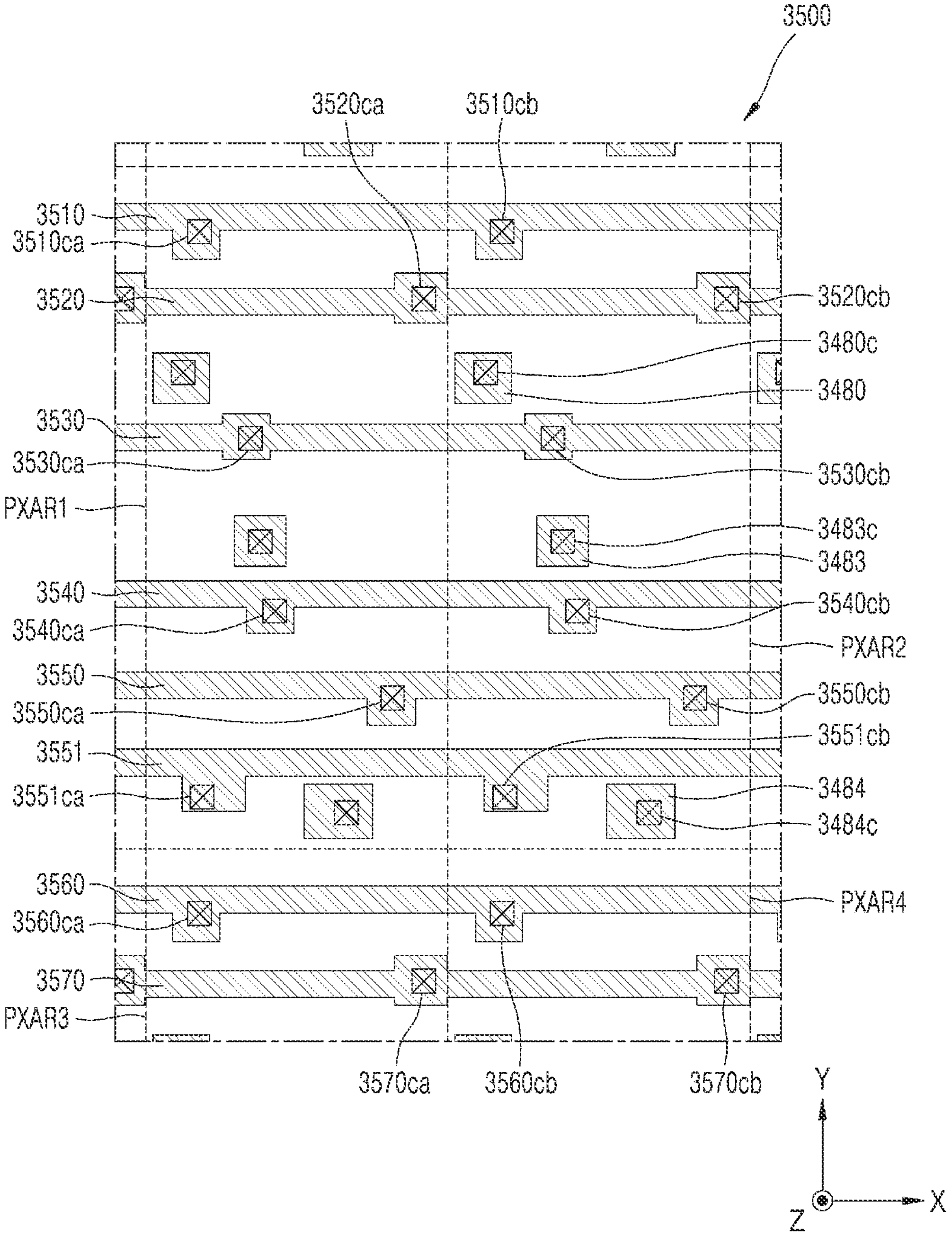

A fourth conductive layer 3500 of FIG. 32 may be arranged on the third conductive layer 3400. The fourth conductive layer 3500 may include a conductive material including at least one of Mo, Al, Cu, Ti, etc. and may include multiple layers or a single layer. The fourth conductive layer 3500 may have a multi-layered structure of Ti—Al—Ti.

The fourth conductive layer 3500 may include a plurality of conductive lines. Each of the conductive lines of the fourth conductive layer 3500 may extend in the first direction and may be connected to the pixel circuits PC' arranged in the same row. At least one of the conductive lines of the fourth conductive layer 3500 may at least partially overlap one or more of the conductive lines of the third conductive layer 3400. The conductive lines of the fourth conductive layer 3500 may be connected to the conductive lines or the conductive patterns of the third conductive layer 3400.

The fourth conductive layer 3500 may include the sixth through thirteenth conductive lines 3510, 3520, 3530, 3540, 3550, 3551, 3560, and 3570. The sixth conductive line 3510 may at least partially overlap the first conductive line 3410 and may be connected to the first conductive line 3410 through a 22-1st contact plug 3510*ca* and a 22-2nd contact plug 3510*cb*. The seventh conductive line 3520 may be connected to the first connection electrode 3421 through a 23-1st contact plug 3520*ca* and to the second connection electrode 3422 through a 23-2nd contact plug 3520*cb*. The eighth conductive line 3530 may at least partially overlap the second conductive line 3430 and may be connected to the second conductive line 3430 through a 24-1st contact plug 3530*ca* and a 24-2nd contact plug 3530*cb*. The ninth conductive line 3540 may be connected to the third connection electrode 3441 through a 25-1st contact plug 3540*ca* and to the fourth connection electrode 3442 through a 25-2nd contact plug 3540*cb*. The tenth conductive line 3550 may at least partially overlap the third conductive line 3445 and may be connected to the seventh connection electrode 3455 through a 26-1st contact plug 3550*ca* and to the eighth connection electrode 3456 through a 26-2nd contact plug 3550*cb*. The eleventh conductive line 3551 may at least partially overlap the fourth conductive line 3450 and may be connected to the fifth connection electrode 3451 through a 27-1st contact plug 3551*ca* and to the sixth connection electrode 3452 through a 27-2nd contact plug 3551*cb*. The twelfth conductive line 3560 may at least partially overlap the fifth conductive line 3460 and may be connected to the fifth conductive line 3460 through a 28-1st contact plug 3560*ca* and a 28-2nd contact plug 3560*cb*. The thirteenth conductive line 3570 may be connected to the ninth connection electrode 3471 through a 29-1st contact plug 3570*ca* and to the tenth connection electrode 3472 through a 29-2nd contact plug 3570*cb*.

The sixth conductive line 3510 may correspond to the second scan line SL−1 of FIG. 26, the seventh conductive line 3520 and the thirteenth conductive line 3570 may correspond to an initialization voltage line VL of FIG. 26, the eighth conductive line 3530 may correspond to the first scan line SL of FIG. 26, the ninth conductive line 3540 may correspond to the control line EBL of FIG. 26, the tenth conductive line 3550 may correspond to the second emission control line EL2 of FIG. 26, the eleventh conductive line 3551 may correspond to a driving voltage line PL of FIG. 26, and the twelfth conductive line 3560 may correspond to the third scan line SL+1 of FIG. 26.

The fourth conductive layer 3500 may include a plurality of conductive patterns. The conductive patterns of the fourth conductive layer 3500 may be spaced from one another. The conductive patterns of the fourth conductive layer 3500 may be connected to the conductive patterns of the third conductive layer 3400.

The fourth conductive layer 3500 may include fifteenth through seventeenth connection electrodes 3580, 3583, and 3584. A set of fifteenth through seventeenth connection electrodes 3580, 3583, and 3584 may be arranged in each pixel area PXAR.

The fifteenth connection electrode 3580 may be connected to the eleventh connection electrode 3480 through a thirtieth contact plug 3580*c*. The sixteenth connection electrode 3583 may be connected to the thirteenth connection electrode 3483 through a thirty-first contact plug 3583*c*. The seventeenth connection electrode 3584 may be connected to the fourteenth connection electrode 3484 through a thirty-second contact plug 3584*c*.

Figure 33:
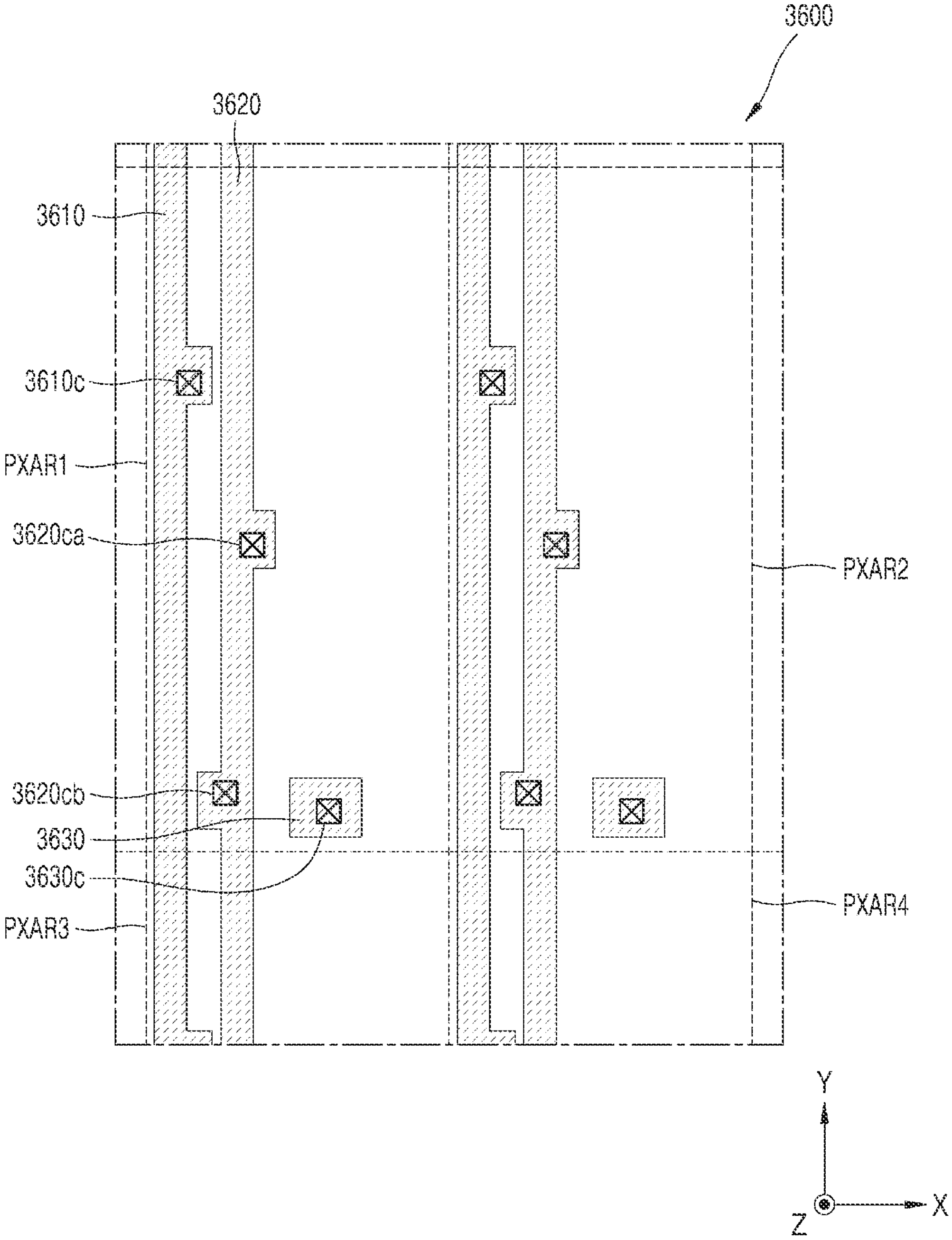

A fifth conductive layer 3600 of FIG. 33 may be arranged on the fourth conductive layer 3500. The fifth conductive layer 3600 may include a conductive material including at least one of Mo, Al, Cu, Ti, etc. and may include multiple layers or a single layer. The fifth conductive layer 3600 may have a multi-layered structure of Ti—Al—Ti.

The fifth conductive layer 3600 may include a plurality of conductive lines. Each of the conductive lines of the fifth conductive layer 3600 may extend in the second direction and may be connected to the pixel circuits PC' arranged in the same column. The conductive lines of the fifth conductive layer 3600 may be connected to the fourth conductive layer 3500.

The fifth conductive layer 3600 may include a fourteenth conductive line 3610 and a fifteenth conductive line 3620. The fourteenth conductive line 3610 may be connected to the fifteenth connection electrode 3580 through a thirty-third contact plug 3610*c*. The fifteenth conductive line 3620 may be connected to the sixteenth connection electrode 3583 through a 34-1st contact plug 3620*ca* and to the eleventh conductive line 3551 through a 34-2nd contact plug 3620*cb*.

The fourteenth conductive line 3610 may correspond to a data line DL of FIG. 26, and the fifteenth conductive line 3620 may correspond to the driving voltage line PL of FIG. 26. The driving voltage line PL may have a grid shape through the eleventh conductive line 3551 and the fifteenth conductive line 3620.

The fifth conductive layer 3600 may include a plurality of conductive patterns. The conductive patterns of the fifth conductive layer 3600 may be spaced from one another. The conductive patterns of the fifth conductive layer 3600 may be connected to the conductive patterns of the fourth conductive layer 3500.

The fifth conductive layer 3600 may include an eighteenth connection electrode 3630. An eighteenth connection electrode 3630 may be arranged in each pixel area PXAR. The eighteenth connection electrode 3630 may be connected to the seventeenth connection electrode 3584 through a thirty-fifth contact plug 3630*c*. The eighteenth connection electrode 3630 may be connected to an anode (or a pixel electrode) of a display element; thus, the display element may be connected to the semiconductor layer 3100 (for example, the drain of the second emission control transistor T6) through the seventeenth connection electrode 3584 and the eighteenth connection electrode 3630.

A method of manufacturing the display apparatus may be included in the scope of the disclosure.

According to embodiments, a display apparatus may be capable of minimizing defects potentially caused by shocks/impacts and may be capable of displaying a high resolution image.

The described embodiments should be considered in an illustrative sense and not for purposes of limitation. Description of features or aspects within each embodiment should typically be available for other similar features or aspects in other embodiments. Various changes may be made to the described embodiments without departing from the scope defined by the following claims.

What is claimed is:

1. A display apparatus comprising:

a substrate comprising a first pixel area and a second pixel area adjacent to each other in a first direction;

a first pixel transistor set arranged on the first pixel area;

a second pixel transistor set arranged on the second pixel area;

a first insulating layer formed of a first material, arranged on the substrate, and having a first opening, wherein the first opening is positioned between the first pixel transistor set and the second pixel transistor set;

a first pixel separation layer positioned inside the first opening and formed of a second material different from the first material;

a first conductive line arranged on the first insulating layer and at least partially overlapping the first pixel separation layer, the first conductive line having a length extending in the first direction and crossing the first pixel separation layer in the first direction;

a second insulating layer arranged on the first conductive line;

a second conductive line arranged on the second insulating layer and at least partially overlapping each of the first pixel separation layer and the first conductive line, the second conductive line having a length extending in the first direction and crossing the first pixel separation layer in the first direction;

a third insulating layer arranged between the first insulating layer and the first conductive line; and a display element in the first pixel area, the display element comprising:

a pixel electrode;

an intermediate layer; and an opposite electrode.

2. The display apparatus of claim 1, wherein the third insulating layer is arranged between the entire first insulating layer and the entire second insulating layer, wherein the third insulating layer and the first pixel separation layer are directly connected to each other and are formed of a same material.

3. The display apparatus of claim 2, further comprising:

a first conductive member arranged on the first pixel area and between the first insulating layer and the third insulating layer;

a second conductive member arranged on the second pixel area and between the first insulating layer and the third insulating layer;

a first contact plug electrically connecting the first conductive line to the first conductive member; and a second contact plug electrically connecting the first conductive line to the second conductive member.

4. The display apparatus of claim 1, wherein the first insulating layer is formed of an inorganic material, and wherein the first pixel separation layer is formed of an organic material.

5. The display apparatus of claim 1, further comprising:

a third contact plug arranged on the first pixel area and electrically connecting the second conductive line to the first conductive line; and a fourth contact plug arranged on the second pixel area and electrically connecting the second conductive line to the first conductive line.

6. The display apparatus of claim 5, further comprising:

a third conductive member arranged on the first pixel area, between the substrate and the first conductive line;

a fifth contact plug electrically connecting the first conductive line to the third conductive member;

a fourth conductive member arranged on the second pixel area and directly on a same layer as the third conductive member; and a sixth contact plug electrically connecting the first conductive line to the fourth conductive member.

7. The display apparatus of claim 5, further comprising:

a first semiconductor member arranged on the first pixel area and between the substrate and the first conductive line;

a seventh contact plug electrically connecting the first conductive line to the first semiconductor member;

a second semiconductor member arranged on the second pixel area and directly on a same layer as the first semiconductor member; and an eighth contact plug electrically connecting the first conductive line to the second semiconductor member, wherein the first pixel separation layer is positioned between the seventh contact plug and the eighth contact plug.

8. The display apparatus of claim 1, further comprising:

a fifth conductive member arranged on the first insulating layer and spaced from the first pixel separation layer;

a third conductive line arranged on the second insulating layer and at least partially overlapping the first pixel separation layer; and a ninth contact plug electrically connecting the third conductive line to the fifth conductive member, wherein the third conductive line is spaced from each of the first conductive line and the second conductive line.

9. The display apparatus of claim 1, wherein the first conductive line is electrically connected to the second conductive line, and wherein a same signal is applied to the first conductive line and the second conductive line.

10. The display apparatus of claim 1, wherein the first conductive line is electrically isolated from the second conductive line, wherein a first signal is applied to the first conductive line, and wherein a second signal different from the first signal is applied to the second conductive line.

11. The display apparatus of claim 1, further comprising:

a sixth conductive member arranged on the first pixel area;

a seventh conductive member arranged on the second pixel area; and a first bridge arranged on the first insulating layer and electrically connecting the sixth conductive member to the seventh conductive member, wherein the first bridge at least partially overlaps the first pixel separation layer.

12. The display apparatus of claim 1, further comprising:

a third semiconductor member arranged on the first pixel area;

a fourth semiconductor member arranged on the second pixel area; and a second bridge arranged on the first insulating layer and electrically connecting the third semiconductor member to the fourth semiconductor member, wherein the second bridge at least partially overlaps the first pixel separation layer.

13. The display apparatus of claim 1, further comprising a third pixel transistor set, a fourth pixel transistor set, and a fifth pixel transistor set respectively arranged on a third pixel area, a fourth pixel area, and a fifth pixel area of the substrate, which are adjacent to the first pixel area of the substrate, wherein the first insulating layer further has a second opening positioned between the first pixel transistor set and the third pixel transistor set, has a third opening positioned between the first pixel transistor set and the fourth pixel transistor set, and has a fourth opening positioned between the first pixel transistor set and the fifth pixel transistor set, wherein the first pixel area neighbors the second pixel area in the first direction, wherein the first pixel area neighbors the third pixel area in a second direction different from the first direction, wherein the first pixel area neighbors the fourth pixel area in a third direction opposite to the first direction, and wherein the first pixel area neighbors the fifth pixel area in a fourth direction opposite to the second direction.

14. The display apparatus of claim 13, further comprising:

a second pixel separation layer positioned inside the second opening;

a third pixel separation layer positioned inside the third opening; and a fourth pixel separation layer positioned inside the fourth opening, wherein the first pixel separation layer, the second pixel separation layer, the third pixel separation layer, and the fourth pixel separation layer are connected to each other and are formed of the second material.

15. A display apparatus comprising:

a substrate comprising pixel areas arranged in a first direction;

pixel transistor sets respectively arranged on the pixel areas;

a first insulating layer formed of an inorganic material, arranged on the substrate, and having an opening pattern surrounding each of the pixel transistor sets;

a pixel separation layer formed of an organic material and positioned inside the opening pattern;

a first conductive line arranged on the first insulating layer, having a length extending in the first direction, crossing the pixel separation layer in the first direction, and at least partially overlapping the pixel separation layer;

a second insulating layer arranged on the first conductive line;

a second conductive line arranged on the second insulating layer, having a length extending in the first direction, crossing the pixel separation layer in the first direction, and at least partially overlapping each of the pixel separation layer and the first conductive line;

a third insulating layer arranged between the first insulating layer and the first conductive line; and display elements respectively in the pixel areas, each display element comprising:

a pixel electrode;

an intermediate layer; and an opposite electrode.

16. The display apparatus of claim 15, wherein the pixel separation layer has a grid structure in a plan view of the display apparatus.

17. The display apparatus of claim 15, further comprising:

first contact plugs respectively arranged on the pixel areas and electrically connecting the second conductive line to the first conductive line;

conductive members respectively arranged on the pixel areas and arranged between the substrate and the first conductive line; and second contact plugs respectively arranged on the pixel areas and electrically connecting the first conductive line to the conductive members.

18. The display apparatus of claim 15, further comprising:

third contact plugs respectively arranged on the pixel areas and electrically connecting the second conductive line to the first conductive line;

semiconductor members respectively arranged on the pixel areas and between the substrate and the first conductive line; and fourth contact plugs respectively arranged on the pixel areas and electrically connecting the first conductive line to the semiconductor members.

19. The display apparatus of claim 15, wherein the first conductive line is electrically connected to the second conductive line, and wherein a same signal is applied to the first conductive line and the second conductive line.

20. The display apparatus of claim 15, wherein the first conductive line is electrically isolated from the second conductive line, wherein a first signal is applied to the first conductive line, and wherein a second signal different from the first signal is applied to the second conductive line.

* * * * *